(12) United States Patent
Mills

(10) Patent No.: US 7,382,129 B2
(45) Date of Patent: Jun. 3, 2008

(54) 4 DIMENSIONAL MAGNETIC RESONANCE IMAGING

(76) Inventor: Randell L. Mills, 7 Weatherfield Dr., Newtown, PA (US) 18940

( * ) Notice: Subject to any disclaimer, the term of this patent is extended or adjusted under 35 U.S.C. 154(b) by 927 days.

(21) Appl. No.: 10/362,076

(22) PCT Filed: Aug. 21, 2001

(86) PCT No.: PCT/US01/25954

§ 371 (c)(1),
(2), (4) Date: Feb. 20, 2003

(87) PCT Pub. No.: WO02/16956

PCT Pub. Date: Feb. 28, 2002

(65) Prior Publication Data

US 2004/0027127 A1    Feb. 12, 2004

Related U.S. Application Data

(60) Provisional application No. 60/226,667, filed on Aug. 22, 2000.

(51) Int. Cl.
*G01V 3/00*    (2006.01)
(52) U.S. Cl. ...................................... 324/318; 324/307
(58) Field of Classification Search ........ 324/300–322; 600/407–455
See application file for complete search history.

(56) References Cited

U.S. PATENT DOCUMENTS 3,980,076 A    9/1976   Wikso

| 4,079,730 A | 3/1978 | Wikso |
|---|---|---|
| 4,270,545 A | 6/1981 | Rodler |
| 4,366,820 A | 1/1983 | Heyda |
| 4,436,684 A | 3/1984 | White |
| 4,577,152 A * | 3/1986 | Macovski .................... 324/309 |

(Continued)

FOREIGN PATENT DOCUMENTS

JP    0311186    12/1988

(Continued)

OTHER PUBLICATIONS

Kwait, et. al., "A Decoupled Coil Detector Array For Fast Image Acquisition in Magnetic Resonance Imaging", Medical Physics, American Institute of Physics, New York, US, vol. 18, No. 21, Mar. 1, 1991.

(Continued)

*Primary Examiner*—Briji B. Shrivastav
(74) *Attorney, Agent, or Firm*—Jeffrey S. Melcher; Manelli Denison & Selter, PLLC

(57) ABSTRACT

Provided are apparatus and methods for forming a multidimensional image of inanimate or animate objects which utilize a magnetization source (112) to magnetize a volume of an object to be imaged, a radiation source (118) for applying a radiation field to the object to be imaged, an output signal detector (120) for producing output signals in response to the secondary radiation at a plurality of spatial locations outside of the object as a function of time, processors (126, 126a and 126b) for determining a plurality of Fourier components, for associating the Fourier components due to each voxel (14) by phase, and for converting each set of components into a voxel location, and an image processor (128) for producing an image.

167 Claims, 16 Drawing Sheets

U.S. PATENT DOCUMENTS

| | | | |
|---|---|---|---|
| 4,585,992 A * | 4/1986 | Maudsley et al. | 324/309 |
| 4,793,355 A | 12/1988 | Crum | |
| 4,857,843 A * | 8/1989 | Macovski | 324/307 |
| 4,881,032 A * | 11/1989 | Bottomley et al. | 324/309 |
| 4,899,109 A * | 2/1990 | Tropp et al. | 324/320 |
| 4,969,469 A | 11/1990 | Mills | |
| 5,073,858 A * | 12/1991 | Mills | 600/410 |
| 5,274,331 A | 12/1993 | Mackovski | |
| 5,343,147 A | 8/1994 | Sager | |
| 5,408,178 A | 4/1995 | Wikswo | |
| 5,458,126 A * | 10/1995 | Cline et al. | 600/425 |
| 5,539,316 A * | 7/1996 | Sukumar | 324/320 |
| 5,771,893 A | 6/1998 | Kassai | |
| 6,002,254 A * | 12/1999 | Kassai et al. | 324/306 |
| 6,332,088 B1 * | 12/2001 | Zhang et al. | 600/410 |
| 6,477,398 B1 * | 11/2002 | Mills | 600/409 |

FOREIGN PATENT DOCUMENTS

| | | |
|---|---|---|
| WO | 8103226 | 11/1981 |
| WO | 9005312 | 5/1990 |
| WO | 9926078 A1 | 5/1999 |
| WO | WO 99/260078 * | 5/1999 |

OTHER PUBLICATIONS

Sarwinski, "Superconducting Instruments", Cryogenics, Dec. 1977, pp. 671-679 . . . Mills, "Magnetic Susceptibility Imaging", Quantum Imaging Corporation, Dec. 1989, pp. 1-5.

"Measurement of Magnetic Susceptibility in Living Rats", U. Steketee et al., Med. & Biol. Eng. & Comput., (1980) 18: 253-260.

"Magnetic Measurements of Cardiac Mechanical Activity", R. Maniewski et al., IEEE Transactions on Biomedical Engineering, vol. 35, No. 9, Sep. 1988, 662-669.

Ivanenko, A. I.; Shpiring, K.; Noise-Resistant Hall Magnetometer, Instrum. Exp. Tech. (U.S.A.), (1987), vol. 30, No. 3, pt. 2, pp. 728-730.

Huang, R. M.; Yeh, F. S.; Huang, R. S.; Double-Diffusion Differential-Amplification Magnetic Sensor, IEEE Trans. Electron Devices (U.S.A.), (1984), vol. ED-31, No. 7, pp. 1001-1004.

Thorn, M. J.; A Monolithic Linear Hall Effect Integrated Circuit, Proceedings of the 29th IEEE Vehicular Technology Conference, Mar. 27-30, 1979, Arlington Heights, Ill., pp. 226-229.

Nathan, A. et al.; Numerical Simulation of Semiconductor Magnetic Field Sensors Using the Finite-Element Method, Proceedings of the IASTED International Symposium: Applied Simulation and Modeling -ASM '85, Jun. 3-5, 1985, Montreal, Quebec, Canada, pp. 22-24.

Bligh, P. H.; Johnson, J. J.; Ward, J. M., Automating the Hall Effect, Phys. Educ. (GB), (1985), vol. 20, No. 5, pp. 245-247.

Nathan, A.; Huiser, A. M. J.; Baltes, H. P., Two-Dimensional Numerical Modeling of Magnetic-Field Sensors in CMOS Technology, IEEE Trans. Electron Devices (U.S.A.), (1985), vol. Ed-32, No. 7, pp. 1212-1219.

Vinal, A. W., A Magnetic Sensor Utilizing an Avalanching Semiconductor Device, IBM J. Res. and Dev. (U.S.A.), (1981), vol. 25, No. 2-3, pp. 196-201.

Bol'Shakova, I. A. et al.; Detectors For Simultaneous Magnetic Field and Temperature Measurement, Instrum. and Exp. Tech. (U.S.A.), (1980), vol. 23, No. 2, pt. 2, pp. 526-528.

Bessonov, V. I. et al.; Investigation of the Characteristics of n-InSb-I-GaAs Film Hall Converters, Meas. Tech. (U.S.A.), (1980), vol. 23, No. 3, pp. 255-256.

Kordic, S., Integrated Silicon Magnetic-Field Sensors, Sens. and Actuators (Switzerland), (1986), vol. 10, No. 3-4, pp. 347-378.

Pogodin, V. I. et al., Galvanomagnetic Instruments for Operation in Cryogenic Electrical-Engineering Installations, Meas. Tech. (U.S. A.), (1986), vol. 29, No. 3, pp. 223-225.

Tacano, M.; Sugiyama, Y.; Taguchi, T., 1/f Noise in (AlGa) As/Ga Heterostructure Van der Pauw Element, IEEE Electron Device Lett. (U.S.A.), 1987, vol. EDL-8, No. 1, pp. 22-23.

Dibbern, U., Magnetic Field Sensors Using the Magnetoresistive Effect, Sens, and Actuators (Switzerland), (1986), vol. 10, No. 1-2, pp. 127-140.

Extance, P.; Pitt, G. D., GaAs Magnetic Field Sensors, Transducers '85, 1985 International Conference on Solid State Sensors and Actuators, Digest of Technical Papers, (Cat. No. 85CH 2127-9), Jun. 11-14, 1985, Phila., Pa., pp. 304-307.

Han, Y. S. et al., Measurement of Magnetic Fields in Low Temperature with Hall elements of GaAs, Proceedings of the 9th International Conference on Magnet Technology, MT-9 1985, Sep. 9-13, 1985, Zurich, Switzerland, pp. 828-829.

Bender, P. A., Measuring Magnetic Fields with an IC Chip in the Introductory Lab, Am. J. Phys. (U.S.A.), (1986), vol. 54, No. 1, pp. 89-90.

Hoffman, H., Plano-Magnetic Thin Film Sensors (Abstract), J. Appl. Phys. (U.S.A.), vol. 57, No. 8, pt. 2B, p. 3831.

Schmidt-Weinmar, H. G. et al., Numerical Modeling of Silicon Magnetic Field Sensors:, IEEE Trans. Magn. (U.S.A.), (1984), vol. Mag-20, No. 5, pt. 1, pp. 975-977.

Roumenin, C. S.; Kostov, P. T., Optimized Emitter-Injection Modulation Magnetotransistor, Sens. and Actuators (Switzerland), (1984), vol. 6, No. 1, pp. 19-33.

Akhmanova, L. N. et al., Hall Mangetometer with Increased Resolving Power, Instrum. and Exp. Tech. (U.S.A.), (1983), vol. 26, No. 6, pt. 2, pp. 1433-1436.

Dibern, U.; Pettersen, A., The Magnetoresistive Sensor-A Sensitive Device for Detecting Magnetic Field Variations, Electron. Components and Appl. (Netherlands), (1983), vol. 5, No. 3, pp. 148-153.

Popovic, R. S.; Baltes, H. P., Dual-Collector Magnetotransistor Optimized with Respect to Injection Modulation, Sens. and Actuators (Switzerland), (1983), vol. 4, No. 2, pp. 155-163.

Kordic, S. et al., A Novel Method for Reducing the Offset of Magnet-Field Sensors, Sens. and Actuators (Switzerland), (1983), vol. 4, No. 1, pp. 55-61.

Lindstrom, E. R. et al., The NBS-LANL RTM End-Magnet Field Mapper, IEEE Trans. Nucl. Sci. (U.S.A.), (1983), vol. NS-30, No. 4, pt. 2, pp. 3605-3607.

Rutkovskii, I. Z. et al., Thermal Stabilizer For a Hall Detector, Instrum. and Exp. Tech. (U.S.A.), (1981), vol. 24, No. 3, pt.2, pp. 822-823.

Belyaev, M. Yu.; Medvedev, E. Yu., Microthermostat For a Hall Detector, Instrum. and Exp. Tech. (U.S.A.), (1981), vol. 24, No. 3, pt. 2, pp. 821-822.

Netzer, Y., Bias Hall Sensors for Minimum Drift, EDN (U.S.A.), (1982), vol. 27, No. 6, pp. 180-186.

Lachinov, V. M. et al., Hall Magnetometers For Stationary Magnetic Fields that Read in Field Units, Instrum. and Exp. Tech. (U.S.A.), (1980), vol. 23, No. 6, pt. 2, pp. 1460-1462.

Poole, M. W.; Walker, R. P., Hall Effect Probes and Their Use in a Fully Automated Magnetic Measuring System, IEEE Trans. Magn (U.S.A.) (1981), vol. MAG-17, No. 5, pp. 2129-2132.

Dolgii, S. A. et al., Galvanomagnetic Three-Component Magnetic Induction Gauge, Instrum. and Exp. Tech. (U.S.A.), (1979), vol. 22, No. 5, Dolgii, S. A. et al., Galvanomagnetic Three-Component Magnetic Induction Gauge, Instrum. and Exp. Tech. (U.S.A.), (1979), vol. 22, No. 5, pt. 2, pp. 1407-1410.

Wedlake, D., Temperature Matching of Ferrite Hall-Effect Devices, Electron, Ind. (GB), (1979), vol. 5, No. 3, p. 55.

Szavits, O., A Constant Power Hall-Probe Circuitry for Fast Field Mapping, 6th International Conference on Magnet Technology, Part II, Aug. 29-Sep. 2, 1977, Bratislava, Czechoslovakia, pp. 849-853.

Sugiyama, Y.; Taguchi, T.; Tacano, M., Highly-Sensitive Magnetic Sensor made of AlGaAs/GaAs Heterojunction Semiconductors, Proc. 6th Sensor Symp., May 1986, pp. 51-60.

Popovic, R. S.; Widmer, R., Sensitivity and Noise of a Lateral Bipolar Magnetotransistor in CMOS Technology, Electron Devices Meet., San Francisco, Calif., U.S.A., 1984, IEDM Tech. Dig., pp. 568-571.

Jackson, D. A., Monomode Optical Fiber Interferometers for Precision Measurement, J. Phys. E., vol. 18, No. 12, (1985), pp. 981-1001.

Giallorenzi, T. G. et al., Optical Fiber Sensor Technology, IEEE J. of Quantum Electronics, vol. QE-18, No. 4, (1982), pp. 626-665.

Kyuma, K. et al., Fiber Optic Measuring System for Electric Current by Using a Magnetooptic Sensor, IEEE J. of Quantum Electronics, vol. QE-18, No. 10, (1982), pp. 1619-1623.

Yoshino, T. et al., Fiber-Optic Fabry-Perot Interferometer and its Sensor Applications, IEEE J. of Quantum Electronics, vol. QE-18, No. 10, (1982), pp. 1624-1633.

Dandridge, A. et al., Optical Fibre Magnetic Field Sensors, Electronics Letters, vol. 16, No. 11, (1980), pp. 408-409.

Dickson, K. R. and Galbraith, P., A Digital Micro-Teslameter, Organisation Europeenne Pour La Recherche Nucleaire CERN European Organization for Nuclear Research, CERN 85-13, LEP Main Ring Division, Sep. 13, 1985, pp. 1-24.

Brooks, et al., "Principles of Computer Assisted Tomography (CAT) in Radiographic and Radioisotopic Imaging," Phy. Med. Biol, 1976, vol. 21, No. 5, pp. 687-732.

\* cited by examiner

4 DIMENSIONAL MAGNETIC RESONANCE IMAGING

This application claims priority to U.S. provisional application Ser. No. 60/226,667, filed on Aug. 22, 2000, the complete disclosure of which is incorporated herein by reference.

FIELD OF THE INVENTION

This invention relates to method and apparatus for imaging an object, such as a body. More particularly, the invention provides high resolution, real-time images in 4 dimensions with little or no deterioration from motion artifact.

BACKGROUND OF THE INVENTION

Nuclear Magnetic Imaging (NAMR) which is commonly called magnetic resonance imaging(MRI) entails 1.) magnetizing a volume with a constant primary magnetic field in a z-direction, 2.) providing a gradient along the axis of the z-directed field to select a slice in the xy-plane, the plane perpendicular to the direction of the primary field, 3.) providing electromagnetic radiation resonant with the Larmor frequency of protons in the slice, 4.) providing a pulse of resonant electromagnetic radiation to flip the magnetization vector into the transverse plane or plane of the slice, and 5.) applying a magnetic field gradient along an axis in the xy-plane of the z-directed field with excitation at the Larmor frequency to provide phase dispersion of the NMR signal along the axis to encode spatial information, and 6.) recording the free induction decay (FID) radio emission signals following excitation, 7.) recording a plurality of such FIDs, each recorded following an excitation with a rotated direction of the gradient in the xy-plane, and 8.) reconstructing the image from the plurality of the FIDs. An integer n of FIDs each having a phase gradient that corresponds to the magnetic field gradient that was rotated to n unique directions in the xy-plane comprise a set along two orthogonal axes in phase or k-space. A two dimensional Fourier transform of the data set is used to reconstruct an n by n pixel image.

MRI is of primary utility in assessing brain anatomy and pathology. But long NMR relaxation times, a parameter based on how rapidly excited nuclei relax, have prevented NMR from being of utility as a high resolution body imager. The most severe limitation of NMR technology is that for spin echo imaging n, the number of free induction decays ("FIDs"), a nuclear radio frequency energy emitting process, must equal the number of lines in the image. A single FID occurs over approximately 0.1 seconds. Not considering the spin/lattice relaxation time, the time for the nuclei to reestablish equilibrium following an RF pulse, which may be seconds, requires an irreducible imaging time of n times 0.1 seconds, which for 512×512 resolution requires approximately one minute per each two dimensional slice. This represents a multiple of 1500 times longer that the time that would freeze organ movements and avoid image deterioration by motion artifact. For example, to avoid deterioration of cardiac images, the imaging time must not exceed 30 msec. A method for speeding NMR imaging flips the magnetization vector of the nuclei by less than 90 degrees onto the xy-plane, and records less FIDs. Such a method, known as the flash method, can obtain a 128×128 resolution in approximately 40 seconds. Another technique used to decrease imaging time is to use a field gradient and dynamic phase dispersion, corresponding to rotation of the field gradient, during a single FID to produce imaging times typically of 50 msec. Both methods produce a decreased signal-to-noise ratio ("SNR") relative to spin echo methods. The magnitude of the magnetization vector which links the coil is less for the flash case because the vector is flipped only a few degrees into the xy-plane. The echo-planar technique requires shorter recording times with a concomitant increase in bandwidth and noise. Both methods compensate for decreased SNR by increasing the voxel size with a concomitant decrease in image quality. Physical limitations of these techniques render obtaining high resolution, high contrast vascular images impractical.

SUMMARY OF THE INVENTION

It is an object of the invention to provide high resolution multi-dimensional images of an object, such as a body, tissue, or working cardiopulmonary system.

It is a further object of the invention to rapidly acquire the data to provide magnetic resonance images of a body with reduced motion artifacts.

These and other objects of the invention are attained by providing an apparatus for obtaining a magnetic resonance image of a body using data acquired over the three spatial dimensions plus time, rather than acquiring data only in time at one receiving antenna A preferred embodiment of the apparatus of the invention includes a radiation source for applying a first radiation field having a magnetic component to the body, to magnetize the body. The apparatus further includes a source for applying a second radiation field to the body, to elicit a radiation field from the body. A detector senses this radiation field, and produces a signal that a reconstruction processor employs to create the magnetic resonance image of the body.

A NMR image is obtained of a magnetized body from a three-dimensional map of the intensity variation of the NMR signal produced by each voxel of the magnetized body, and detected over a three-dimensional volume of space external to the body, herein referred to as the "sample space." The data is acquired over three spatial directions plus time. In an embodiment, the NMR signals are detected over a three dimensional detector array as a function of time. The NMR signals may be sampled at least at the Nyquist rate, i.e., at a rate that is twice the highest temporally frequency of the NMR signal and twice the highest spatial frequency the Fourier transform of the NMR image of the phantom. Sampling at the Nyquist rate or higher allows the spatial variations of the external NMR signal to be acquired.

In an embodiment, the NMR signal at each detector as a function of time is processed by a method such as a Fourier transform operation to give a plurality of Fourier components each having the same frequency, an intensity and a phase angle. The NMR signal of each voxel at any given detector gives rise to a Fourier component with a unique phase angle relative to the Fourier component of any other voxel of the phantom at that detector. The set of Fourier components that correspond to the NMR signal of a given voxel over the detectors is determined. This may be achieved by using a first component having a phase angle and calculating the phase angle as a function of spatial position of the first detector relative to any other detector and identifying the component at each detector having the calculated phase angle. The sets are determined for all of the voxels. A NMR image is obtained from the sets wherein each set of Fourier components comprises a three-dimensional map of the intensity variation of the NMR signal produced by each voxel of the magnetized body. This practice of the invention preferably employs a Fourier transform algorithm, described in Fourier Transform Reconstruction Algorithm Section, to determine the spatial location of each voxel from the corresponding set of Fourier components comprises a three-dimensional map of the intensity variation of the NMR signal produced by each voxel of the magnetized body over the sample space. This is repeated for each set to form the NMR image of the object.

NMR images produced according to prior art methods and systems rely on applying an additional magnetic field in the direction of the primary field having a gradient along an axis in the transverse plane to cause a phase variation of the NMR signal along the axis in the transverse plane. The direction axis of the gradient is varied a plurality of times to gives rise to an equivalent number of lines in the reconstructed image. In the present invention, the unique phase variation of the NMR signal is provided by the combination of 1.) the angle θ suspended between the direction of the detector and the radial vector, the vector from the dipole to the detector, and 2.) the angle ϕ due to a separation distance r between a voxel and a detector given by the wavenumber of the RF field k times r.

My prior inventions disclosed in U.S. Pat. No. 5,073,858 and U.S. patent application Ser. No. 09/191,454, the complete disclosures of both which are incorporated herein by reference, are in part based on the realization that matter having a permeability different from that of free space distorts a magnetic flux applied thereto. This property is called magnetic susceptibility. An object, herein called a phantom, can be considered as a collection of small volume elements, herein referred to as voxels. When a magnetic field is applied to the phantom, each voxel generates a secondary magnetic field at the position of the voxel as well as external to the phantom. The strength of the secondary magnetic field varies according to the strength of the applied field, the magnetic susceptibility of the material within the voxel, and the distance of the external location relative to the voxel. For example, my U.S. Pat. No. 5,073,858 and U.S. application Ser. No. 09/191,454 teache that the net magnetic flux at a point extrinsic to a phantom to which a magnetic field is applied, is a sum of the applied field and the external contributions from each of the voxels. The '858 patent further teaches sampling the external flux point by point and employing a reconstruction algorithm, to obtain the magnetic susceptibility of each voxel from the sampled external flux.

Unlike the '858 patent that relies on a static response from a magnetized body to determine the magnetic susceptibility of the body, my invention disclosed in U.S. patent application Ser. No. 09/191,454 elicits a radiative response from a magnetized body by subjecting the body to a resonant radiation field. One embodiment of the '454 invention generates a three-dimensional magnetic susceptibility image of an object including a patient placed in a magnetic field from a three dimensional map of a radio frequency (RF) magnetic field external to the patient, induced by subjecting selected nuclei of the body to a resonant RF field. Application of an RF pulse to the body causes the body to emit the RF magnetic flux external to the body. A Fourier transform of this external flux produces its frequency components ("Larmor frequencies"). Each Larmor frequency is used to determine the magnetic susceptibility of the voxels of the body producing that Larmor frequency. Further, the intensity variation of the external RF field over a three-dimensional volume of space is used to determine the coordinate location of each voxel.

One practice of the inventions disclosed in my U.S. Pat. No. 5,073,858 and U.S. patent application Ser. No. 09/191,454 obtains a three-dimensional magnetic susceptibility map of a magnetized body from a three-dimensional map of a secondary magnetic flux produced by the magnetized body, and detected over a three-dimensional volume of space external to the body, herein referred to as the "sample space." The extrinsic magnetic flux is sampled at least at the Nyquist rate, i.e., at twice the spatial frequency of the highest frequency of the Fourier transform of the magnetic susceptibility map of the phantom, to allow adequate sampling of spatial variations of the external magnetic flux. This practice of the inventions preferably employs a Fourier transform algorithm, described in Fourier Transform Reconstruction Algorithm Section, to form the magnetic susceptibility map of the object.

The present invention relates to systems for providing images of distributions of a quantity, in a chosen region of the body, by gyromagnetic resonance, particularly nuclear magnetic resonance (NMR) techniques. Such techniques may be used for examining bodies of different kinds. A particularly beneficial application is the examination of patients for medical purposes. Unlike my U.S. Pat. No. 5,073,858 and U.S. patent application Ser. No. 09/191,454, the present invention employs nuclear magnetic resonance (NMR) to induce a magnetized phantom of essentially constant magnetic susceptibility to emit an external radiation having a magnetic field component. In particular, application of an RF pulse, resonant with selected nuclei of a magnetized body, can polarize the nuclei through rotation of their magnetic moments. The polarized nuclei within a voxel precess about the local magnetic field in the voxel at a Larmor frequency determined by the applied magnetic field at position of the voxel. The superposition of external RF fields produced by all the voxels of the body creates the total external RF field at each detector that is time dependent. The external RF field recorded at the detectors as a function of time contains components each having a unique phase angle relative to other components. Each component corresponds to an emitting voxel of the phantom. The time dependent signal at each detector may be transformed into a series of components having intensity and phase data. Each set of components of the NMR signal over the sample space due to a given voxel is determined from the phase data and the detector positions. The spatial variation of the NMR signal over the sample space is used to determine the location of the voxel in the phantom. This is repeated for all sets of components, each corresponding to a voxel to reconstruct the NMR image.

The radiation source for magnetizing a body to be imaged can be a direct current ("DC") magnet, including a superconducting magnet. The radiation sources and amplifiers for applying an RF pulse to the magnetized body are well known in the art, and include, but are not limited to, klystrons, backward wave oscillators, Gunn diodes, Traveling Wave Tube amplifiers. A preferred embodiment of the invention employs a three dimensional array of antennas as detectors for sensing the external RF field.

One practice of the invention detects the external RF field in the near field region where the distance of a detector sensing radiation from a voxel at a distance r from the detector is much smaller than the wavelength $\lambda$ of the radiation emitted by the voxel, i.e., $r \ll \lambda$ (or $kr \ll 1$). The near fields are quasi-stationary, that is they oscillate harmonically as $e^{-i\omega t}$, but are otherwise static in character. Thus, the transverse RF magnetic field of each voxel is that of a dipole. In one embodiment, an array of miniature RF antennas sample the external RF field over a three-dimensional volume of space that can be either above or below the object to be imaged. The distance r of the detector from the voxel gives rise to the phase term $e^{-ikr}$ of the component of the detected RF signal where k is the wavenumber of the NMR signal. The harmonic oscillation of each RF dipole is equivalent to the dipole rotating in the transverse plane. The detector is responsive to a component in this plane. At a point in time, each RF dipole is directed at an angle $\theta$ relative to the direction of detection of the detector. The phase angle $\theta$ of the RF dipole relative to the direction of detection axis of the detector gives rise to a phase angle term $e^{-i\theta}$. In a preferred embodiment, the sum of the phase angles, kr and $\theta$, are unique for each voxel at each detector. The position of each detector relative to a different detector may be used to calculated the phase angle of the second relative to the first. This may be repeated over all of the detectors to give the set of intensities of the NMR signal over the sample space due to a voxel. The location of each voxel is determined through the spatial variations of the intensity of the NMR field of the set of components associated by phase. Thus, the phase of the components of the external RF radiation, and the intensity variations of the external RF radiation provide the necessary information for providing a NMR image of the magnetized phantom, such as a human body. Such a NMR image can be employed to obtain anatomical images of a human body based on selected physiological parameters.

In an embodiment of the present invention, the NMR image of an object including a patient placed in a magnetic field is generated from a three-dimensional map of the transverse resonant radio frequency (RF) magnetic flux external to the patient. The external RF field recorded at the detectors as a function of time contains components each having a unique phase angle relative to other components. Each component corresponds to an emitting voxel of the phantom. The time dependent signal at each detector may be transformed into a series of components having intensity and phase data Each set of components of the NMR signal over the sample space due to a given voxel is determined from the phase data and the detector positions. The intensity variation of the transverse RF field over the sample space is used to determine the coordinate location of each voxel. The RF field is the near field which is a dipole that serves as a basis element to form a unique reconstruction. The geometric system function corresponding to a dipole which determines the spatial intensity variations of the RF field is a band-pass for $k_\rho = k_z$. Preferably, each volume element is reconstructed independently in parallel with all other volume elements such that the scan time is no greater than the nuclear free induction decay (FID) time.

Secondary Magnetic Field

The magnetic moment $m_z$ of each voxel is a magnetic dipole. And the phantom can be considered to be a three-dimensional array of magnetic dipoles. At any point extrinsic to the phantom, the z-component of the secondary flux, B', from any single voxel is $$B' = m_z \frac{2z^2 - x^2 - y^2}{(x^2 + y^2 + z^2)^{5/2}} \quad (1)$$

where x, y, and z are the distances from the center of the voxel to the sampling point. It is shown in APPENDICES I-IV that no geometric distribution of magnetic dipoles can give rise to Eq. (1). Therefore, the flux of each magnetic dipole (voxel contribution) forms a basis set for the flux of the array of dipoles which comprise the NMR image of the phantom.

Eq. (1) is a system function which gives the magnetic flux output in response to a magnetic dipole input at the origin. The phantom is an array of spatially advanced and delayed dipoles weighted according to the magnetic moment of each voxel; this is the input function. The secondary flux is the superposition of spatially advanced and delayed flux, according to Eq. (1); this is the output function. Thus, the response of space to a magnetized phantom is given by the convolution of Eq. (1) with the series of weighted, spatially advanced and delayed dipoles representing the NMR image of the phantom.

In Fourier space, the output function is the product of the Fourier transform (FT) of the system function and the FT of the input function. Thus, the system function filters the input function. The output function is the flux over all space. However, virtually all of the spectrum (information needed to reconstruct the NMR image) of the phantom exists in the space outside of the phantom because the system function is essentially a band-pass filter. This can be appreciated by considering the FT, $H[k_\rho, k_z]$, of Eq. (1):

$$H[k_\rho, k_z] = \frac{4\pi k_\rho^2}{k_z^2 + k_\rho^2} = \frac{4\pi}{1 + \frac{k_z^2}{k_\rho^2}} \quad (2)$$

where $k_\rho$ is the spatial frequency in the xy-plane or $k_\rho$-plane and $k_z$ is the spatial frequency along the z-axis. $H[k_\rho,k_z]$ is a constant for $k_\rho$ and $k_z$ essentially equal as demonstrated graphically in FIG. 1c.

Band-Pass Filter

When a static magnetic field $H_0$ with lines in the direction of the z-axis is applied to an object comprising a material containing nuclei such as protons that possess magnetic moments, the field magnetizes the material. As a result a secondary field superposes the applied field as shown in FIG. 9. In the applied magnetic field, the magnetic moments of each nuclei precesses about the applied magnetic field. However, the magnetization of any one nucleus is not observed from the macroscopic sample. Rather the vector sum of the dipole moments from all magnetic nuclei in the sample is observed. This bulk magnetization is denoted by the vector M. In thermal equilibrium with the primary field $H_0$, the bulk magnetization M is parallel to $H_0$. The magnetization vector then comprises magnetic dipole m. The secondary field outside of the object (phantom) and detected at a detector 301 is that of a series of magnetic dipoles centered on volume elements 302 of the magnetized material. In Cartesian coordinates, the secondary magnetic flux, B', at the point (x,y,z) due to a magnetic dipole having a magnetic dipole moment $m_z$ at the position $(x_0,y_0,z_0)$ is $$B' = \mu_0 \frac{m_z(2(z-z_0)^2 - (x-x_0)^2 - (y-y_0)^2)}{[(x-x_0)^2 + (y-y_0)^2 + (z-z_0)^2]^{5/2}} i_z \quad (3)$$

$$B' = \frac{(2z^2 - x^2 - y^2)}{[x^2 + y^2 + z^2]^{5/2}} \otimes m_z\delta(x-x_0, y-y_0, z-z_0)i_z \quad (4)$$

where $i_z$ is the unit vector along the z-axis. The field is the convolution of the system function, h(x,y,z) or h(ρ,φ,z) (the left-handed part of Eq. (4)), with the delta function (the right-hand part of Eq. (4)), at the position $(x_0,y_0,z_0)$. A very important theorem of Fourier analysis states that the Fourier transform of a convolution is the product of the individual Fourier transforms [2]. The Fourier transform of the system function, h(x,y,z) or h(ρ,φ,z), is given in APPENDIX V.

The z-component of a magnetic dipole oriented in the z-direction has the system function, h(x,y,z), which has the Fourier transform, $H[k_x,k_y,k_z]$, which is shown in FIG. 1c.

$$H[k_x, k_y, k_z] = \frac{4\pi[k_x^2 + k_y^2]}{[k_x^2 + k_y^2 + k_z^2]} \quad (5)$$

$$= H[k_\rho, k_z] = \frac{4\pi k_\rho^2}{k_z^2 + k_\rho^2} = \frac{4\pi}{1 + \frac{k_z^2}{k_\rho^2}} \quad (6)$$

The output function, the secondary magnetic field, is the convolution of the system function, h(x,y,z)—the geometric transfer function for the z-component of a z-oriented magnetic dipole with the input function—a periodic array of delta functions each at the position of a magnetic dipole corresponding to a magnetized volume element.

$$\frac{(2z^2 - x^2 - y^2)}{[x^2 + y^2 + z^2]^{5/2}} \otimes \sum_{n=-\infty}^{\infty} m_z\delta(x-nx_o, y-ny_o, z-nz_o) \quad (7)$$

The Fourier transform of a periodic array of delta functions (the right-hand side of Eq. (7)) is also a periodic array of delta functions in k-space:

$$\frac{1}{x_0 y_0 z_0} \sum_{n=-\infty}^{\infty} m_z\delta\left(k_x - \frac{n}{x_0}, k_y - \frac{n}{y_0}, k_z - \frac{n}{z_0}\right) \quad (8)$$

By the Fourier Theorem, the Fourier transform of the spatial output function, Eq. (7), is the product of the Fourier transform of the system function given by Eq. (6), and the Fourier transform of the input function given by Eq. (8).

$$\frac{4\pi}{1 + \frac{k_z^2}{k_\rho^2}} \frac{1}{x_0 y_0 z_0} \sum_{n=-\infty}^{\infty} m_z\delta\left(k_x - \frac{n}{x_0}, k_y - \frac{n}{y_0}, k_z - \frac{n}{z_0}\right) \quad (9)$$

In the special case that $$k_\rho = k_z \quad (10)$$

the Fourier transform of the system function (the left-hand side of Eq. (9)) is given by $$H = 4\pi \quad (11)$$

Thus, the Fourier transform of the system function band-passes the Fourier transform of the input function. Both the input function (the right-hand part of Eq. (7)) and its Fourier transform (the right-hand part of Eq. (9)) are a periodic array of delta functions. No frequencies of the Fourier transform of the input function are attenuated; thus, no information is lost in the case where Eq. (10) holds.

In an embodiment of the present invention, the magnetization vector is rotated into the traverse plane by an additional RF field $H_1$. The magnetization vector then comprises a rotating magnetic dipole m in the transverse plane. The NMR image may be reconstructed by sampling the external field from a series of RF dipoles rather than that from a series of static dipoles. In this case, the Fourier transform of the system function also band-passes the Fourier transform of the input function. Thus, the resolution of the reconstructed NMR image is limited by the spatial sampling rate of the secondary RF magnetic field according to the Nyquist Sampling Theorem.

Reconstruction

The NMR image may be reconstituted using a Fourier transform algorithm. The algorithm is based on a closed-form solution of the inverse problem—solving the spatial distribution of an array of magnetic dipoles from the measured extrinsic secondary (F) field that is transverse to the magnetic flux that magnetizes the voxels. The transverse RF magnetic field of each voxel is that of a dipole, the maximum amplitude is given by Eq. (1) wherein the Larmor frequency of each voxel is essentially the same, and $m_z$, the magnetic moment along the z-axis, of Eq. (1) corresponds to the bulk magnetization M of each voxel. In terms of the coordinates of Eq. (1), an array of miniature RF antennas point samples the maximum dipole component of the RF signal over the sample space such as the half space above (below) the object to be imaged wherein each RF signal is has a unique phase shift due to the relative spatial relationship of each voxel and each detector. The phase shift of each component and the relative spatial relationship of the detectors is used to assign a component from each detector to a set. Each set of components associated by phase comprises the spatial variations of the intensity of the transverse RF field of any given voxel. The intensity variation over the sample space is used to determine the coordinate location of each voxel. In the limit, each volume element is reconstructed independently in parallel with all other volume elements such that the scan time is no greater than the nuclear free induction decay (FID) time.

The NMR scan performed on the object to be imaged including a human comprises the following steps:

The magnetic moments of nuclei including protons of the object to be imaged that are aligned by the primary field are further aligned by a radio frequency (RF) pulse or series of pulses.

The strength and duration of the rotating $H_1$ (RF) field that is resonant with the protons of the magnetized volume and is oriented perpendicularly to the direction of the magnetizing field is applied such that the final precession angle of the magnetization is 90° ($\phi_{H_1}$=90°) such that the RF dipole is transverse to the primary magnetizing field and perpendicular to the RF magnetic field detector.

NMR pulse sequences which provide the signals for a $T_1$ or $T_2$ image may be applied. For example a 90° pulse may be followed by a series of 180° pulses. One sequence is the Carr-Purcell-Meiboom-Gill (CPMG) sequence [3].

The free induction decay- signals are recorded.

The time dependent signals are Fourier transformed to give the intensity and phase of each component. The NMR signal of each voxel at any given detector gives rise to a Fourier component with a unique phase angle relative to the Fourier component of any other voxel of the phantom at that detector.

The matrix of Fourier components that correspond to the NMR signal of a given voxel over the detectors is determined. This may be achieved by using a first component having a phase angle and calculating the phase angle as a function of spatial position of the first detector relative to any other detector and identifying the component at each detector having the calculated phase angle. The matrices are determined for all of the voxels. The measurements of the spatial variations of the transverse RF field of a given matrix is used to determine the coordinate location of each voxel. Thus, each matrix of components associated by phase comprises the intensity variation over the sample space of the RF field of the bulk magnetization M of each voxel.

The Fourier transform algorithm is performed on each set of components over the detector array to map each bulk magnetization M corresponding to a voxel to a spatial location over the image space. The bulk magnetization map (NMR image; also the input function) is given as follows. With respect to the coordinate system of Eq. (1), (x, y, and z are the Cartesian coordinates, $m_z$, the magnetic moment along the z-axis, of Eq. (1) corresponds to the bulk magnetization M of each voxel and B' is the magnetic flux due to the magnetic moment shown in FIG. 9; the relationship to the NMR coordinate system is given in the Reconstruction Algorithm Section) the origin of the coordinate system, (0,0,0), is the center of the upper edge of the phantom. The phantom occupies the space below the plane x, y, z=0 ($z \leqq 0$ in the phantom space), and the sampling points lie above the plane (z>0 in the sampling space). The magnetic flux in the sampling space is given by multiplying the convolution of the input function with the system function by the unitary function (one for $z \geqq 0$ and zero for z<0). The input function can be solved in closed-form via the following operations:

1. Record the RF NMR signal at discrete points in the sampling space. Each point is designated (x, y, z, RF) and each RF value is an element in matrix . The time dependent signals are Fourier transformed to give the intensity and phase of each component. The NMR signal of each voxel at any given detector gives rise to a Fourier component with a unique phase angle relative to the Fourier component of any other voxel of the phantom at that detector. The matrix of Fourier components that correspond to the NMR signal of a given voxel over the detectors is determined. This may be achieved by using a first component having a phase angle and calculating the phase angle as a function of spatial position of the first detector relative to any other detector and identifying the component at each detector having the calculated phase angle. The matrices $A_n$ are determined for all of the voxels. The measurements of the spatial variations of the transverse RF field of a given matrix is used to determine the coordinate location of each voxel. Thus, each matrix of components associated by phase comprises the intensity variation over the sample space of the RF field of the bulk magnetization M of each voxel.

2. Discrete Fourier transform each matrix $A_n$ to obtain each matrix $B_n$.

3. Multiply each element of each matrix $B_n$ by the corresponding inverse (reciprocal) value of the Fourier transform of the system function, Eq. (1), evaluated at the same frequency as the element of the matrix $A_n$. This is matrix $C_n$.

4. Generate matrix $D_n$ by taking the discrete inverse Fourier transform of matrix $C_n$.

5. Multiply each element of each matrix $D_n$ by the distance squared along the z-axis to which the element corresponds to generate the position of the bulk magnetization M of voxel n. (This corrects the limitation of the sample space to $z \geqq 0$).

6. In one embodiment, the point spread of the reconstructed voxel is corrected by assigning one voxel above a certain threshold with the bulk magnetization M. The other voxels are assigned a zero value.

7. This procedure is repeated for all matrices $A_n$. In the limit with sufficient phase resolution, each volume element is reconstructed independently in parallel with all other volume elements such that the scan time is no greater than the nuclear free induction decay (FID) time.

Further details regarding specific derivations, and calculations are provided in the attached appendices, wherein:

APPENDIX I is the field produced by a ring of dipoles according to the present invention;

APPENDIX II is the derivation of the field produced by a shell of dipoles according to the present invention;

APPENDIX III is the mathematical proof that the field produced by a shell of magnetic dipoles is different from that of a single dipole according to the present invention;

APPENDIX IV is the derivation of the field produced by a sphere of dipoles according to the present invention;

APPENDIX V is the derivation of the Fourier transform of the system function of the z-component of the magnetic field from a dipole oriented in the direction of the z-axis used in the reconstruction process according to the present invention;

APPENDIX VI is the derivation of $S=HF$ $U(k_z)$ convolution from Eq. (55) used in a reconstruction process according to the present invention, and APPENDIX VII is the derivation of the Inverse Transform of Eq. (69) to Give Inverse Transform 1, Eq. (69), used in a reconstruction process according to the present invention.

DETAILED DESCRIPTION OF THE INVENTION

Figure 1A:
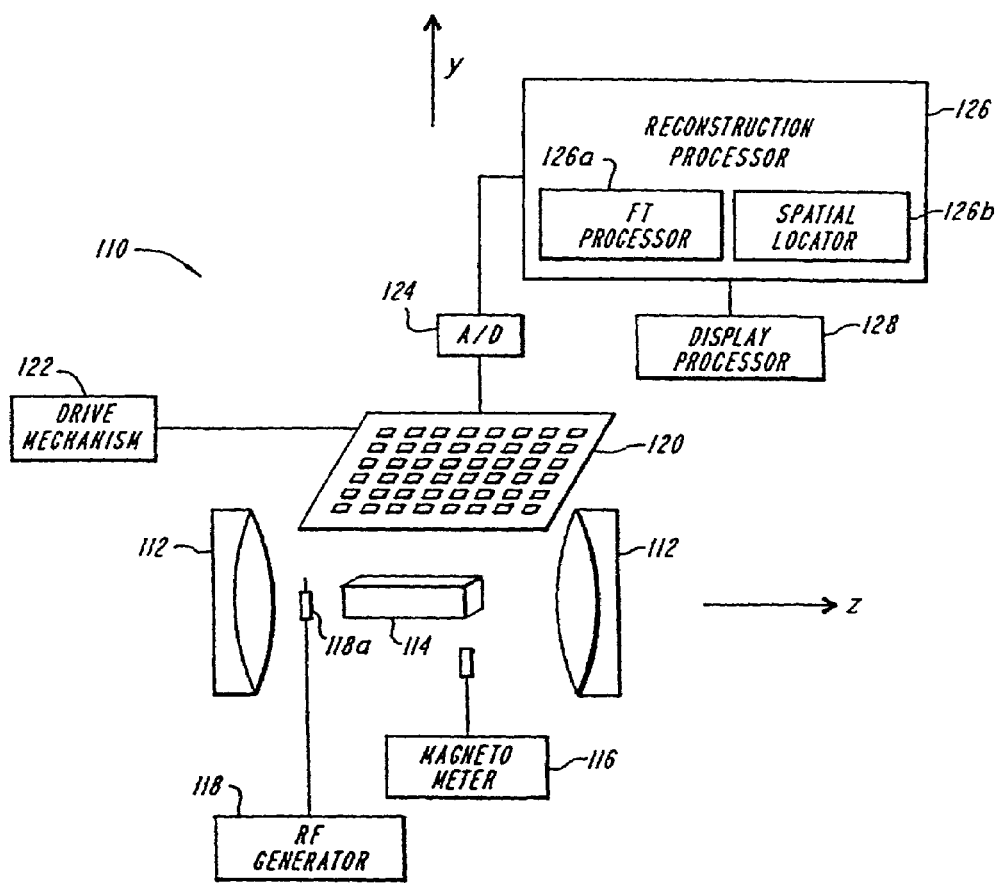
FIG. 1a is a schematic diagram of an apparatus according to the teachings of the invention in which a magnet magnetizes a body to be imaged, an RF generator excites the body, and an array of detectors detect radiation emitted by the body in response to the RF excitation radiation.

An exemplary embodiment of a nuclear magnetic resonance (4D-MRI apparatus 110 according to the teachings of the present invention is shown in FIG. 1a. The apparatus 110 includes a magnet 112, such as a superconducting magnet, that provides a primary or magnetizing field, to magnetize a body 114 to be imaged. A magnetometer 116 determines the primary or magnetizing field in the volume to be occupied by the body, i.e., in the image space, in the absence of the body. One practice of the invention utilizes a magnetometer that employs NMR of protons in water for determining the primary radiation field at multiple points in the image space. In an embodiment, the primary field is uniform as recorded by magnetometer 116.

A radiation source 118, such as a radio frequency generator, applies an RF pulse to the body in combination with RF antennae 118a when the body is placed in the magnetic field, to excite and thereby polarize selected nuclei of the body. The excited nuclei emit an RF radiation that a plurality of detectors 120, disposed in a plane above or below the object, can detect. The excitation pulse can be selected to rotate the magnetization of the nuclei, preferably by 90 degrees, with the respect to the primary field. In such a case, the RF radiation that the excited nuclei emit is primarily along a direction perpendicular to the plane of the detectors. In an embodiment using techniques known by those skilled in the art, RF pulse sequences are applied to generate the data for $T_1$ and/or $T_2$ NMR images. The detectors can be selected to respond only to components of a magnetic field perpendicular to the plane in which they reside. Thus, such detectors can detect the emitted RF field without interference from other components of the magnetic field to permit a unique reconstruction of the NMR image. In an embodiment, a drive mechanism 122 moves the detectors 120 in a direction perpendicular to the plane of the detectors, to sample the external RF field over a three-dimensional volume. The separation of the detectors and the step size of the movement of the detectors along a direction perpendicular to the plane are selected such that the detectors sample the external RF field over a three-dimensional volume, i.e., the sample volume, at least at the Nyquist rate. Preferably, a three dimension array of detectors is used to sample the RF field at the Nyquist rate. Such a sampling advantageously allows obtaining the NMR image of the body. An embodiment, employs an impedance-matched array of RF antennas that are time-multiplexed to reduce cross talk among them. The RF field may be sampled synchronously or the field may be sampled at known times so that the phase at any given detector may be related to that at any other detector.

Figure 11:
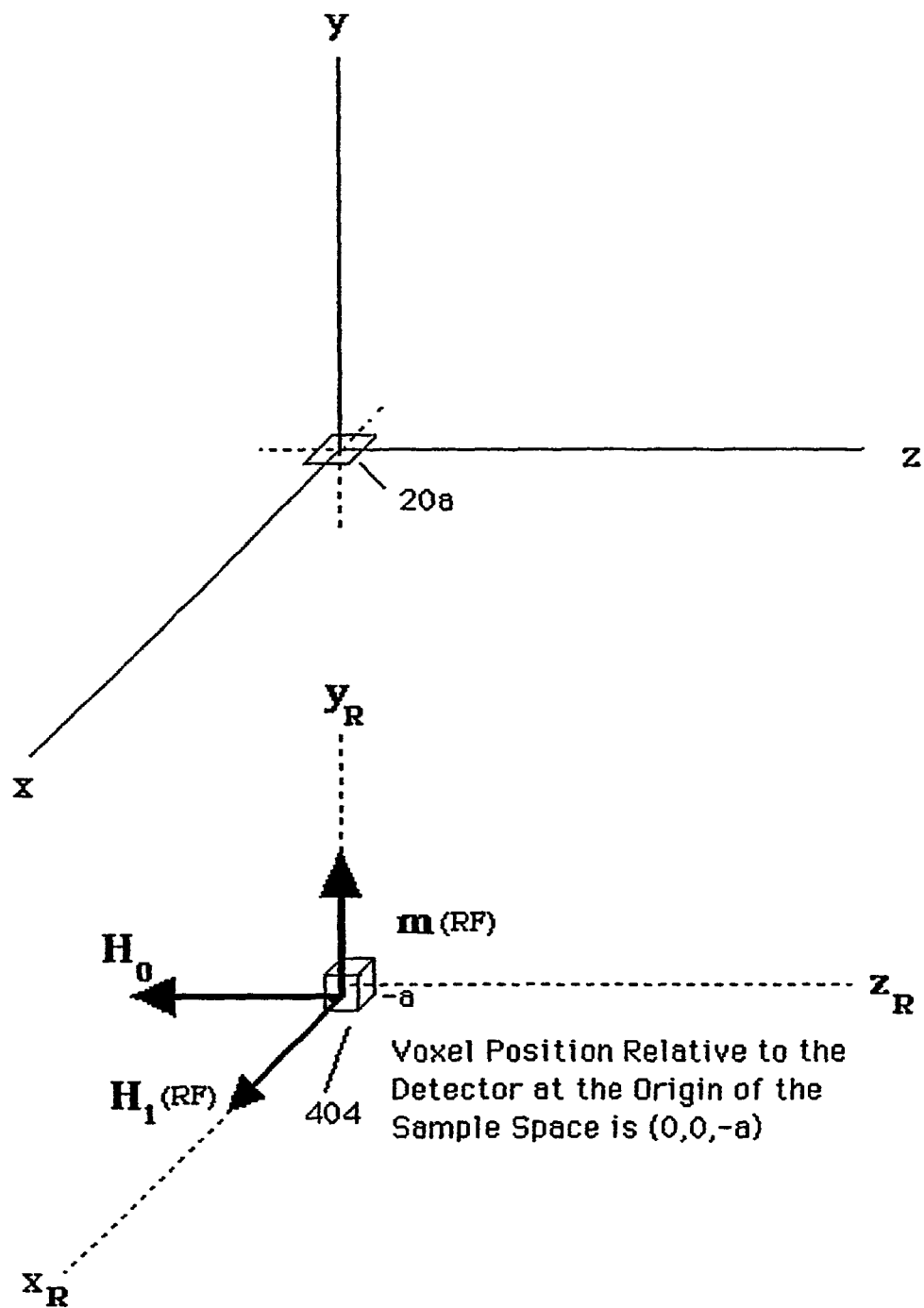
FIG. 11 shows the rotating NMR coordinate system ($x_R$, $y_R$, $z_R$) and the stationary coordinate system (x, y, z) of the NMR detector corresponding to the coordinate system of FIG. 9 and FIG. 10 of a primary field $H_0$ oriented parallel to the $z_R$-axis and the z-axis and the corresponding transverse RF magnetic dipole oriented in the $x_R y_R$-plane and periodically parallel to the y-axis wherein the spatial variation of the RF y-component of the flux due to the RF dipole is measured at a detector according to Eq. (1) and shows the distances from the voxel to the detector in accordance with the invention.

The process of magnetization of selected nuclei of the body can be better understood by referring to FIG. 11 that shows a magnetizing field $H_0$ applied to a voxel 14a of the body 114. The RF excitation field is selected to be in a direction perpendicular to the field $H_0$ and its magnitude is designated as $H_1$. No active nuclei of the voxel, such as protons, possess both angular momentum and a magnetic moment. Thus, the vector sum of the magnetic moments of all such NMR active nuclei present in the voxel 14a give rise to the bulk magnetization of the voxel 14a. The bulk magnetization vector M (not shown) designates the collective contribution of a selected type of NMR active nuclei to the magnetization of the voxel 14a which corresponds to a RF parallel magnetic moment m. The RF excitation field is selected to be in resonance with the selected type of nuclei, e.g., protons, of the voxel 14a, to rotate the bulk magnetization vector M. In a rotating frame representation, designated in FIG. 11 as ($x_R$, $y_R$, $z_R$) and well known to those skilled in NMR, the magnetization vector M rotates about $H_1$ so long as the RF radiation is present. The rate of rotation of the magnetization vector about the applied field $H_1$ depends on the gyromagnetic ratio of the affected nuclei and the magnitude of the excitation field, $H_1$. The duration of the RF radiation can thus be selected to cause a rotation of the magnetization vector, initially aligned along $H_0$, onto the $x_R y_R$-plane, for example by a 90° rotation. After the RF excitation field is turned off, the rotated magnetization M precesses about $H_0$ at the position of the voxel 14a.

The precession of the magnetization M of each voxel about $H_0$ produces a radiating dipolar field corresponding to a magnetic moment m that has its maximum intensity along the $y_R$ direction. The precession frequency of the magnetic moment called the Larmor frequency is dependent on the magnetic flux of the primary field which is uniform in a preferred embodiment A detector 20a can be, for example, an RF antenna pointing along the y direction to respond selectively to the radiating RF field from all of the voxels. This external RF field is recorded as a function of time at each over the entire sample space. The NMR signal at each detector as a function of time is processed by a method such as a Fourier transform operation to give a plurality of Fourier components each having an intensity and a phase angle. The NMR signal of each voxel at any given detector gives rise to a Fourier component with a unique phase angle relative to the Fourier component of any other voxel of the phantom at that detector. Each set of components of the NMR signal over the sample space due to a given voxel is determined from the phase data and the detector positions. The spatial variation of the NMR signal over the sample space is used to determine the location of the voxel in the phantom. This is repeated for all sets of components, each corresponding to a voxel to reconstruct the NMR image. Preferably, the position of each voxel is reconstructed independently in parallel with all other voxels such that the scan time is no greater the time for the excited nuclei to return to their unexcited state called the nuclear free induction decay (FID) time. This may be achieved by using sufficiently high spatial and temporal sampling rate such that each set of components associated by phase corresponds to a single voxel.

With further reference to FIG. 1a, an analog to digital converter ("A/D converter") 124 converts the analog signal outputs of the detectors 120 into digital signals. A preferred embodiment of the invention utilizes at least a 12 bit A/D converter to digitize the output signals. A reconstruction processor 126 receives the digital signals, and determines the NMR image of the body. The reconstruction processor 126 includes a Fourier transform processor 126a that obtains the phase components of the external RF field. In addition, a spatial locator 126b, which is a part of the reconstruction processor 126, employs the variation of the maximum intensity of the external RF field over the sample space (the three dimensional space sampled by the detectors) to locate the positions of the voxels in the image space producing a particular set of components of the external RF field associated by phase, in a manner described in detail below (See the Reconstruction Algorithm Section). An display processor 128 displays a two-dimensional or a three-dimensional image corresponding to the NMR image of the body.

The spatial locator 126b employs an algorithm, described in detail below in the Reconstruction Algorithm Section, to determine the positions of the voxels of the magnetized body that produce each set of components of the external RF field associated by phase. It is demonstrated in the Uniqueness of Reconstruction Section that a RF magnetic field produced by a geometric distribution of dipoles is unique. Therefore, a unique spatial distribution of magnetic dipoles, such as those corresponding to the bulk magnetization of each voxel due to precessing nuclei, gives rise to a unique magnetic field. Thus, the measured external RF field can provide a unique solution for the spatial distribution of magnetic dipoles, i.e., magnetized voxels comprising excited nuclei, in the body.

Referring again to FIG. 1a, the spatial locator preferably employs a Fourier Transform Reconstruction Algorithm, described in detail in the Reconstruction Algorithm Section, to map a bulk magnetic moment M corresponding to a particular set of components associated by phase of the external RF field onto a spatial location or locations in the body. The latter case applies if more than one location in the body gives rise to a particular phase component of the external RF radiation.

As shown in FIG. 1a, a preferred embodiment of the invention employs an open design magnet, such as a Helmholtz coil design, to allow positioning the array of detectors 120 close to the body 114 to be imaged. The orientation of the magnetic field with respect to the body can be selected to optimize the signal to noise ratio of the signals detected by the array of detectors 120. For example, in case of imaging a patient body, the primary magnetic field can be selected to be coaxial with the body, or it can alternatively be perpendicular to the body axis.

The 4D-MRI apparatus of FIG. 1a provides a number of advantages. In particular, because all of the data is acquired at once rather than over hundreds of repeated sequences of pulses as is the case with NMR systems of the prior art, the apparatus of the invention is particularly suited for imaging cardiopulmonary and vascular systems. Further, since the apparatus may increase the number of detectors to increase the resolution, the apparatus of the invention may achieve a higher resolution such as $10^{-3}$ cm$^3$; thereby, permitting physicians to view human anatomy and pathology in a manner not available with conventional imaging techniques. Further, the present technique may provide a three dimensional image that can be displayed from any perspective.

Figure 1B:
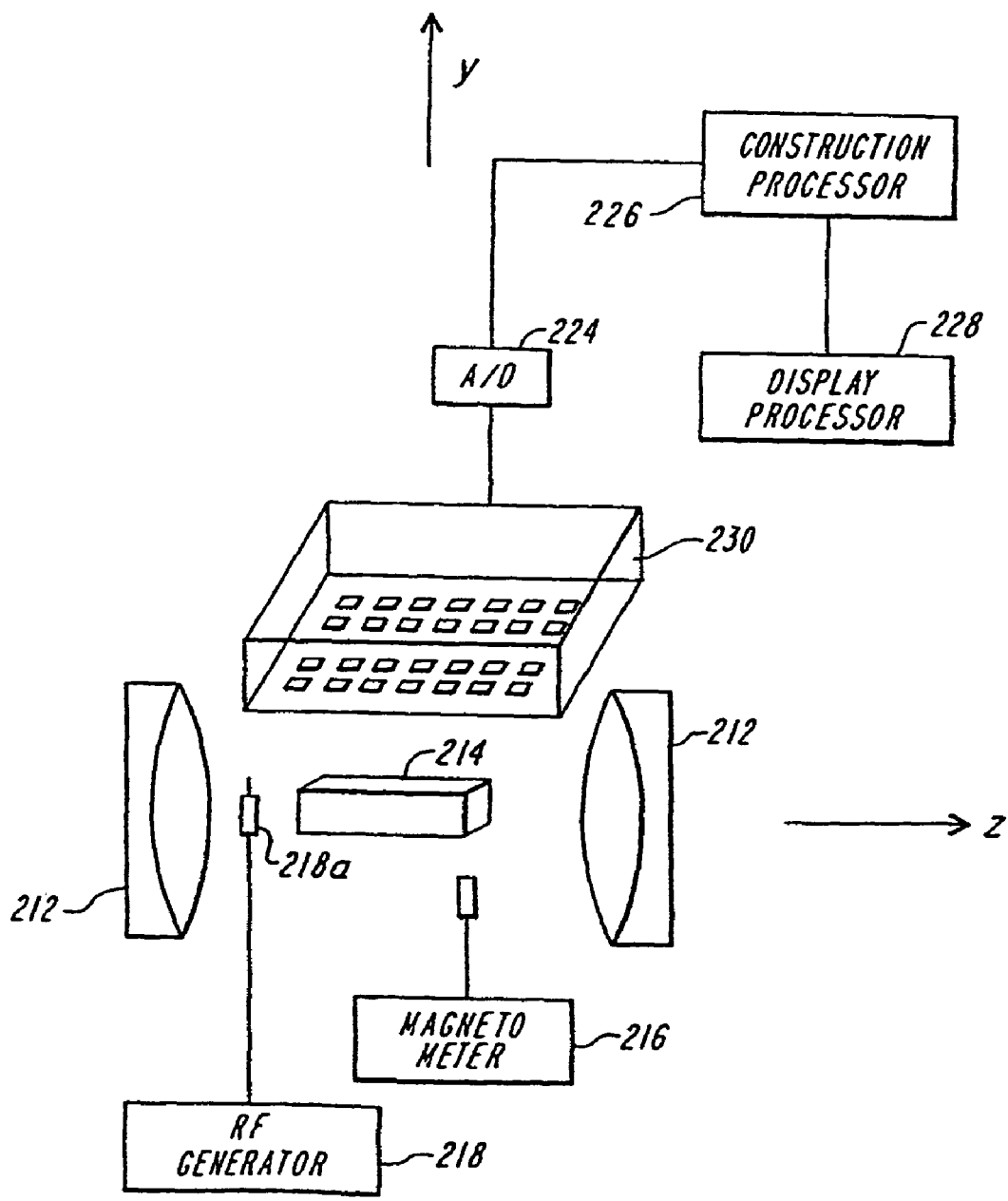
FIG. 1b is a schematic diagram of an apparatus according to the teachings of the invention that employs a three-dimensional array of detectors to detect radiation emitted by nuclei of a body to be imaged in response to excitation of the nuclei by a radiation source.

An alternative embodiment of the nuclear magnetic resonance (4D-MRI) apparatus of the invention, shown in FIG. 1b, employs a three-dimensional array of detectors 230, spaced apart to detect spatial variations of the emitted RF radiation at least at the Nyquist frequency. A magnet 212 provides a magnetizing in a volume to be occupied by a body, i.e., image space. A magnetometer 216 measures the magnetizing field at a plurality of positions in the image space in the absence of the body to determine the uniformity of the primary field. As in embodiment of FIG. 1a, the body 214 to be imaged is placed in a magnetizing field provided by the magnet 212. An RF generator 218 in combination with an RF antenna 218a apply an RF pulse or a sequence of RF pulses to the body to polarize selected nuclei of the body; The three-dimensional array of detectors 230 provide output signals in response to the RF radiation emitted by the body. The RF signal may be recorded synchronously to permit the relative phases of the Fourier components comprising the RF signal. In an embodiment, the detection may be synchronized relative to the excitation. A digitizer 224 digitizes the output signals and sends the digital signals to a construction processor 226 that determines variations of the NMR image of the body in a manner similar to that described in connection with the embodiment of FIG. 1a. A display processor 228 receives the information regarding the spatial variations of the intensity of the NMR signal from the construction processor 226, and provides a two-dimensional or a three-dimensional NMR image of the body. Employing a three-dimensional array of detectors advantageously decreases the acquisition time because the emitted RF signal over the entire three dimensional sample space is detected at once. The shortening of the acquisition time in turn reduces motion artifacts in the NMR image.

Uniqueness of Reconstruction

The nature of the RF field can be determined from Maxwell's equations applied to a sinusoidal current. With a sinusoidal current J(x') confined to small region compared with a wavelength, the solution of the vector potential A(x) is [4]

$$A(x) = \frac{1}{c} \int J(x') \frac{e^{ik|x-x'|}}{|x-x'|} d^3 x' \quad (12)$$

where $$k = \frac{\omega}{c}$$

is the wavenumber, and a sinusoidal time dependence is understood. The magnetic induction is given by $$B = \nabla \times A \quad (13)$$

while, outside the source, the electric field is $$E = \frac{i}{k} \nabla \times B \quad (14)$$

For a source of dimension d, the fields in the far zone defined by d<<λ<<r are transverse to the radius vector and fall off as $r^{-1}$, typical of radiation fields. For the near zone where r<<λ (or kr<<1), the exponential in Eq. (12) can be replaced by unity. Then the vector potential is given by $$\lim_{kr \to 0} A(x) = \frac{1}{c} \sum_{l,m} \frac{4\pi}{2l+1} \frac{Y_{lm}(\theta, \phi)}{r^{l+1}} \int J(x') r'^l Y_{lm}^*(\theta', \phi') d^3 x' \quad (15)$$

This shows that the near fields are quasi-stationary, oscillating harmonically as $e^{-i\omega t}$, but otherwise static in character.

Nuclear magnetic resonance (NMR), which is commonly called magnetic resonance imaging (MRI), is a means to measure the primary and secondary magnetic fields to provide the input to the NMR reconstruction algorithm. The proton gyromagnetic ratio $\gamma_p/2\pi$ is $$\gamma_p/2\pi = 42.57602 \text{ MHz } T^{-1} \quad (16)$$

The NMR frequency f is the product of the proton gyromagnetic ratio given by Eq. (16) and the magnetic flux B.

$$f = \gamma_p/2\pi B = 42.57602 \text{ MHz } T^{-1} B \quad (17)$$

A typical flux for a superconducting NMR imaging magnet is 0.25 T. According to Eq. (17) this corresponds to a radio frequency (RF) of 10.6 MHz which corresponds to a wavelength of 28.3 m. In the present invention, each RF antennae of an array is located at a distance of about 10 cm from the voxels within the image space. Thus, the RF field is detected in the near zone where $r<<\lambda$ (or $kr<<1$), and the near fields according to Eq. (15) are quasi-stationary, oscillating harmonically as $e^{-i\omega t}$, but otherwise static in character. The transverse RF magnetic field of each voxel is that of a RF dipole, the maximum amplitude is given by Eq. (1) wherein the Larmor frequency of each voxel is determine by the uniform primary field $H_0$, and $m_z$, the magnetic moment along the z-axis, of Eq. (1) corresponds to the bulk magnetization M of each voxel.

Figure 9:
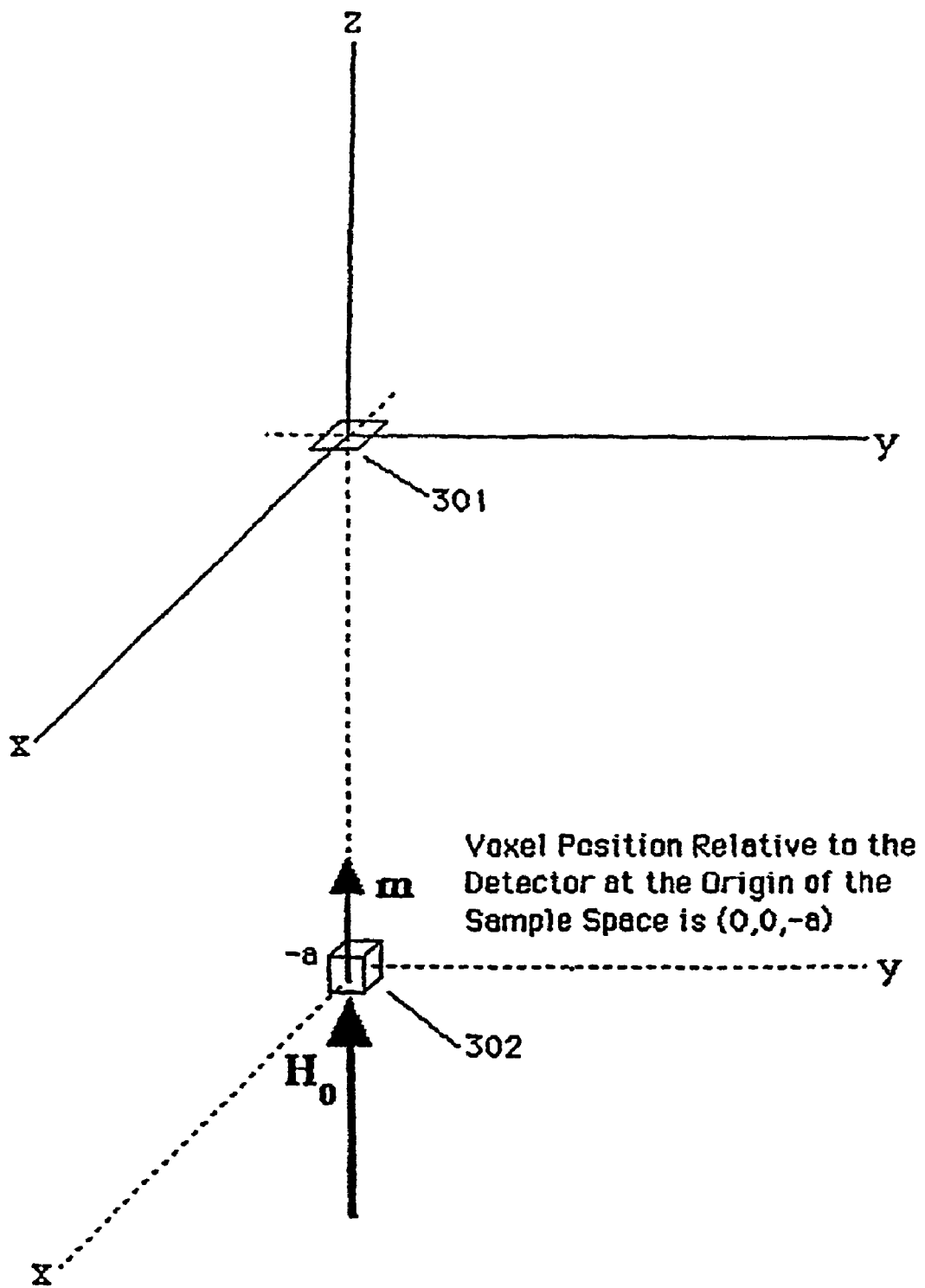
FIG. 9 shows the coordinate system (x, y, z) of Eq. (1) with a primary field $H_0$ and the corresponding magnetic dipole both oriented parallel to the z-axis wherein the z-component of the flux due to the z-oriented dipole is measured at a detector according to Eq. (1) and shows the distances from the voxel to the detector in accordance with the invention.

An object containing nuclei with a magnetic moment, herein called a phantom, can be considered as a collection of small volume elements or voxels. When a static magnetic field $H_0$ with lines in the direction of the z-axis is applied to an object comprising a material containing nuclei such as protons that possess magnetic moments, the field magnetizes the material. As a result a secondary field superposes the applied field as shown in FIG. 9. In the applied magnetic field, the magnetic moments of each nuclei precesses about the applied magnetic field. However, the magnetization of any one nucleus is not observed from the macroscopic sample. Rather the vector sum of the dipole moments from all magnetic nuclei in the sample is observed. This bulk magnetization is denoted by the vector M. In thermal equilibrium with the primary field $H_0$, the bulk magnetization M is parallel to $H_0$. In an embodiment of the present invention, the magnetization vector is rotated into the transverse plane by an additional RF field $H_1$. The magnetization vector then comprises a rotating magnetic dipole m in the transverse plane. The NMR image may be reconstructed by sampling the external field from a series of RF dipoles.

The field strength of a magnetic dipole moment is a function of the external position in space relative to the dipole. For convenience of analysis, the field of a series of static dipoles m having the coordinates shown in FIG. 9 is analyzed for uniqueness. (The uniqueness of the field of a set of static dipoles applies for the equivalent case of RF dipoles oriented in the transverse plane.) Considering FIG. 9, the net magnetic field at a point extrinsic to the phantom is a sum of the applied field and the contributions of each of the voxels within the object, the secondary field. The field is point sampled over a three dimensional space.

The secondary magnetic field due to magnetized tissue has to be modeled as noninteracting dipoles aligned with the imposed field. It is demonstrated below that the field of any geometric distribution of dipoles is unique, and the superposition principle holds for magnetic fields; therefore, a unique spatial distribution of dipoles gives rise to a unique secondary magnetic field, and it is further demonstrated below that this secondary field can be used to solve for the NMR image in closed form. It follows that this map is a unique solution. To prove that any geometric distribution of dipoles has a unique field, it must be demonstrated that the field produced by a dipole can serve as a mathematical basis for any distribution of dipoles. This is equivalent to proving that no geometric distribution of dipoles can produce a field which is identical to the field of a dipole.

Figure 2:
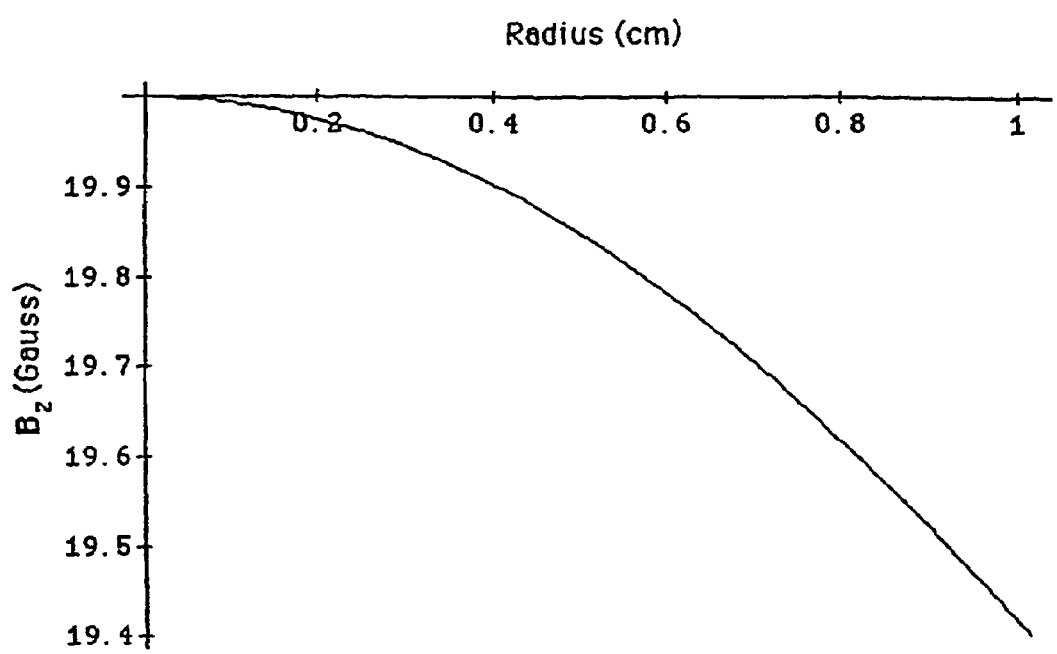
FIG. 2 is the plot of the field of a ring of dipoles of radius R and magnetic moment $m=10^4$ $Gcm^3$ given by Eq. (I.14) as a function of radius R where the position of the center of the ring relative to the detector is the point (0,0,10) in accordance with the invention.
Figure 4:
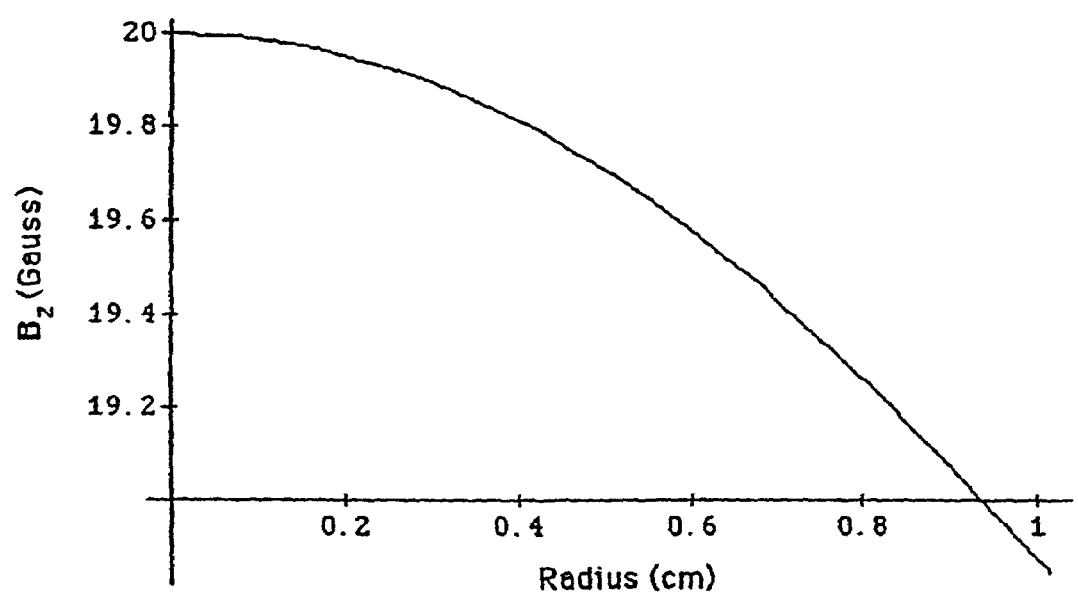
FIG. 4 is the plot of the field of a shell of dipoles of radius R and magnetic moment $m=10^4$ $Gcm^3$ given by Eq. (II.17) as a function of radius R where the position of the center of the shell relative to the detector is the point (0,0,10) in accordance with the invention.
Figure 6:
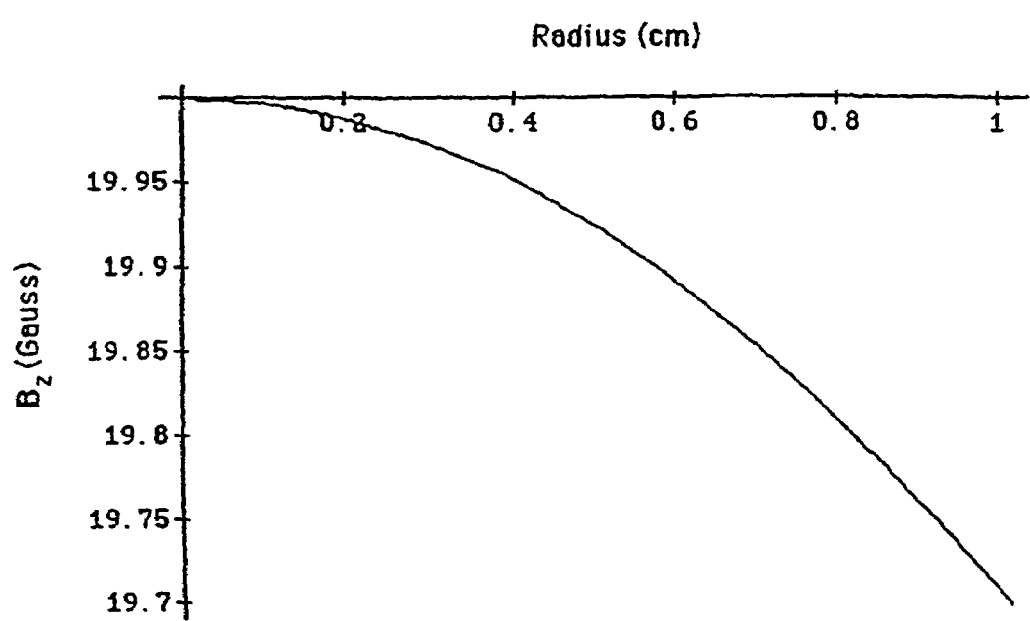
FIG. 6 is the plot of the field of a sphere of dipoles of radius R and magnetic moment $m=10^4$ $Gcm^3$ given by Eq. (IV.16) as a function of radius R where the position of the center of the sphere relative to the detector is the point (0,0,10) in accordance with the invention.

By symmetry considerations, only three distributions of uniform dipoles need to be considered. A magnetic dipole has a field that is cylindrically symmetrical. A ring, a shell, a cylinder, and a sphere of dipoles are the only cases which have this symmetry. A cylinder is a linear combination of rings. Thus, the uniqueness of the dipole field is demonstrated by showing that it is different from that of a ring, a shell, and a sphere. The uniqueness of the dipole from the cases of a ring, a shell, and a sphere of dipoles is demonstrated in APPENDIX I, APPENDIX II, and Appendix IV, respectively. The plot of the three cases of the field of a ring, shell, and a sphere of dipoles each of radius R and magnetic moment $m = 10^4$ Gcm$^3$ given by Eq. (I.14), Eq. (I.17), and Eq. (IV.16) of APPENDIX I, APPENDIX II, and APPENDIX IV as a function of radius R where the position of the center of each distribution relative to the detector is the point (0,0,10) is given in FIGS. 2, 4, and 6, respectively. Since the fields vary as a function of radius R, the dipole field is not equivalent to these distributions of dipoles. It is further mathematically proven in APPENDIX III that the field produced by a shell of magnetic dipoles is different from that of a single dipole. All other fields are a linear combination of dipoles. Thus, the dipole is a basis element for the reconstruction of a NMR image. Since each dipole to be mapped gives rise to a unique field and since the total field at a detector is the superposition of the individual unique dipole fields, linear independence is assured; therefore, the NMR image is unique. In other words, there is only one solution of the NMR image for a given set of detector values which spatially measure the superposition of the unique fields of the dipoles. This map can be reconstructed using the algorithms described in the Reconstruction Algorithm Section.

Eq. (1) is a system function which gives the magnetic flux output in response to a magnetic dipole input at the origin. The phantom is an array of spatially advanced and delayed dipoles weighted according to the bulk magnetization of each voxel; this is the input function. The secondary flux is the superposition of spatially advanced and delayed flux, according to Eq. (1); this is the output function. Thus, the response of space to a magnetized phantom is given by the convolution of Eq. (1) with the series of weighted, spatially advanced and delayed dipoles representing the bulk magnetization map or NMR image of the phantom. The discrete signals are recorded by a detector array over the sample space comprising the xy-plane and the positive z-axis of FIG. 9. In an embodiment of the present invention, the magnetization vector is rotated into the transverse plane by an additional RF field $H_1$. The magnetization vector then comprises a rotating magnetic dipole m in the transverse plane. The NMR image may be reconstructed by sampling the external field from a series of RF dipoles. The discrete signals are recorded by a detector array over the sample space comprising the xz-plane and the positive y-axis of FIG. 11.

$T_1$ and $T_2$ NMR Images

The NMR active nuclei including protons posses both angular momentum and a magnetic moment. When nuclei are placed in a static magnetic field $H_0$, they precess about the field at a frequency proportional to the magnitude of $H_0$. The bulk magnetization M of each voxel comprises the vector sum of the magnetic moments from all of the nuclei in each voxel. If the precessing nuclei are then subjected to an additional rotating (RF) field $H_1$, which is synchronous with the precession, their magnetic moments and thus M will precess about $H_1$ and rotate away from the primary field $H_0$ by an angle $\phi_{H_1}$ in a coordinate frame which rotates at the Larmor frequency [3]. The precession about $H_1$ continues as long as $H_1$ exists. The final value of $\phi_{H_1}$ then depends on the strength of $H_1$, which determines the precession rate, and the time for which it is turned on. The nuclei absorb energy as they change their orientation. This is known as nuclear magnetic resonance (NMR). The temperature of the nuclei or nuclear spin system rises during absorption of energy. When the $H_1$ field is removed, the spin system cools down until it is thermal equilibrium with its environment. The exponential relaxation of the spin system temperature to that of the surrounding lattice is called spin-lattice relaxation and has a time constant $T_1$ where a time constant is defined as the time it takes for 63% of the relaxation to occur. The NMR signal may also decay because the nuclei initially in phase following the $H_1$ pulse get out of alignment with each other or dephase by local interactions with the magnetic fields of neighbor nuclei. The dephasing of the NMR signal is due to differing precession rates effected by the local interactions and is described by an exponential time constant $T_2$ also known as spin/spin relaxation. The main source of NMR image (also called magnetic resonance images (MRI) contrast is $T_1$ and $T_2$ which depend on tissue types.

In an embodiment of the present invention, a $T_1$ image is produced by a applying at least one pulse sequence that inverts the magnetization and records the relaxation, a technique called inversion recovery. For example, the RF receivers are switched on to follow the decay following the nuclear excitation comprising a $H_1$ pulse. $M_z(t)$, the time dependent bulk magnetization in the direction of the primary field $H_0$ (coordinates of FIG. 11) is examined at a time $t_0$ after an inverting pulse by applying another $H_1$ pulse equivalent to a rotation by 90° after waiting the time $t_0$ following the initial inversion. The 90° pulse puts the z magnetization $M_z(t_0)$ into the transverse plane for observation. Changing the waiting time $t_0$ allows for observation of $M_z(t)$ at different times during relaxation.

In an embodiment of the present invention, a $T_2$ image is produced by a applying at least one pulse sequence that flips the magnetization vector into the transverse plane and records the transverse relaxation by producing at least one spin-echo. The $T_2$ image depends on the NMR signal decaying because the nuclei initially in phase following the $H_1$ pulse get out of alignment with each other or dephase by local interactions with the magnetic fields of neighbor nuclei. The dephasing of the NMR signal is due to differing precession rates effected by the local interactions and is described by an exponential time constant $T_2$. Another unwanted source of dephasing is due to inhomogeneities in the primary field $H_0$ across the image space that causes an addition contribution to the precession rates of the magnetic nuclei. The signal ones observes after flipping the magnetization into the transverse plane that includes dephasing from an inhomogeneous $H_0$ field is still known as the free induction decay (FID), but the is called $T^*_2$ relaxation. The $T_2$ relaxation may be recovered from a $T^*_2$ FID since the $H_0$ inhomogeneity is constant and may be reversed. The dephasing due to the static inhomogeneity of $H_0$ may be canceled out by applying a 180° $H_1$ pulse at time to along the $y_R$-axis as shown in FIG. 11 where the $T^*_2$ relaxation occurs in time $t_0$. After an additional time $t_0$, the total time elapsed after the 90° $H_1$ pulse is $2t_0=t_E$ which is the spin-echo time. At this time the dephasing due to the static inhomogeneity of $H_0$ is exactly canceled out; so, the relaxation is strictly due to those processes that create $T_2$ relaxation which is recorded. After each 180° pulse, another spin echo is formed. The envelop of the maximum amplitude of the spin echoes is the $T_2$ relaxation. In an embodiment, a pulse sequence to give the data for a $T_2$ image known as the Carr-Purcell-Meiboom-Gill (CPMG) sequence [3] comprises applying a 90° pulse along the $x_R$-axis followed by a series of 180° pulses along the $y_R$-axis at times $t_0+2nt_0$ where n is an integer including zero.

In other words, when nuclei are placed in a static magnetic field $H_0$ and then subjected to an additional rotating (RF) field $H_1$, which is synchronous with their precession, M will precess about $H_1$ and rotate away from the primary field $H_0$ by an angle $\phi_{H_1}$. The magnitude of M is a maximum initially and decays with time. This occurs by emission of the same multipolarity radiation that it absorbed and by transfer of energy to the surrounding lattice. The intensity of the radiation is a function of M and the coordinate position relative to the RF emitting voxel. In the present invention, the measurement of the intensity of the RF signal is performed over time and space following $T_1$ and/or $T_2$ encoding pulses. The signal as a function of time at a given detector position is Fourier transformed to give the components each having an amplitude and a unique phase. Each set of components of the NMR signal over the sample space due to a given voxel is determined from the phase data and the detector positions. The location of each voxel is determined through the spatial variations of the intensity of the transverse NMR field of the set of components associated by phase.

4D-MRI System

Figure 8:
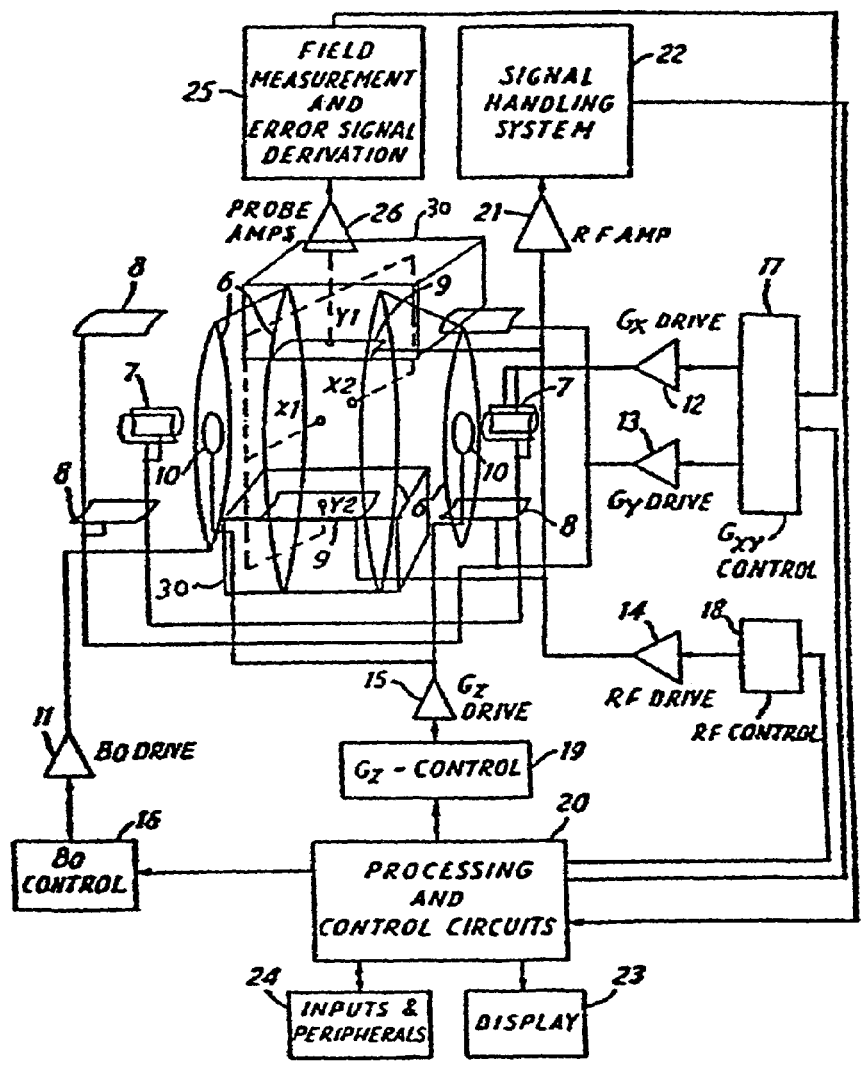
FIG. 8 shows a typical the nuclear magnetic resonance (4D-MRI) apparatus in accordance with the invention.
Figure 10:
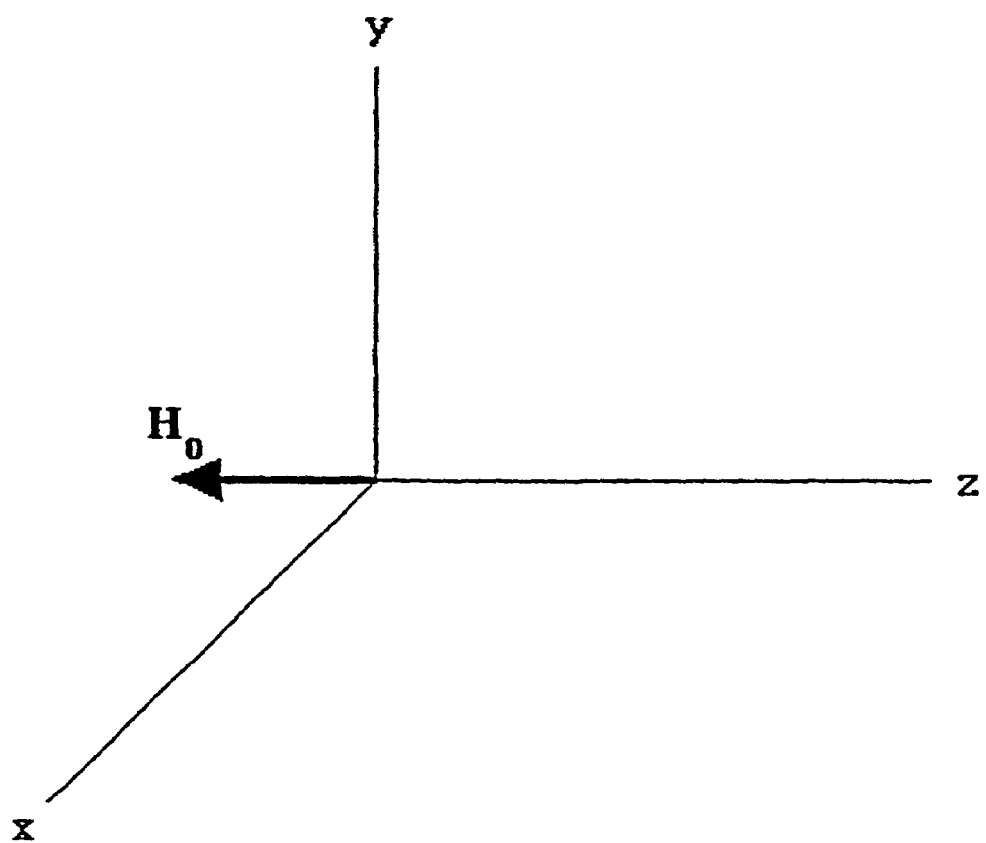
FIG. 10 shows the stationary coordinate system of the nuclear magnetic resonance (4D-MRI) apparatus of FIG. 8 corresponding to the coordinate system of FIG. 9 in accordance with the invention.

An NMR apparatus used to generate, and measure the secondary field and reconstruct the image is shown in FIG. 8, and the corresponding coordinate system is shown in FIG. 10. The apparatus comprises 1.) a magnet including a superconducting magnet to magnetize a volume of an object or tissue to be imaged, 2.) a means (magnetometer) to determine the primary or magnetizing flux over the image space in the absence of the object to be imaged. In one embodiment, NMR of a proton containing homogeneous phantom such as water is determined on a point by point basis to map the primary field, or the magnetic flux at multiple points is obtained simultaneously using the reconstruction algorithm described herein, 3.) a radio frequency (RF) generator and transmitter including an antennae such as saddle coils to excite the protons of the magnetized volume, 4.) a means including an antennae coil to sample the dipole component (z-component in terms of Eq. (1)) of the RF secondary magnetic field at the Nyquist rate in time over the proton free induction decay, 5.) a detector array of elements of the means to sample the time signals including an antennae array which is selectively responsive to the dipole component (z-component of Eq. (1)) of the RF magnetic field of the magnetic moments of the protons which are aligned along the transverse axis to ideally point sample the secondary magnetic field at the Nyquist rate over the spatial dimensions which uniquely determine the NMR image which is reconstructed from the measurements, 6.) an analog to digital converter to digitize the RF signals, 7.) a time Fourier transform processor to convert the signal at each detector over time into its Fourier components, 8.) a processor to associate the Fourier components due to each voxel by phase, 9.) a reconstruction algorithm processor including a Fourier transform processor to convert each set of components into a voxel location of the bulk magnetization in the image space in parallel over all the voxels to form an NMR image, and 10.) image processors and a display such that the NMR image can be rotated in space to be displayed from any perspective as a three dimensional or two dimensional (tomographic) image.

Magnetizing Field

In an embodiment of the present invention, the applied magnetizing field which permeates the object to be imaged including tissue is confined only to that region which is to be imaged. The confined field limits the source of signal only to the volume of interest; thus, the volume to be reconstructed is limited to the magnetized volume which sets a limit to the computation required, and eliminates end effects of signal originating outside of the edges of the detector array. In the NMR case, the field having a steep gradient at the edges limits the imaged region by providing a range of Larmor frequencies wherein the data is comprises a narrow frequency band at a desired Larmor frequency.

Detector Array

An embodiment of the NMR imager of the present invention comprises a detector array of multiple detector elements which are arranged in a plane. The array may be a two dimensional detector array which is translated over the third dimension during the scan, or it may be a three dimensional detector array. The individual detectors of the array may respond to a single component of the secondary magnetic field which is produced by the magnetized object including tissue where the component of the field to which the detector is responsive determines the geometric system function which is used in the reconstruction algorithm discussed in the Reconstruction Algorithm Section. The detectors ideally point sample the secondary magnetic field at the Nyquist rate over the spatial dimensions which uniquely determine the NMR image which is reconstructed from the measurements.

Small antennas may measure the RF signals as point samples without significant decrease in the signal to noise ratio relative to large antennas by using impedance matching while minimizing resistive losses by using superconducting reactance elements, for example. In an embodiment, cross talk between antennas is ameliorated or eliminated by time multiplexing the signal detection over the array of antennas. The RF field may be sampled synchronously or the field may be sampled at known times so that the phase at any given detector may be related to that at any other detector.

Micromagnetic field sensors that are used to detect the primary field in the absence of the object to be scanned include NMR detectors and superconducting quantum interference devices (SQUIDS). Additional devices have been developed that are based on galvanometric effects due to the Lorentz force on charge carriers. In specific device configurations and operating conditions, the various galvanomagnetic effects (Hall voltage, Lorentz deflection, magnetoresistive, and magnetoconcentration) emerge. Semiconductor magnetic field sensors include MAGFETs, magnetotrinsitors (MT), Van der Pauw devices, integrated bulk Hall devices including the vertical MT (VMT), and the lateral MT (LMT), silicon on sapphire (SOS) and CMOS magnetodiodes, the magnetounijunction transistor (MUJT), and the carrier domain magnetometer (CDM), magnetic avalanche transistors (MAT), optoelectronic magnetic field sensors, and magnetoresistive magnetic field sensors. In the case of NMR measurement of the secondary field (and/or the primary field), the detector array comprises RF antennas described in the NMR Primary Magnet, Gradient Magnets, RF Generator, RF Transmitter, and RF Receiver Section.

Scanning Methods

The NMR scan performed on the object to be imaged including a human comprises the following steps:
  The magnetic moments of nuclei including protons of the object to be imaged that are aligned by the primary field are further aligned by a radio frequency (RF) pulse or series of pulses.
  The strength and duration of the rotating $H_1$ (RF) field that is resonant with the protons of the magnetized volume and is oriented perpendicularly to the direction of the magnetizing field is applied such that the final precession angle of the magnetization is 90° ($\phi_{H_1}=90°$) such that the RF dipole is transverse to the primary magnetizing field and perpendicular to the RF magnetic field detector.
  NMR pulse sequences which provide the signals for a $T_1$ or $T_2$ image may be applied. For example a 90° pulse may be followed by a series of 180° pulses. One sequence is the Carr-Purcell-Meiboom-Gill (CPMG) sequence [3].
  The free induction decay signals are recorded.
  The time dependent signals are Fourier transformed to give the intensity and phase of each component. The NMR signal of each voxel at any given detector gives rise to a Fourier component with a unique phase angle relative to the Fourier component of any other voxel of the phantom at that detector.

The matrix of Fourier components that correspond to the NMR signal of a given voxel over the detectors is determined. This may be achieved by using a first component having a phase angle and calculating the phase angle as a function of spatial position of the first detector relative to any other detector and identifying the component at each detector having the calculated phase angle. The matrices are determined for all of the voxels. The measurements of the spatial variations of the transverse RF field of a given matrix is used to determine the coordinate location of each voxel. Thus, each matrix of components associated by phase comprises the intensity variation over the sample space of the RF field of the bulk magnetization M of each voxel.

The Fourier transform algorithm given in the Fourier Transform Reconstruction Algorithm Section is performed on each set of components over the detector array to map each bulk magnetization M corresponding to a voxel to a spatial location over the image space.

In one embodiment, the point spread of the reconstructed voxel is corrected by assigning one voxel above a certain threshold with the bulk magnetization M. The other voxels are assigned a zero value. In this case, the reconstruction is digital versus analog. In terms of the signal to noise ratio, the superiority of digital over analog is generally known to those skilled in the art of signal processing.

In the limit with sufficient phase resolution, each volume element is reconstructed independently in parallel with all other volume elements such that the scan time is no greater than the nuclear free induction decay (FID) time.

NMR Primary Magnet, Gradient Magnets, RF Generator, RF Transmitter, and RF Receiver The primary magnet is that typical of a magnetic resonance imaging apparatus. The primary magnetizing field is in the z-direction as shown in FIG. 10, usually coaxial with the patient's body. However, in an another embodiment the primary magnetizing field is in the direction which is perpendicular to the patient's body. An open primary magnet design is preferable such as a Helmholtz coil design to accommodate the three dimensional RF antennae array. A further field is applied to have a gradient in the z-direction (FIG. 10). This provides a unique field in a chosen volume of the patient including a cross-sectional slice of the patient. In another embodiment, the NMR (Larmor) frequency from each voxel is determined by the magnitude of the magnetizing flux at the voxel position. The primary magnetic field has a sharp gradient at the edges of the image space wherein the Larmor frequencies outside of a selected range are rejected as arising from voxels outside of the image volume.

A rotating RF field $H_1$, of frequency chosen to cause resonance in the slice is then applied. Thus, only the molecules in the slice resonate. The resonance signal from the slice can then be detected. NMR pulse sequences which provide the signals for a $T_1$ or $T_2$ image may be applied. For example a 90° pulse may be followed by a series of 180° pulses. One sequence is the Carr-Purcell-Meiboom-Gill (CPMG) sequence [3].

An embodiment of the NMR imager of the present invention comprises a RF generator 14 and 18 and RF transmitter coils 9 shown in FIG. 8 which provide the rotating $H_1$ (RF) field that is resonant with the protons of the magnetized volume and is oriented perpendicularly to the direction of the magnetizing field as shown in FIG. 11. When the precessing nuclei are subjected to the additional rotating (RF) field $H_1$, which is synchronous with the precession, their magnetic moments and thus M precesses about $H_1$ and rotate away from the primary field $H_0$ by an angle $\phi_{H_1}$ in a coordinate frame which rotates at the Larmor frequency [3]. The precession about $H_1$ continues as long as $H_1$ exists. The final value of $\phi_{H_1}$ then depends on the strength of $H_1$, which determines the precession rate, and the time for which it is turned on. In an embodiment, the strength and duration of $H_1$ is such that $\phi_{H_1}=90°$ such that the dipole is oriented in the $x_R y_R$-plane of FIG. 11. A rotating coordinate frame is traditionally used to explain the physics of NMR [3]. Thus, is terms of the traditional NMR coordinate designation as described by Patz [3] and Hounsfield [7] shown in FIG. 11, the $x_R$-axis and $y_R$-axis rotate about the primary field $H_0$ oriented parallel to the $z_R$-axis at the Larmor frequency relative to the stationary NMR coordinate system (x, y, z) shown in FIG. 10. Thus, the additional rotating (RF) field $H_1$ and the transverse RF magnetic field are stationary in the rotating NMR coordinate system, but rotate at the Larmor frequency in the stationary NMR coordinate system. Both the rotating and stationary coordinate systems are shown in FIG. 11. In an embodiment, the rotating $H_1$ (RF) field is along the $x_R$-axis and rotates the magnetization vector by the angle $\phi_{H_1}=90°$ to into the $x_R y_R$-plane. In terms of the reconstruction by the present invention, the system function of the field corresponding to the rotated magnetization vector is equivalent to that of the detection of the z-component of a z-oriented dipole. The y-axis is the unique axis of the NMR system shown in FIG. 8 and the stationary NMR coordinates shown in FIGS. 10 and 11. This axis corresponds to the unique axis of the Fourier Transform Reconstruction Algorithm Section, the z-axis shown in FIG. 9, and the magnetization axis is the z-axis. The magnetization axis of the NMR rotating coordinates [3,7] is the $z_R$-axis shown in FIG. 11. The measured transverse RF magnetic dipole oriented in the xy-plane is periodically parallel to the y-axis and rotates about the primary field $H_0$ oriented parallel to the z-axis at the Larmor frequency.

The RF transmitter includes saddle coils. The RF receiver is a three dimensional array, or two arrays 180° from each other, or two orthogonal pairs of arrays, wherein each member of a pair is 180° from each other. The detector ideally point samples the RF field at the Nyquist rate described in the Reconstruction Algorithm Section. In one embodiment shown in FIG. 11, each detector 20a is a coil antennae perpendicular to the y-axis and selective to the y-component of the RF secondary magnetic field arising from each voxel 14a magnetized in the z-axis direction. This two dimensional array is translated along the y-axis during a scan where readings of the secondary magnetic field are obtained as a function of the translation. In another embodiment shown in FIG. 12, the array 401 is three dimensional comprising multiple parallel two dimensional arrays 402 wherein each two dimensional array has a plurality of antennae coils 403 which detect the RF field from each magnetized voxel 404.

Figure 12:
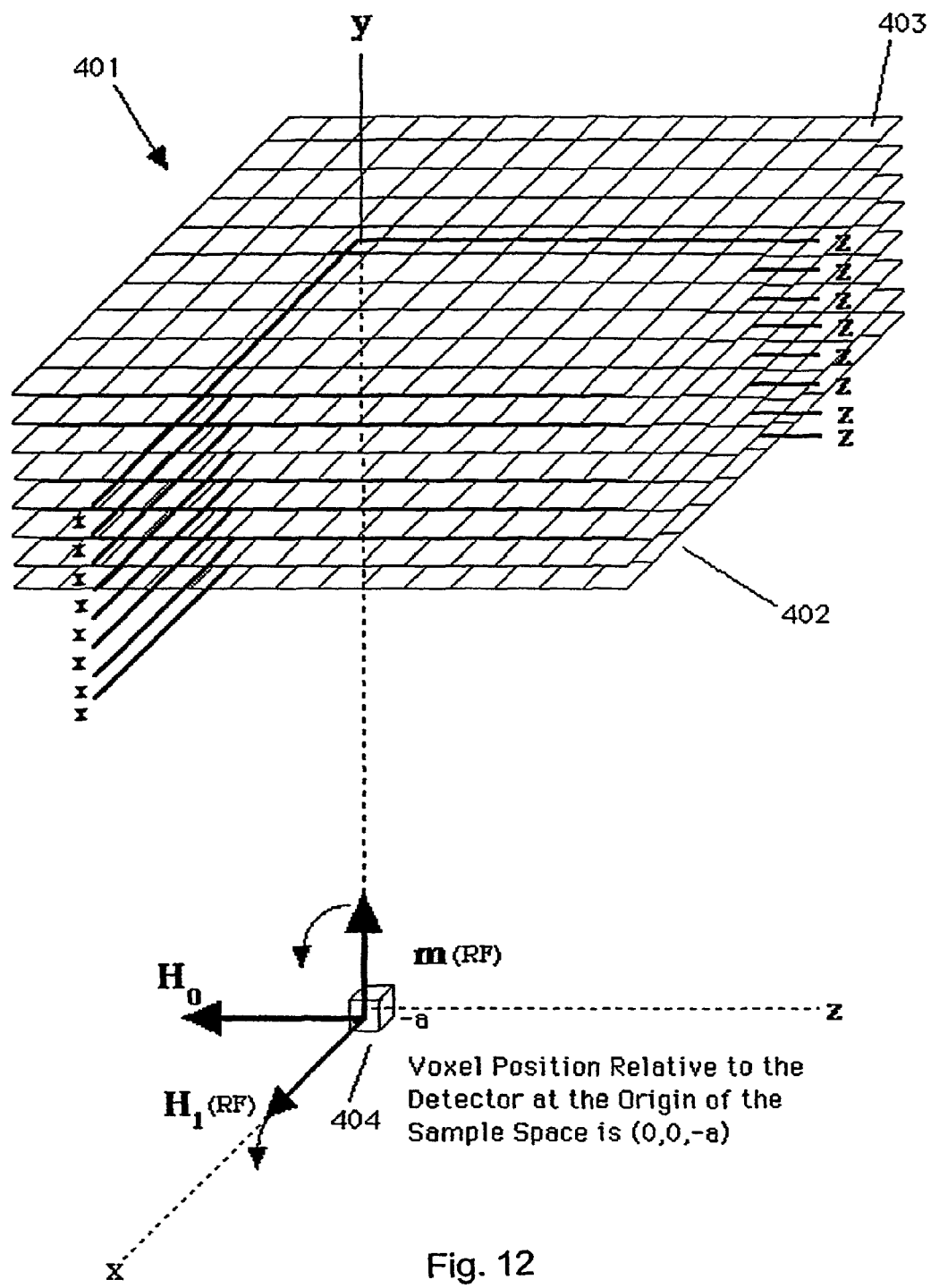
FIG. 12 is a schematic of the three dimensional detector (antennae) array with respect to the stationary NMR coordinate system of FIG. 10 which corresponds to the coordinate systems shown in FIGS. 9 and 11 in accordance with the invention.

In another embodiment, the rotating $H_1$ (RF) field shown in FIG. 11 is along the $y_R$-axis and rotates the magnetization vector by the angle $\phi_{H_1}=90°$ to project into the $x_R y_R$-plane. In terms of the reconstruction by the present invention, the system function of the field corresponding to the rotated magnetization vector is equivalent to that of the detection of the z-component of a z-oriented dipole. The x-axis is the unique axis of the NMR system shown in FIG. 8 and the stationary NMR coordinates shown in FIGS. 10 and 11. This axis corresponds to the unique axis of the Fourier Transform Reconstruction Algorithm Section, the z-axis shown in FIG. 9, and the magnetization axis is the z-axis. The magnetization axis of the NMR rotating coordinates [3,7] is the $z_R$-axis shown in FIG. 11. The detector array receives similar signals as those produced by the transmitter, and both are perpendicular to the x-axis. Each detector is a coil antennae perpendicular to the x-axis and selective to the x-component of the RF secondary magnetic field arising from voxels magnetized in the z-axis direction. This two dimensional array is translated along the x-axis during a scan where readings of the secondary magnetic field are obtained as a function of the translation. In another embodiment, the array is three dimensional comprising multiple parallel two dimensional arrays 402 as shown in FIG. 12 with the exception that the array 401 is perpendicular to the x-axis. The measured transverse RF magnetic dipole oriented in the xy-plane is periodically parallel to the x-axis and rotates about the primary field $H_0$ oriented parallel to the z-axis at the Larmor frequency.

A linear combination of the cases of rotation of the RF magnetization along the $x_R$-axis and the $y_R$-axis is within the scope of the present invention and may be adopted in a manner straightforward to those skilled in the NMR art to apply the fields and detectors described for this invention.

The method described herein may be performed on a suitable NMR examining apparatus such as that shown in simplified form in FIG. 8, and the corresponding coordinate system is shown in FIG. 10. Illustrated schematically only are coils 6, which provide $B_0$, the steady primary field 7, which provide $G_x$, the field gradient in the x-axis direction as shown, 8 which provide the $G_y$, the field gradient in the y-axis direction as shown, 9 which provide the RF field, and 10, which provide $G_z$, the field gradient in the z-axis direction as shown. The coils are driven by $B_0$, $G_x$, $G_y$, RF, and $G_z$ drive amplifiers 11, 12, 13, 14, and 15 respectively, controlled by $B_0$, $G_{xy}$, RF, and $G_z$ control circuits 16, 17, 18, and 19, respectively. These circuits can take suitable forms which will be well known to those with experience of NMR equipment and other apparatus using coil induced magnetic fields. The circuits are controlled by a central processing and control unit 20 to achieve the desired primary field, field gradients, and RF field to rotate the magnetization vector such that it is perpendicular to coil 9.

The RF coils may be two saddle shaped coils 9 which are driven in parallel to provide the rotating RF field. The FID signals sensed are received in this example by the three dimensional array of RF coils 30 and are amplified by an RF amplifier 21 before being applied to signal handling circuits 22. The three dimensional detector array 30 is shown in more detail in FIG. 12 as the three dimensional detector array 401. The circuits 22 are arranged to make any appropriate calibrations and corrections but essentially transmit the signals to the processing circuits to provide the required representation of the examined volume. These circuits can conveniently be combined with the circuits which control the primary field, field gradients, and RF field and thus are included in the circuits indicated at 20. The picture thus obtained is viewed on a display 23, such as a television monitor, and this may include inputs and other peripherals 24 for the provision of commands and instructions to the machine, or other forms of output. The display is not limited and includes any medium of conveing the image. Examples of displays, but not limited to, include printers, cathode ray tube displays, liquid crystal displays, plasma screens, three dimensional modelers, holographic displays, laser monitors, and projection monitors.

The apparatus also includes field measurement and error signal circuits 25 which receive signals via amplifiers 26 from field probes $X_1$, $X_2$, $Y_1$, and $Y_2$ shown.

The patient 27 is inserted in the tubular former of $G_x$ and $G_y$ coils 7, 8 and is supported there by a suitable couch or other supporting means. Such supports may be readily provided in any suitable form.

The coils 7, 8 are two sets of coils axially displaced, each set comprising two pairs of saddle coils the pair 7 being at 90° to the pair 8. These coils are themselves inserted into the central aperture in $B_0$ coils 6 which in an embodiment are wound in four parts connected in series to provide an approximately circular configuration which is well known to be desirable for production of a uniform field. Further details of the coil winding will not be given since suitable coils can readily be devised, by those with the appropriate skills, to provide the fields required.

The appropriate stores provide the amplitude and duration signals which are converted to analog form in digital to analog converters (DAC's) and applied to respective coil drive circuits x, y, z, RF. The respective drive circuits, which can take any form well known for driving field coils, provide the specified currents to the appropriate coil for the specified duration. The apparatus and circuits described so far may be adopted to provide different gradients and RF fields, by appropriately adjusting the stored sequences and profile data Similarly other known NMR apparatus which are capable of applying a steady magnetic field, a pulsed RF field, and $G_x$, $G_y$, and $G_z$ field gradients to a body, may be adopted in a manner straightforward to those skilled in the NMR art to apply the fields described for this invention.

Gradients may be applied in any direction to further enhance the image reconstruction or image quality by methods known to those skilled in the art. In an embodiment shown in FIG. 8, the system components which provide imaging enhancing gradients are 7, which provide $G_x$, the field gradient in the x-axis direction as shown, 8 which provide the $G_y$, the field gradient in the y-axis direction as shown, and 10, which provide $G_z$, the field gradient in the z-axis direction as shown. For example, a magnetic field gradient along an axis in the xy-plane of the z-directed primary field $H_0$ is applied to produce a phase dispersion as a function of the distance along the axis. In an embodiment, the phase due to the gradient may be linear and may be larger than the phase of any Fourier component in the absence of a gradient. During reconstruction, the phase information due to the gradient may be applied to refine the assignment of the position of each voxel with respect to the distance along the gradient axis by methods known to those skilled in the art.

With the basic signal handling system of the present invention, the FID signals from the signal sensing coils of the detector array 30 (shown in more detail in FIG. 12 as coils 403 of the three dimensional detector array 401) are amplified in an RF amplifier and applied via an analog to digital converter (ADC) to a store such as a random access memory (RAM). The data is then processed according to the procedure given in the Reconstruction Algorithm Section.

Phase Angle and Associated Set of Fourier Components

In an embodiment, the NMR signal at each detector as a function of time is processed by a method such as a Fourier transform operation to give a plurality of Fourier components each having an intensity, a phase angle, and the same frequency. The NMR signal of each voxel at any given detector gives rise to a Fourier component with a unique phase angle relative to the Fourier component of any other voxel of the phantom at that detector. The set of Fourier components that correspond to the NMR signal of a given voxel over the detectors is determined. This may be achieved by using a component with a defined standard phase relative to a first detector. Over the array of sampled points, the phase angle of components at each detector may be converted to the corresponding phase at the position of the component having the standard phase. The components that have the standard phase are associated into a set of components comprising the components from a given voxel over the sample space.

In an embodiment, the phases of the components from the voxel are determined at the other detectors using the relative position of other detectors of the sample space relative to the first detector and the standard phase of the component at the first detector. In other words, the set of associated components may also be determined by 1.) identifying a first component having a characterizable phase angle, 2.) calculating the phase angle as a function of spatial position of the other detectors relative to the first using the phase angle of the component at the first detector, and 3.) identifying the component at each detector having the calculated phase angle. These components identified from the data are associated to form the set.

In the present invention, the phase variation of the NMR signal is provided by the combination of 1.) the angle $\theta$ suspended between the direction of the detector and the radial vector, the vector from the dipole to the detector, and 2.) the angle $\phi$ due to a separation distance r between a voxel and a detector given by the wavenumber of the RF field k times r. The distance r of the detector from the voxel gives rise to the phase term $e^{-ikr}$ of the component of the detected RF signal where k is the wavenumber of the NMR signal. The harmonic oscillation of each RF dipole is equivalent to the dipole rotating in the transverse plane. The detector is responsive to a component in this plane. At a point in time, each RF dipole is directed at an angle $\theta$ relative to the direction of detection of the detector. The angle $\theta$ of the RF dipole relative to the direction of detection axis of the detector gives rise to a phase angle term $e^{-i\theta}$. In a preferred embodiment, the sum of the phase angles, kr and $\theta$, are unique for each voxel at each detector. The position of each detector relative to a different detector may be used to calculated the phase angle of the second relative to the first. This may be repeated over all of the detectors to give the set of intensities of the NMR signal over the sample space due to each voxel.

In an embodiment, the voxels that are on the same axis with a given detector or a plurality of detectors that align vertically with one or more voxels is determined. The phase angle is then only a function of the distance r of the detector from the voxel. Such components may be identified by the presence of at least one component of a phase given by $\theta + k\Delta r$ where $\phi_1$ is the phase angle of the first component and $\Delta r$ is the distance of the second detector relative to the first of the detector. This detector(s) is defined as having a zero angle $\theta$. In this case, the phase angle $\phi_2$ of a second component at a second detector aligned on the detection axis corresponding to a first component at a first detector having a phase angle $\phi_1$, is given by $$\phi_2 = \phi_1 + k\Delta r \tag{18}$$

From the components identified as coaxial with a detector, the phases of the components from the voxel are determined at the other detectors using the relative position of other detectors of the sample space relative to the first detector and $\phi_1$ of the component at the first detector.

Figure 14:
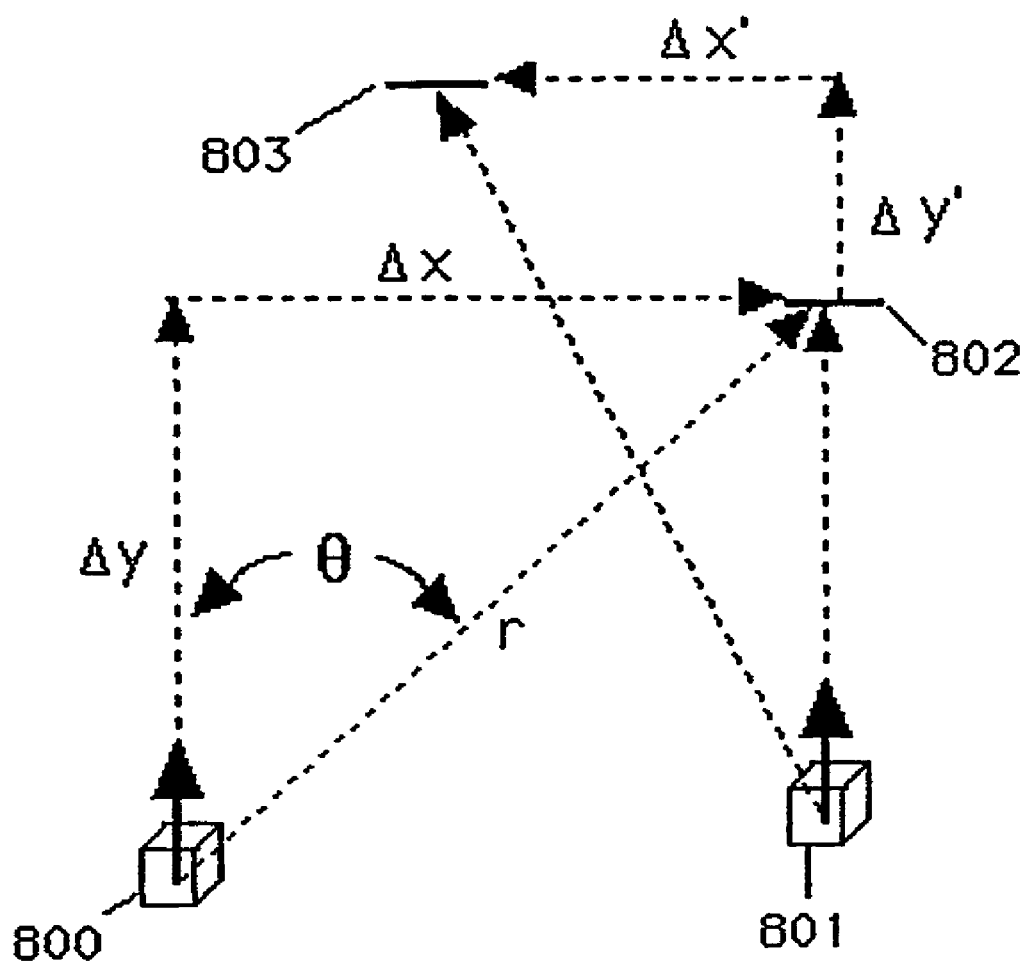
FIG. 14 shows the stationary coordinate system (x, y, z) of the NMR detector corresponding to the coordinate system of FIG. 9 and FIG. 10 of a primary field $H_0$ oriented parallel to the $z_R$-axis and the z-axis and the corresponding transverse RF magnetic dipole oriented in the $x_R y_R$-plane and periodically parallel to the y-axis wherein the spatial variation of the RF y-component of the flux due to the RF dipole is measured at a detector according to Eq. (1) and shows the distances and angles between a voxel linear to a first detector, a second nonaligned voxel, and a second detector in accordance with the invention.

FIG. 14 shows the stationary coordinate system (x, y, z) of the NMR detector corresponding to the coordinate system of FIG. 9 and FIG. 10 of a primary field $H_0$ oriented parallel to the $z_R$-axis and the z-axis and the corresponding transverse RF magnetic dipole oriented in the $x_R y_R$-plane and periodically parallel to the y-axis wherein the spatial variation of the RF y-component of the flux due to the RF dipole is measured at a detector according to Eq. (1). FIG. 14 further shows the distances and angles between a voxel 801 linear to a first detector 802, a second nonlinear voxel 800, and a second detector 803 in accordance with the invention. The NMR signal of each voxel at any given detector gives rise to a Fourier component with a unique phase angle relative to the Fourier component of any other voxel of the phantom at that detector. In the present invention, the unique phase variation of the NMR signal is provided by the combination of 1.) the angle $\theta$ suspended between the direction of the detector and the radial vector, the vector from the dipole to the detector, and 2.) the angle $\phi$ due to a separation distance r between a voxel and a detector. The phase $\phi$ due to a separation distance between a voxel and a detector of r is given by the wavenumber of the RF field k times r.

$$\phi = kr \tag{19}$$

where the wavenumber k is given by $$k = \frac{2\pi}{\lambda} \quad (20)$$

In terms of the NMR coordinates of the detector shown in FIG. 11 and FIG. 14, the phase angel $\phi$ is given by $$\phi = \frac{2\pi}{\lambda}\sqrt{(\Delta x)^2 + (\Delta y)^2 + (\Delta z)^2} \quad (21)$$

where $\Delta x$, $\Delta y$, and $\Delta z$ is the separation distance between a voxel and a detector in the x, y, and z directions, respectively. In the case that a two dimensional slice is imaged in the transverse plane, the phase angel $\phi$ is given by $$\phi = kr = \frac{2\pi}{\lambda}\sqrt{(\Delta x)^2 + (\Delta y)^2} \quad (22)$$

All voxels which have the same radial distance from a given detector will have the same phase given by Eq. (19). However, at each case that the radial distances r of two voxels to a given detector are equivalent, a unique angle $\theta$ suspended between the direction of the detector and the vector along r exists. In an embodiment, the RF dipoles of all voxels are time synchronous. The NMR pulsing and detection may be synchronized. At least one standard dipole may be used as reference phase to set the phases of the RF dipoles of the phantom. All voxels that are not collinear with the axis of a detector will posses an angle $\theta$ suspended between the direction of the detector and the radial vector, the vector from the dipole to the detector. Since the RF dipoles are time synchronous, at each point in time, this angle corresponds to a phase angle $\theta$ of the RF signal from each voxel at each detector. In the case that a two dimensional slice is imaged in the transverse plane, the phase angle $\theta$ is given by $$\theta = \sin^{-1}\frac{\Delta x}{r} = \sin^{-1}\frac{\Delta x}{\sqrt{(\Delta x)^2 + (\Delta y)^2}} = \sin^{-1}\frac{k\Delta x}{\sqrt{(k\Delta x)^2 + (k\Delta y)^2}} \quad (23)$$

The total phase angle $\phi_T$ of the RF signal from each voxel at each detector is given as the sum of $\phi$ and $\theta$.

$$\phi_T = \phi + \theta \quad (24)$$

The uniqueness of the phase angle a Fourier component of the NMR signal of each voxel at any given detector relative to a Fourier component of any other voxel of the phantom at that detector is demonstrated by the following cases according to the coordinates shown in FIG. 14:

Case 1 $\Delta x = 0.1$ cm  $\qquad \Delta y = 0.1$ cm $$\theta = \sin^{-1}\frac{0.1}{\sqrt{(0.1)^2 + (0.1)^2}} \qquad \phi = \frac{2\pi}{\lambda}\sqrt{(0.1)^2 + (0.1)^2}$$

$\theta = 0.78$ rad  $\qquad \phi = 5.9 \times 10^{-4}$ rad $\phi_T = \theta + \phi = 0.78 + 5.9 \times 10^{-4}$ rad $= 0.7806$ rad Case 2 $\Delta x = 0.1$ cm  $\qquad \Delta y = 20$ cm $$\theta = \sin^{-1}\frac{0.1}{\sqrt{(0.1)^2 + (20)^2}} \qquad \phi = \frac{2\pi}{\lambda}\sqrt{(0.1)^2 + (20)^2}$$

$\theta = 5 \times 10^{-3}$ rad  $\qquad \phi = 8.37 \times 10^{-2}$ rad $\phi_T = \theta + \phi = 5 \times 10^{-3} + 8.377 \times 10^{-2}$ rad $= 8.88 \times 10^{-2}$ rad Case 3 $\Delta x = 20$ cm  $\qquad \Delta y = 0.1$ cm $$\theta = \sin^{-1}\frac{20}{\sqrt{(20)^2 + (0.1)^2}} \qquad \phi = \frac{2\pi}{\lambda}\sqrt{(20)^2 + (0.1)^2}$$

$\theta = 1.56$ rad  $\qquad \phi = 8.37 \times 10^{-2}$ rad $\phi_T = \theta + \phi = 1.56 + 8.377 \times 10^{-2}$ rad $= 1.643$ rad Case 4 $\Delta x = 20$ cm  $\qquad \Delta y = 20$ cm $$\theta = \sin^{-1}\frac{20}{\sqrt{(20)^2 + (20)^2}} \qquad \phi = \frac{2\pi}{\lambda}\sqrt{(20)^2 + (20)^2}$$

$\theta = 0.785$ rad  $\qquad \phi = 0.1184$ rad $\phi_T = \theta + \phi = 0.785 + 0.1184$ rad $= 0.9034$ rad The condition for uniqueness of the phase $\phi_T$ of each voxel at a given detector depends on the unique sum given by Eq. (24). Since all voxels which have the same radial distance from a given detector will have the same phase $\phi$ given by Eq. (19), but a unique angle $\theta$, each voxel will have a unique phase $\phi_T$ when the following condition is satisfied: $\theta_{max}$, the maximum angle $\theta$, is greater than $\phi_{max}$, the maximum angle $\phi$, for any r.

$$\theta_{max} > \phi_{max} \quad (25)$$

$\theta_{max}$ corresponds to $x_{min}$ and $y_{min}$, the minimum separation of the voxel and the detector in the x and y directions, respectively, and is given by Eq. (23).

$$\theta_{max} = \sin^{-1} \frac{x_{min}}{\sqrt{(x_{min})^2 + (y_{min})^2}} \quad (26)$$

$\phi_{max}$ corresponds to $x_{min}$, the minimum separation of the voxel and the detector in the x direction and $y_{max}$, the maximum separation of the voxel and the detector in the y direction, and is given by Eq. (22).

$$\phi_{max} = \frac{2\pi}{\lambda} \sqrt{(x_{min})^2 + (y_{max})^2} \quad (27)$$

Substitution of Eq. (26) and Eq. (27) into Eq. (25) gives the condition for uniqueness of the phase angle $\phi_T$.

$$\sin^{-1} \frac{x_{min}}{\sqrt{(x_{min})^2 + (y_{min})^2}} > \frac{2\pi}{\lambda} \sqrt{(x_{min})^2 + (y_{max})^2} \quad (28)$$

$$\frac{x_{min}}{\sqrt{(x_{min})^2 + (y_{min})^2}} > \sin\left(\frac{2\pi}{\lambda} \sqrt{(x_{min})^2 + (y_{max})^2}\right) \quad (29)$$

For $y_{max} \gg x_{min}$, Eq. (29) gives $$\frac{x_{min}}{\sqrt{(x_{min})^2 + (y_{min})^2}} > \frac{2\pi}{\lambda} y_{max} \quad (30)$$

For $x_{min} = y_{min}$, Eq.(30) gives $$\lambda > 2\pi \sqrt{2} y_{max} \quad (31)$$

$$\lambda > 8.9 y_{max} \quad (32)$$

In terms of frequency f, Eq. (32) gives $$f < \frac{c}{8.9 y_{max}} \quad (33)$$

where c is the speed of light. For $y_{max}$=20 cm, the condition for uniqueness of the phase angle $\phi_T$ is f=<168 MHz.

Consider a component of a voxel at a first detector with a phase $\phi_1$ defined as a standard phase. The corresponding phases of the components from the same voxel are determined at other detectors using the relative position of the other detectors of the sample space relative to first detector. In the case that a voxel is collinear with the first detector, the phase angle $\theta$=0. The phase angle $\phi_2$ of the corresponding component at a second collinear detector can be calculated from the phase angle $\phi_1$ of a fist using the detector separation along the collinear axis. In the case that a two dimensional slice is imaged and the second detector is displaced $\Delta y^1$ in the y direction of the sample space relative to the first detector with a phase angle $\phi_1$, the angle $\phi_2$ is given by $$\phi_2 = \sqrt{(k\Delta y')^2 + (k\Delta y)^2} = \sqrt{(k\Delta y')^2 + \phi_1^2} \quad (34)$$

Consider the phase angle $\phi_{T2}$ of a corresponding component at a second detector that is nonlinear with the first detector. The phase angle $\phi_{T2}$ of the second component due to the same voxel may be calculated from $\phi_1$. In this case a contribution exists from 1.) the angle $\theta$ suspended between the direction of the detector and the radial vector, the vector from the dipole to the detector, and 2.) the angle $\phi_2$ due to a separation distance r between a voxel and a detector given by the wavenumber of the RF field k times r. In the case that a two dimensional slice is imaged and the second detector is displaced $\Delta x^1$ and $\Delta y^1$ in the x and y directions of the sample space, respectively, relative to the first detector with a phase angle $\phi_1$, the phase $\theta$ is given by $$\theta = \sin^{-1} \frac{\Delta x'}{r'} = \sin^{-1} \frac{\Delta x'}{\sqrt{(\Delta x')^2 + (\Delta y')^2}}$$

$$= \sin^{-1} \frac{k\Delta x'}{\sqrt{(k\Delta x')^2 + (k\Delta y')^2}}$$

$$= \sin^{-1} \frac{k\Delta x'}{\sqrt{(k\Delta x')^2 + (k\Delta y')^2 + \phi_1^2}} \quad (35)$$

The angle $\phi_2$ is given by $$\phi_2 = \sqrt{(k\Delta x')^2 + (k\Delta y')^2 + (k\Delta y)^2} = \sqrt{(k\Delta x')^2 + (k\Delta y')^2 + \phi_1^2} \quad (36)$$

The phase angle $\phi_{T2}$ of the second component due to the same voxel is given by the sum of Eq. (35) and Eq. (36).

$$\phi_{T2} = \theta + \phi_2 = \sin^{-1} \frac{k\Delta x'}{\sqrt{(k\Delta x')^2 + (k\Delta y')^2 + \phi_1^2}} + \sqrt{(k\Delta x')^2 + (k\Delta y')^2 + \phi_1^2} \quad (37)$$

The component at the second detector which has phase angle $\phi_{T2}$ is associated with the component $\phi_1$ from which $\phi_{T2}$ was calculated. All phase angles $\phi_{T2}$ at all other detectors are determined from each standard phase angle $\phi_1$. This is repeated for all using those detectors which are determined to are collinear with a voxel to give the sets of components each comprising the spatial variation of the RF field over the sample space due to each voxel.

Reconstruction Algorithm

When a static magnetic field $H_0$ with lines in the direction of the z-axis is applied to an object comprising a material containing nuclei such as protons that possess magnetic moments, the field magnetizes the material. As a result a secondary field superposes the applied field as shown in FIG. 9. In the applied magnetic field, the magnetic moments of each nuclei precesses about the applied magnetic field. However, the magnetization of any one nucleus is not observed from the macroscopic sample. Rather the vector sum of the dipole moments from all magnetic nuclei in the sample is observed. This bulk magnetization is denoted by the vector M. In thermal equilibrium with the primary field $H_0$, the bulk magnetization M is parallel to $H_0$. The volume to be imaged is divided into volume elements called voxels, and the magnetized voxel 302 shown in FIG. 9 with bulk magnetization M is modeled as a magnetic dipole m. Consider the case wherein data comprising the z-component of the magnetic field of a dipole oriented in the z-direction is acquired by detectors 301 in the three dimensional sample space comprising the xy-plane and the positive z-axis as shown in FIG. 9. The magnetic moment, $m_z$, of each voxel within the phantom is a magnetic dipole. And, the phantom can be considered to be a three-dimensional array of magnetic dipoles. At any point extrinsic to the phantom, the z-component of the secondary flux, B', from any single voxel is $$B' = m_z \frac{2z^2 - x^2 - y^2}{(x^2 + y^2 + z^2)^{5/2}} \tag{38}$$

where x, y, and z are the distances from the center of the voxel to the sampling point. It is shown in APPENDICES I-IV that no geometric distribution of magnetic dipoles can give rise to Eq. (1). Therefore, the flux of each magnetic dipole (voxel contribution) serves as a basis element to form a unique reconstruction of the array of dipoles which comprise the bulk magnetization map or NMR image of the phantom.

Eq. (1) is a system function which gives the magnetic flux output in response to a magnetic dipole input at the origin. The phantom is an array of spatially advanced and delayed dipoles weighted according to the bulk magnetization of each voxel; this is the input function. The secondary flux is the superposition of spatially advanced and delayed flux, according to Eq. (1); this is the output function. Thus, the response of space to a magnetized phantom is given by the convolution of Eq. (1) with the series of weighted, spatially advanced and delayed dipoles representing the bulk magnetization map of the phantom. The discrete signals are recorded by a detector array over the sample space comprising the xy-plane and the positive z-axis.

In an embodiment of the present invention, the magnetization vector is rotated into the transverse plane by an additional RF field $H_1$. The magnetization vector then comprises a rotating magnetic dipole m in the transverse plane. The NMR image may be reconstructed by sampling the external field from a series of RF dipoles rather than that from a series of static dipoles. In this case, the geometric system function is given also given by Eq. (1), the function of the z-component of the flux B' from a z-oriented dipole at any point extrinsic to the image space, from any single voxel. The geometric system function corresponding to a dipole which determines the spatial intensity variations of the RF field is a band-pass for $k_\rho = k_z$ as shown in APPENDIX V. In the limit, each volume element is reconstructed independently in parallel with all other volume elements such that the scan time is no greater than the nuclear free induction decay (FID) time.

In an embodiment, the strength and duration of the rotating $H_1$ (RF) field that is resonant with the protons of the magnetized volume and is oriented perpendicularly to the direction of the magnetizing field is applied such that the final precession angle of the magnetization is 90° ($\phi_{H_1}=90°$) such that the RF dipole is transverse to the static magnetizing field and perpendicular to the RF magnetic field detector 20a as shown in FIG. 11. The rotating NMR coordinates and the stationary NMR coordinates are both shown in FIG. 11. According to Eq. (1), the signal as a function of time which is Fourier transformed arises from each transverse RF magnetic dipole oriented in the $x_R y_R$-plane (rotating NMR coordinates) which is periodically parallel to the y-axis and rotates about the primary field $H_0$ oriented parallel to the z-axis at the Larmor frequency (stationary NMR coordinates). For the stationary NMR case, the y-axis corresponds to the z-axis of Eq. (1), and $m_z$, the magnetic moment along the z-axis, of Eq. (1) corresponds to the bulk magnetization M of each voxel.

In addition, each Fourier component comprises an additional part that corresponds to an RF magnetic dipole which is periodically parallel to the x-axis. This part also rotates about the primary field $H_0$ oriented parallel to the z-axis at the Larmor frequency wherein the x-axis of the stationary NMR coordinates corresponds to the x-axis of Eq. (1). The parts rotate at the same frequency but are orthogonal. The orthogonality corresponds to a phase angle of the Fourier transform of 90°; thus, each Fourier component contains a real and an imaginary part. The magnitude of the amplitude of the signal due to the dipole oriented parallel to the y-axis (z-axis of Eq. (1)) exceeds that of the dipole oriented parallel to the x-axis (x-axis of Eq. (1)) which identifies this part of a Fourier component. In an embodiment, the spatial variation over the detector array of the part of the Fourier component with the maximum amplitude (the signal due to the dipole oriented parallel to the y-axis) is used to determine the coordinate location of each voxel using the geometric system function of the detection of the z-component of a z-oriented dipole (Eq. (1)) as given in the Reconstruction Algorithm Section.

In another embodiment, the spatial variation over the detector array of the lesser magnitude orthogonal part of each Fourier component is used to determine the coordinate location of each voxel using the corresponding geometric system function as described in the Reconstruction Algorithm Section. The system function for the case of the minor orthogonal part in terms of the coordinates given in FIG. 9, corresponds to the detection of the x-component of a z-oriented dipole. The geometric system function is given by the function of the x-component of the flux B' from a z-oriented dipole at any point extrinsic to the image space, from any single voxel:

$$B' = m_z \frac{3xz}{(x^2 + y^2 + z^2)^{5/2}} \quad (39)$$

where x, y, and z are the distances from the center of the voxel to the sampling point and $m_z$ is the magnetic moment along the z-axis corresponding to the bulk magnetization M of each voxel.

In the reconstruction process described herein, the secondary field may be in the same or in a transverse orientation relative to the primary field. In each case, the orientation of the secondary dipole field and the measured secondary dipole field component are according to Eq. (1). The relationship of the coordinate systems of the present invention are shown in FIGS. 9, 10, and 11. The primary and secondary fields are parallel and stationary in FIG. 9 versus transverse in the rotating and stationary NMR coordinates shown in FIGS. 10, 11, and 12. The relationship of the coordinate system of the reconstruction method of the NMR system used herein to that of the coordinate system of Eq. (1) shown in FIG. 9 is according to FIG. 11. The magnetization axis of Eq (1) is the z-axis; whereas, the magnetization axis of the stationary NMR coordinates is the z-axis shown in FIG. 10, and the magnetization axis of the NMR rotating coordinates [3,7] is the $z_R$-axis shown in FIG. 11. Regarding Eq. (1) and the reconstruction algorithm in the NMR case, the z-component of Eq. (1) is substituted with the stationary NMR y-component, the y-component is substituted with the stationary NMR z-component, and the x-component is substituted with the stationary NMR x-component.

The reconstruction algorithm can be a reiterative, a matrix inversion, or a Fourier Transform algorithm. For all reconstruction algorithms, the volume to be imaged is divided into volume elements called voxels, and the magnetized voxel with magnetic moment $m_z$ is modeled as a magnetic dipole. In an embodiment, the matrix of Fourier components that correspond to the NMR signal of a given voxel over the detectors is determined. The matrices are determined for all of the voxels. The measurements of the spatial variations of the transverse RF field of a given matrix is used to determine the coordinate location of each voxel. Thus, each matrix of components associated by phase comprises the intensity variation over the sample space of the RF field of the bulk magnetization M of each voxel. The matrices are the input for the reconstruction algorithm, This procedure is performed either in parallel or series for each matrix. The bulk magnetization map (NMR image) is the superposition of the independent images, each of which corresponds to a given voxel. The superposition of images is plotted and displayed.

An embodiment of a matrix inversion reconstruction algorithm comprises the steps of 1.) using the geometric system function to determine the spatial intensity variation of the transverse RF field over the detector array, 2.) inverting the corresponding matrix, and 3.) multiplying the signal over the detector array by the inverted matrix to give the voxel sources. For example, a matrix inversion reconstruction algorithm is to determine a coefficient for each voxel mathematically (Eq. (41)) or by calibration which when multiplied by the bulk magnetization M of each voxel is that voxel's contribution to the signal at a given detector with the corresponding unique phase at each detector. This is repeated for every detector, and those coefficients are used to determine a matrix which, when multiplied by a column vector of the bulk magnetization M values of the voxels, gives the voltage signals at the detectors. This matrix is inverted and stored in memory. Voltages as a function of time are recorded over the detector array. The signal as a function of time is Fourier transformed to give the Fourier components each having an amplitude and a unique phase. In an embodiment, of a matrix inversion reconstruction algorithm, the components are multiplied by the inverse matrix, to generate the bulk magnetization M map.

In another embodiment of a matrix inversion reconstruction algorithm, the matrix of Fourier components that correspond to the NMR signal of a given voxel over the detectors is determined. The matrices are determined for all of the voxels. The measurements of the spatial variations of the transverse RF field of a given matrix is used to determine the coordinate location of each voxel. Thus, each matrix of components associated by phase comprises the intensity variation over the sample space of the RF field of the bulk magnetization M of each voxel. Each matrix of components are multiplied by the inverse matrix, to generate the bulk magnetization M map. In one embodiment, the point spread of the reconstructed voxel is corrected by assigning one voxel above a certain threshold with the bulk magnetization M. The other voxels are assigned a zero value. This procedure may be repeated for all voxels. In the limit with sufficient phase resolution, each volume element is reconstructed independently in parallel with all other volume elements such that the scan time is no greater than the nuclear free induction decay (FID) time. The total bulk magnetization map (NMR image) is the superposition of the separate maps for each magnetic moment which is plotted and displayed.

In an embodiment of a reiterative reconstruction algorithm, the geometric system functions is used to determine the system of linear equations which gives the intensity, spatial variation, and phase of the RF field over the sample space. The signal as a function of time is Fourier transformed to give the Fourier components each having an amplitude and a unique phase. The system of linear equations gives the voltage and phase from each voxel at each sensor based on the bulk magnetization M value of each voxel and the position of the voxel relative to the sensor. In an embodiment, weighting coefficients are determined based on these equations. The coefficients may be determined mathematically (Eq. (41)). alternatively, they may be determined by calibration. The bulk magnetization M for each voxel is estimated, and the signals at each detector are calculated at each phase. In an embodiment, the bulk magnetization M value of each voxel times its weighting coefficient and its calculated phase at a given detector is compared to the measured voltage and phase. A correction is made to M of each voxel. This gives rise to a second, or recomputed, estimate for M of each voxel. The signal value from this second estimate is computed and corrections are made as previously described. This is repeated until the correction for each reiteration approaches a predefined limit which serves to indicate that the reconstruction is within reasonable limits of error. This procedure is repeated for all sensors. The final bulk magnetization map is plotted and displayed.

Figure 13:
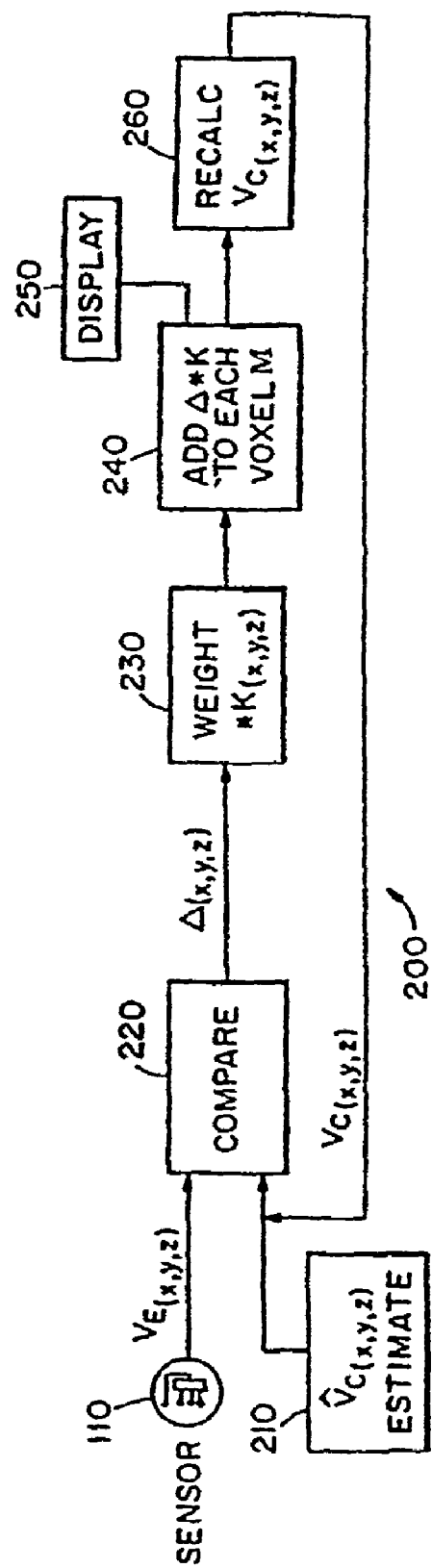
FIG. 13 shows the general process of reconstruction by reiteration.

The general process of reconstruction by reiteration is shown according to the steps of FIG. 13 (and is implemented in processor 20 in FIG. 8). The image displayed according to the process 200 is merely a mapping of the bulk magnetization M of voxel sections of the object examined. The signal as a function of time is Fourier transformed to give the Fourier components each having an amplitude and a unique phase. The bulk magnetization M at a given location determines the intensity and spatial variation of the RF field over the sample space. Accordingly, signals produced by the RF magnetic sensors 110, in terms of volts as a function of phase, are a direct result of the bulk magnetization M of the voxel elements. Therefore, a reference voltage is generated at 210 from which the actual or measured sensor voltage at a given phase is subtracted at 220. The reference voltages are modeled by assuming a voltage with a unique phase from each voxel at each sensor. Therefore, the voltage and phase from each voxel is determined at a sensor according to a weighting based on the position of the voxel relative to the sensor. The weighting may be given by Eq. (1) in terms of the coordinates x, y, z of FIG. 9. The phase may be determined as given in the Phase Angle and Associated Set of Fourier Components Section. The resulting modeled or calculated voltage signals are compared at step 220, providing a difference or $\Delta(x,y,z)$ signal, weighted at step 230 to produce a weighted difference signal, which is then added to the previously estimated bulk magnetization M value for each voxel element at step 240. The resulting level, available in three dimensions corresponding to the axes x, y, and z, is selectively displayed on the display at step 250. Having adjusted the estimated bulk magnetization M for each voxel, the calculated bulk magnetization M is recalculated at step 260, the resulting estimated sensor voltage at each phase is then compared to the actual sensor voltage at each phase at step 220, the process 200 being repeated until the difference is reduced to a tolerable value. This procedure is repeated for all sensors. The final bulk magnetization map is plotted and displayed.

In terms of the coordinates of Eq. (1) and FIG. 9, the reconstruction algorithm using Fourier Transforms (FFT) involves exploiting the FFT to solve Eq. (41) given below. For the case that follows, data is acquired in the x, y, and z-directions, but in general, data is acquired over the dimensions which uniquely determine the bulk magnetization map (NMR image). Also, the present analysis is for measuring the z-component of the magnetic field of a dipole oriented in the z-direction; however, the analysis applies to the other two orthogonal components where the geometric system function for the z-component of the z-oriented dipole is replaced by the geometric system function for the x or y-components of the magnetic field produced by the dipole where the geometric system function is defined below as the impulse response of the detector to the given component of the field of a dipole of given orientation. The sample space, or space over which the secondary RF field is measured, is defined in the present example as the three-dimensional space comprising the entire xy-plane and the positive z-axis, as shown in FIG. 9. Other sample spaces are valid and each requires special consideration during the reconstruction as described below. The discrete voltages recorded from an infinite detector array in the xy-plane which is translated to infinity along the z-axis starting from the origin where the detector array is responsive to the z-component of the secondary magnetic field is given by Eq. (1), where the voltage at any point in space produced by dipoles advanced in the z-direction and advanced or delayed in the x and y-directions relative to the origin is given by the following Eq. (40), where the voltage response is $C_0$ times the secondary magnetic flux strength in the case shown in FIG. 9.

In a preferred embodiment, the data comprises the RF field in the transverse plane over the sample space shown in FIG. 11. The relationship of the coordinate designations of Eq. (1) and FIG. 9 versus the NMR system and the relationship between the magnetic moment of a static secondary field and the bulk magnetization M of the RF field is given in the Reconstruction Algorithm Section and in the Fourier Transform Reconstruction Algorithm which follows.

Fourier Transform Reconstruction Algorithm

In terms of the coordinates of Eq. (1) and FIG. 9, the volume to be imaged is divided into volume elements called voxels and the magnetized voxel is modeled as a magnetic dipole $m_z$. Data comprising the z-component of the magnetic field of a dipole oriented in the z-direction is acquired in the three dimensional sample space comprising the xy-plane and the positive z-axis.

The phantom can be considered to be a three-dimensional array of magnetic dipoles. At any point extrinsic to the phantom, the z-component of the secondary flux, B', from any single voxel is $$B' = m_z \frac{2z^2 - x^2 - y^2}{(x^2 + y^2 + z^2)^{5/2}} \quad (40)$$

where x, y, and z are the distances from the center of the voxel to the sampling point. It is shown in APPENDICES I-IV that no geometric distribution of magnetic dipoles can give rise to Eq. (1). Therefore, the flux of each magnetic dipole (voxel contribution) forms a basis set for the flux of the array of dipoles which comprise the bulk magnetization map of the phantom.

Eq. (1) is a system function which gives the magnetic flux output in response to a magnetic dipole input at the origin. The phantom is an array of spatially advanced and delayed dipoles weighted according to the bulk magnetization of each voxel; this is the input function. The secondary flux is the superposition of spatially advanced and delayed flux, according to Eq. (1); this is the output function. Thus, the response of space to a magnetized phantom is given by the convolution of Eq. (1) with the series of weighted, spatially advanced and delayed dipoles representing the bulk magnetization map of the phantom. The discrete voltages recorded by a detector array over the sample space comprising the xy-plane and the positive z-axis are $$V[x, y, z] = C_o \sum_{n_3=0}^{+l_3/k} \sum_{n_2=-l_2/2k}^{+l_2/2k} \sum_{n_1=-l_1/2k}^{+l_1/2k} \chi_{n_1,n_2,n_3} \frac{[2[z+n_3k_3]^2 - [y-n_2k_2]^2 - [x-n_1k_1]^2]}{[[x-n_1k_1]^2 + [y-n_2k_2]^2 + [z+n_3k_3]^2]^{5/2}} \quad (41)$$

where the flux magnetizing each voxel is unity, the volume element is made unity, and the voltage response of each detector is $C_0$ times the secondary magnetic flux strength. The variables of Eq. (40) are defined as follows:

$\chi_{n_1,n_2,n_3}$ the bulk magnetization of the voxel located at the position defined by the Dirac delta function, $\delta(x-n_1k_1, y-n_2k_2, z-n_3k_3)$ $k_1$, $k_2$, $k_3$ dipole spacing in the x, y, and z-directions, respectively the dimensions of the image space, the total distance in the x, y, and z-directions, respectively, for which the bulk magnetization of the voxels is nonzero the detector spacing in the x, y, and z-directions, respectively The voltage signals recorded at the detector array over the sample space is $$V[m_1, m_2, m_3] = \sum_{m_3=0}^{\infty} \sum_{m_2=-\infty}^{\infty} \sum_{m_1=-\infty}^{\infty} C_o \delta[x - m_1s_1, y - m_2s_2, z - m_3s_3] \\ \left[ \sum_{n_3=0}^{+l_3/k} \sum_{n_2=-l_2/2k}^{+l_2/2k} \sum_{n_1=-l_1/2k}^{+l_1/2k} \frac{[2z^2 - x^2 - y^2]}{[x^2+y^2+z^2]^{5/2}} \otimes \chi_{n_1,n_2,n_3} \delta[x - n_1k_1, y - n_2k_2, z - n_3k_3] \right] \quad (42)$$

Eq. (41) can be represented symbolically as follows $$s = C_0[g \times [hf] \times u(z)] \quad (43)$$

where $C_0$ is the proportionality constant between the signal voltage and the output flux strength, s is the discrete function of voltage signals recorded of the secondary flux over the sample space, g is the secondary magnetic flux sampling function given as follows:

$$g = \sum_{m_3=0}^{\infty} \sum_{m_2=-\infty}^{\infty} \sum_{m_1=-\infty}^{\infty} \delta[x - m_1s_1, y - m_2s_2, z - m_3s_3] \quad (44)$$

In Eq. (42), h is the system function which is also defined as the geometric system function given as follows:

$$\frac{2z^2 - x^2 - y^2}{(x^2+y^2+z^2)^{5/2}} \quad (45)$$

The system function is the impulse response of the detector array where the external magnetizing flux is set equal to unity. In Eq. (42), $f$ is the bulk magnetization function or NMR image function given as $$f = \sum_{n_3=0}^{+l_3/k} \sum_{n_2=-l_2/2k}^{+l_2/2k} \sum_{n_1=-l_1/2k}^{+l_1/2k} \chi_{n_1,n_2,n_3} \delta[x-n_1k_1, y-n_2k_2, z-n_3k_3] \quad (46)$$

In Eq. (42), u(z) is the unitary z function which is one for positive z and zero otherwise. The function g discretizes the continuous voltage function V given by Eq. (40) which is the function h convolved with the function $f$ then multiplied by the function u(z). The discrete voltages recorded over the sample space are used in a Fourier transform algorithm derived herein to reconstruct the NMR image. Consider the function s of Eq. (41) which is given as follows:

$$s = (hf) \times u(z) \quad (47)$$

Eq. (46) is equivalent to the function h convolved with the function $f$ then multiplied by the function u(z). The function S which is the Fourier transform of s is given as follows:

$$S = (H \times F)U(k_z) \quad (48)$$

The function S is equivalent to the resultant function of the function H, the Fourier transform of the system function—h, multiplied by the function F, the Fourier transform of the bulk magnetization function—$f$, convolved with the function U($k_z$), the Fourier tansform of the unitary z function—u(z). The Fourier transform of the bulk magnetization function—$f$ (Eq. (45))

$$f = \sum_{n_3=0}^{+l_3/k} \sum_{n_2=-l_2/2k}^{+l_2/2k} \sum_{n_1=-l_1/2k}^{+l_1/2k} \chi_{n_1,n_2,n_3} \delta[x-n_1k_1, y-n_2k_2, z-n_3k_3] \quad (49)$$

is $$F = \sum_{z_n=0}^{-l_3} \sum_{y_n=-l_2/2k}^{+l_2/2k} \sum_{x_n=-l_1/2k}^{+l_1/2k} \chi_{n_1,n_2,n_3} e^{-j[k_x x_n + k_y y_n + k_z z_n]} \quad (50)$$

where $x_n = n_1k_1$; $y_n = n_2k_2$; $z_n = -n_3k_3$. The Fourier transform of u(z)=1 for $z \geq 0$ and u(z)=1 for z<0 is [8]

$$U(k_z) = \frac{1}{2}\delta(k_z) + \frac{1}{jk_z} \quad (51)$$

The Fourier transform of the system function (See APPENDIX V)

$$h = \frac{2z^2 - x^2 - y^2}{(x^2 + y^2 + z^2)^{5/2}} = \frac{2z^2 - \rho^2}{(\rho^2 + z^2)^{5/2}} \quad (52)$$

is $$H[k_\rho, k_z] = \frac{4\pi k_\rho^2}{k_\rho^2 + k_z^2} \quad (53)$$

$$H[k_x, k_y, k_z] = \frac{4\pi[k_x^2 + k_y^2]}{k_x^2 + k_y^2 + k_z^2} \quad (54)$$

where $$\begin{aligned} k_x &= 2\pi f_x = 2\pi \frac{1}{x} \\ k_y &= 2\pi f_y = 2\pi \frac{1}{y} \\ k_z &= 2\pi f_z = 2\pi \frac{1}{z} \end{aligned} \quad (55)$$

The resultant function of the product of the functions H (Eq. (52)) and F (Eq. (49)) then convolved with the function $U(k_z)$ (Eq. (50)) is $$S = HF \otimes U[k_z] \quad (56)$$

$$= \frac{2\pi k_\rho^2}{k_\rho^2 + k_z^2} \sum_{z_n=0}^{-l_3} \sum_{y_n=-l_2/2}^{+l_2/2} \sum_{x_n=-l_1/2}^{+l_1/2} \chi_{n_1,n_2,n_3} e^{-j[k_x x_n + k_y y_n + k_z z_n]} +$$

$$\frac{1}{jk_z} \otimes \frac{4\pi k_\rho^2}{k_\rho^2 + k_z^2} \sum_{z_n=0}^{-l_3} \sum_{y_n=-l_2/2}^{+l_2/2} \sum_{x_n=-l_1/2}^{+l_1/2} \chi_{n_1,n_2,n_3} e^{-j[k_x x_n + k_y y_n + k_z z_n]}$$

The result is given as follows, and the derivation appears in APPENDIX VI.

$$S = \frac{1}{2}HF + \sum_{z_n=0}^{-l_3} \sum_{y_n=-l_2/2}^{+l_2/2} \sum_{x_n=-l_1/2}^{+l_1/2} \chi_{n_1,n_2,n_3} e^{-j[k_x x_n + k_y y_n + k_z z_n]} \left[\frac{-2\pi k_\rho^2}{k_\rho^2 + k_z^2}\right] + \quad (57)$$

$$\sum_{z_n=0}^{-l_3} \sum_{y_n=-l_2/2}^{+l_2/2} \sum_{x_n=-l_1/2}^{+l_1/2} \chi_{n_1,n_2,n_3} e^{-j[k_x x_n + k_y y_n + k_z z_n]}$$

$$\left\{\frac{\pi k_\rho^2}{2[k_\rho^2 + jk_\rho k_z]} e^{-k_\rho |z_n|} + \frac{\pi k_\rho^2}{2[k_\rho^2 - jk_\rho k_z]} e^{+k_\rho |z_n|}\right\}$$

Substitution of the Fourier transform of the system function, H (Eq. (52)), the Fourier transform of the bulk magnetization function, F (Eq. (49)), and factoring out $k_\rho^2$ in the second term gives $$S = \left[\frac{-2\pi k_\rho^2}{k_\rho^2 + k_z^2} - \frac{2\pi k_\rho^2}{k_\rho^2 + k_z^2}\right] \sum_{z_n=0}^{-l_3} \sum_{y_n=-l_2/2}^{+l_2/2} \sum_{x_n=-l_1/2}^{+l_1/2} \chi_{n_1,n_2,n_3} e^{-j[k_x x_n + k_y y_n + k_z z_n]} + \quad (58)$$

$$\sum_{z_n=0}^{-l_3} \sum_{y_n=-l_2/2}^{+l_2/2} \sum_{x_n=-l_1/2}^{+l_1/2} \chi_{n_1,n_2,n_3} e^{-j[k_x x_n + k_y y_n + k_z z_n]}$$

$$\left\{\frac{\pi}{2\left[1 + j\frac{k_z}{k_\rho}\right]} e^{-k_\rho |z_n|} + \frac{\pi}{2\left[1 - j\frac{k_z}{k_\rho}\right]} e^{+k_\rho |z_n|}\right\}$$

Multiplication by the complex conjugates gives $$S = \frac{\pi}{2}\sum_{z_n=0}^{-l_3}\sum_{y_n=-l_2/2}^{+l_2/2}\sum_{x_n=-l_1/2k}^{+l_1/2}\chi_{n_1,n_2,n_3}e^{-j[k_x x_n+k_y y_n+k_z z_n]} \quad (59)$$

$$\left\{\frac{1}{\left[1+j\frac{k_z}{k_\rho}\right]}\frac{\left[1-j\frac{k_z}{k_\rho}\right]}{\left[1-j\frac{k_z}{k_\rho}\right]}e^{-k_\rho|z_n|} + \frac{1}{\left[1-j\frac{k_z}{k_\rho}\right]}\frac{\left[1+j\frac{k_z}{k_\rho}\right]}{\left[1+j\frac{k_z}{k_\rho}\right]}e^{+k_\rho|z_n|}\right\}$$

Factoring out the common terms gives $$S = \frac{\pi k_\rho^2}{2(k_\rho^2+k_z^2)} \quad (60)$$

$$\sum_{z_n=0}^{-l_3}\sum_{y_n=-l_2/2}^{+l_2/2}\sum_{x_n=-l_1/2}^{+l_1/2}\chi_{n_1,n_2,n_3}e^{-j[k_x x_n+k_y y_n+k_z z_n]}\left[\left[1+j\frac{k_z}{k_\rho}\right]e^{+k_\rho|z_n|}+\left[1-j\frac{k_z}{k_\rho}\right]e^{-k_\rho|z_n|}\right]$$

Combining exponential terms gives $$S = \frac{\pi k_\rho^2}{2(k_\rho^2+k_z^2)}\left[e^{-k_\rho|z_n|}+e^{+k_\rho|z_n|}+j\frac{k_z}{k_\rho}[e^{+k_\rho|z_n|}-e^{-k_\rho|z_n|}]\right]; z_n < 0 \quad (61)$$

The function S divided by the function H is $$\frac{S}{H} = \frac{1}{8}\sum_{z_n=0}^{-l_3}\sum_{y_n=-l_2/2}^{+l_2/2}\sum_{x_n=-l_1/2}^{+l_1/2}\chi_{n_1,n_2,n_3} \quad (62)$$

$$e^{-j[k_x x_n+k_y y_n+k_z z_n]}\left[e^{-k_\rho|z_n|}+e^{+k_\rho|z_n|}+j\frac{k_z}{k_\rho}[e^{+k_\rho|z_n|}-e^{-k_\rho|z_n|}]\right]; z_n < 0$$

The inverse Fourier transform of the function S divided by the function H is given as follows, where the symbol $F^{-1}(Q)$ is defined as the inverse Fourier transform of the function Q.

$$F^{-1}\left[\frac{S}{H}\right] = F^{-1}\left\{\frac{1}{8}\sum_{z_n=0}^{-l_3}\sum_{y_n=-l_2/2}^{+l_2/2}\sum_{x_n=-l_1/2}^{+l_1/2}\chi_{n_1,n_2,n_3}e^{-j[k_x x_n+k_y y_n+k_z z_n]}\right. \quad (63)$$

$$\left.\left[e^{-k_\rho|z_n|}+e^{+k_\rho|z_n|}+j\frac{k_z}{k_\rho}[e^{+k_\rho|z_n|}-e^{-k_\rho|z_n|}]\right]\right\};$$

$$z_n < 0$$

The inverse Fourier transform of the function F is $$F^{-1}(F) = f = \sum_{z_n}\sum_{y_n}\sum_{x_n}\chi_{n_1,n_2,n_3}\delta[x-x_n, y-y_n, z-z_n] \quad (64)$$

Specifically, the inverse Fourier transform of the function F in terms of the dipole spacing is $$F^{-1}\left\{\sum_{z_n=0}^{-l_3}\sum_{y_n=-l_2/2}^{+l_2/2}\sum_{x_n=-l_1/2}^{+l_1/2}\chi_{n_1,n_2,n_3}e^{-j[k_x x_n+k_y y_n+k_z z_n]}\right\} = \quad (65)$$

-continued $$\sum_{z_n=0}^{-l_3}\sum_{y_n=-l_2/2k}^{+l_2/2}\sum_{x_n=-l_1/2k}^{+l_1/2}\chi_{n_1,n_2,n_3}\delta[x-n_1 k, y-n_2 k, z-n_3 k]$$

Consider the general Fourier transform pair in cylindrical coordinates:

$$g(r,\theta,z) \Leftrightarrow G(s,\phi,\omega) \quad (66)$$

Under circular symmetry, that is when g is independent of θ (and hence G independent of φ) the inverse Fourier transform is [9]

$$h(r, z) = 2\pi\int_0^\infty\int_{-\infty}^\infty H(s,\omega)J_0(2\pi sr)e^{i2\pi\omega z}sdsd\omega \quad (67)$$

The inverse Fourier transform of Eq. (62):

$$F^{-1}\left\{\frac{1}{8}\sum_{z_n=0}^{-l_3}\sum_{y_n=-l_2/2}^{+l_2/2}\sum_{x_n=-l_1/2}^{+l_1/2}\chi_{n_1,n_2,n_3}e^{-j[k_x x_n+k_y y_n+k_z z_n]}\left[e^{-k_\rho|z_n|}+e^{+k_\rho|z_n|}+j\frac{k_z}{k_\rho}[e^{+k_\rho|z_n|}-e^{-k_\rho|z_n|}]\right]\right\};z_n<0 \quad (68)$$

given by Eq. (64) and Eq. (66) is $$=\frac{1}{8}\sum_{n_3=0}^{+l_3/k}\sum_{n_2=-l_2/k}^{+l_2/2k}\sum_{n_1=-l_1/2k}^{+l_1/2k}\chi_{n_1,n_2,n_3}\delta[x-n_1 k, y-n_2 k, z-n_3 k] \quad (69)$$

-continued $$\left\{\begin{array}{l}2\pi\int_{-\infty}^{\infty}\int_0^{\infty}e^{-k_\rho|z_n|}J_o[k_\rho\rho]k_\rho dk_\rho e^{jk_z z}dk_z+\\2\pi\int_{-\infty}^{\infty}\int_0^{\infty}e^{+k_\rho|z_n|}J_o[k_\rho\rho]k_\rho dk_\rho e^{jk_z z}dk_z+\\j2\pi\int_{-\infty}^{\infty}\int_0^{\infty}e^{+k_\rho|z_n|}J_o[k_\rho\rho]k_\rho dk_\rho e^{jk_z z}dk_z-\\j2\pi\int_{-\infty}^{\infty}\int_0^{\infty}e^{-k_\rho|z_n|}J_o[k_\rho\rho]k_\rho dk_\rho e^{jk_z z}dk_z\end{array}\right\}$$

The solution of Eq. (68) appears as follows, and the derivation appears in APPENDIX VII.

$$F^{-1}\left\{\frac{1}{8}\sum_{z_n=0}^{-l_3}\sum_{y_n=-l_2/2}^{+l_2/2}\sum_{x_n=-l_1/2}^{+l_1/2}\chi_{n_1,n_2,n_3}e^{-j[k_x x_n+k_y y_n+k_z z_n]}\left[e^{-k_\rho|z_n|}+e^{+k_\rho|z_n|}+j\frac{k_z}{k_\rho}[e^{+k_\rho|z_n|}-e^{-k_\rho|z_n|}]\right]\right\}= \quad (70)$$

$$\frac{\pi}{2}\sum_{n_3=0}^{+l_3/k}\sum_{n_2=-l_2/2k}^{+l_2/2k}\sum_{n_1=-l_1/2k}^{+l_1/2k}\chi_{n_1,n_2,n_3}\delta[x-n_1 k, y-n_2 k, z-n_3 k]\otimes\left[\delta[z]\frac{z_n}{[z_n^2+\rho^2]^{3/2}}\right]$$

Inverse Transform 1

Thus, the inverse Fourier transform of $$\frac{S}{H}$$

(Eq. (62)) is given by Eq. (69).

$$F^{-1}\left[\frac{S}{H}\right]=F^{-1}\left\{\frac{1}{8}\sum_{z_n=0}^{-l_3}\sum_{y_n=-l_2/2}^{+l_2/2}\sum_{x_n=-l_1/2}^{+l_1/2}\chi_{n_1,n_2,n_3}e^{-j[k_x x_n+k_y y_n+k_z z_n]}\left[e^{-k_\rho|z_n|}+e^{+k_\rho|z_n|}+j\frac{k_z}{k_\rho}[e^{+k_\rho|z_n|}-e^{-k_\rho|z_n|}]\right]\right\} \quad (71)$$

$$=\frac{\pi}{2}\sum_{n_3=0}^{+l_3/k}\sum_{n_2=-l_2/2k}^{+l_2/2k}\sum_{n_1=-l_1/2k}^{+l_1/2k}\chi_{n_1,n_2,n_3}\delta[x-n_1 k, y-n_2 k, z-n_3 k]\otimes\left[\delta[z]\frac{z_n}{[z_n^2+\rho^2]^{3/2}}\right]$$

The convolution replaces each coordinate with a spatially shifted coordinate.

$$F^{-1}\left[\frac{S}{H}\right] = \frac{\pi}{2} \sum_{z_n} \sum_{y_n} \sum_{x_n} \chi_{n_1,n_2,n_3} \delta[z-z_n] \left[\frac{z_n}{[z_n^2 + [x-x_n]^2 + [y-y_n]^2]^{3/2}}\right] \quad (72)$$

The result of the evaluation of Eq. (71) at each coordinate $x_n, y_n, z_n$ is $$F^{-1}\left[\frac{S}{H}\right]_{x_n,y_n,z_n} = \chi_{n_1,n_2,n_3}\left[\frac{\pi}{2z_n^2}\right] \quad (73)$$

Solving for the bulk magnetization of each dipole gives $$\chi_{n_1,n_2,n_3} = \frac{F^{-1}\left[\frac{S}{H}\right]_{x_n,y_n,z_n}}{\frac{\pi}{2z_n^2}} \quad (74)$$

The solution of the bulk magnetization of each dipole follows from Eq. (73). Discrete values of the voltages produced at the detector array due to the secondary magnetic field are recorded during a scan which represent discrete values of function s (Eqs. (41-42)); thus, in the reconstruction algorithm that follows, discrete Fourier and Inverse Fourier transforms replace the corresponding continuous functions of Eq. (73) of the previous analysis.

Discrete values of H of Eqs. (52-54), the Fourier transform of the system function, replace the values of the continuous function. Furthermore, each sample voltage of an actual scan is not truly a point sample, but is equivalent to a sample and hold which is obtained by inverting the grid antennae matrices or which is read directly from a micro-antennae as described in the Finite Detector Length Section. The spectrum of a function discretely recorded as values, each of which is equivalent to a sample and hold, can be converted to the spectrum of the function discretely recorded as point samples by dividing the former spectrum by an appropriate sinc function. This operation is performed and is described in detail in the Finite Detector Length Section. From these calculated point samples, the bulk magnetization function (NMR image) is obtained following the operations of Eq. (73) as given below.

Reconstruction Algorithm

1) Record the RF NMR signal at discrete points over the sample space. Each point is designated (x, y, z, RF) and each RF value is an element in matrix A.
2) Invert the detector grid matrices defined by the noncommon areas of the overlapping elements of the detector array described in the Finite Detector Length Section to obtain the sample and hold voltages which form Matrix A' (if micro-antennas are used, form Matrix A' of the recorded voltages directly).
3) Fourier transform the time dependent signals to give the intensity and phase of each component. The NMR signal of each voxel at any given detector gives rise to a Fourier component with a unique phase angle relative to the Fourier component of any other voxel of the phantom at that detector. The matrix of Fourier components that correspond to the NMR signal of a given voxel over the detectors is determined. This may be achieved by using a first component having a phase angle and calculating the phase angle as a function of spatial position of the first detector relative to any other detector and identifying the component at each detector having the calculated phase angle. The matrices $A_n$ are determined for all of the voxels. The measurements of the spatial variations of the transverse RF field of a given matrix is used to determine the coordinate location of each voxel. Thus, each matrix of components associated by phase comprises the intensity variation over the sample space of the RF field of the bulk magnetization M of each voxel.
4) Three-dimensionally Fourier transform each matrix $A_n$, using a discrete Fourier transform formula such as that which appears in McC. Siebert [10] to obtain each matrix $B_n$ of elements at frequencies corresponding to the spatial recording interval in each direction.

$$A_4(x,y,z) \Rightarrow B_n(k_x,k_y,k_z)$$

5) Multiply each element of each matrix $B_n$ by a value which is the inverse of the Fourier transform of a square wave evaluated at the same frequency as the element where the square wave corresponds to a sample and hold operation performed on the continuous voltage function produced at the detector array by the secondary field. This multiplication forms each matrix $B_n^*$ which is the discrete spectrum of the continuous voltage function discretely point sampled (See the Finite Detector Length Section for details of this operation).

$$B_n(k_x, k_y, k_z) \times \frac{1}{\text{sinc}(k_x, k_y, k_z)} = B_n*(k_x, k_y, k_z)$$

6) Multiply each element of each matrix $B_n^*$ by the value which is the inverse (reciprocal) of the Fourier transform of the system function evaluated at the same frequency as the element to form each matrix $B_n^{**}$.

$$B_n*(k_x, k_y, k_z) \times \frac{1}{H(k_x, k_y, k_z)} = B_n**(k_x, k_y, k_z)$$

7) Inverse three-dimensionally Fourier transform each matrix $B_n^{}$ using the discrete inverse Fourier transform formula such as that which appears in McC. Siebert [10] to form each matrix $C_n$ whose elements correspond to the bulk magnetization of the dipoles at the points of the image space of spatial interval appropriate for the frequency spacing of points of matrix $B_n^{}$.

$$B_n^{**}(k_x,k_y,k_z) \Rightarrow C_n(x,y,z)$$

8) Divide each element of each matrix $C_n$ by $$\frac{\pi}{2z_n^2}$$

to correct for the restriction that the sample space is defined as z greater than zero (z>0). This operation creates each matrix $D_n$ which is the bulk magnetization M map (NMR image).

$$\frac{C_n(x, y, z)}{\frac{\pi}{2z_n^2}} = D_n(x, y, z)$$

In the NMR case shown in FIGS. 8, 10, 11, and 12, Step 7 of the Reconstruction Algorithm of the Fourier Transform Reconstruction Algorithm Section is equivalent to the general case except for the coordinate designations and the relationship between the magnetic moment of a static secondary field and the bulk magnetization M of the RF field wherein $m_z$, the magnetic moment along the z-axis, of Eq. (1) corresponds to the bulk magnetization M of each voxel:

8*) Divide each element of each matrix $C_n$ by $$\frac{\pi}{2y_n^2}$$

to correct for the restriction that the sample space is defined as y greater than zero, y>0. This operation creates each matrix $D_n$ which is the bulk magnetization M map.

$$\frac{C_n(x, y, z)}{\frac{\pi}{2y_n^2}} = D_n(x, y, z)$$

In one embodiment, the point spread of the reconstructed voxel is corrected by assigning one voxel above a certain threshold with the bulk magnetization M. The other voxels are assigned a zero value. This procedure may be repeated for all voxels. In the limit with sufficient phase resolution, each volume element is reconstructed independently in parallel with all other volume elements such that the scan time is no greater than the nuclear free induction decay (FID) time.

9) Superimpose the separate bulk magnetization M maps corresponding to each matrix $A_n$. Plot the bulk magnetization M with the same spatial interval in each direction as the sampling interval in each direction over all matrices $A_n$ (i.e. the total bulk magnetization M map which is plotted and displayed is the superposition of the separate maps of each magnetic moment corresponding a matrix $A_n$).

(The above steps for each matrix relate generally to the program implementation shown in the listing of the Exemplary Reconstruction Program as follows. The above Steps 1 and 2 relate to the Data Statements beginning at lines 50; and Step 4 relates to the X, Z and Y FFT operations of lines 254, 455 and 972, respectively. Steps 5 and 6 are implemented by the processes of lines 2050, 2155 and 2340; and Step 7 relates to the X, Y and Z inverse transform of lines 3170, 3422 and 3580, respectively. Step 8 and 8* relates to the correction and normalization process of line 4677.)

Exemplary Reconstruction Program

```
10 ! 4D-MRI ALGORITHM
25 PEN "4D-MRIPROTOTYPEI.LIS" FOR OUTPUT AS #1
26 C=0.05
27 DIM X(9,9,9)
28 FOR W=1 TO 9 STEP 1
29 FOR T=1 TO 9 STEP 1
30 FOR S=1 TO 9 STEP 1
31 X(W,T,S)=0
32 NEXT S
33 NEXT T
34 NEXT W
35 X(5,5,6)=1
36 DIM DI(9,9)
37 PRINT #1, "DIPOLE PHANTOM"
40 FOR Q=1 TO 9 STEP 1
41 FOR R=1 TO 9 STEP 1
42 FOR U=1 TO 9 STEP 1
43 LET H=X(U,R,Q)
44 LET DI(U,R)=H
45 NEXT U
46 NEXT R
47 MAT PRINT #1, DI,
48 NEXT Q
50 DATA 0,0,0,0,0,0,0,0,0,0,0,0,0
52 DATA 0,0,0,0,0,-0.6,-0.9,-1.1,-1.2,-1.8,5.7,3.5,0.4,-0.4,-0.5,-0.7,-0.6,0.7
54 DATA 4.2,19.7,7.8,0.1,-0.9,-0.3,-0.4,-0.7,0.7,13.9,25.65, 10.1, 0.9,-0.8,-0.3,-0.6
56 DATA -0.4,2.7,10.7,12.4,5.6,2.6,-0.5,-0.3,-0.5,-0.6,-0.6,0.3,3.7,0.9,-0.5,-1.0
58 DATA 0,0,0,0,0,0,0,0,0,0,0,0,0,0,0,0,0,0,0,0,0,0,0,0,0,0,0,0,0,0
60 DATA 0,0,-0.5,-0.8,-0.8,-1.0,-1.2,-0.8,6.9,0.2,-0.2,-0.4,-0.6,-0.6,1.2,4.1,12.7,0,0.6
62 DATA -0.6,-0.3,-0.5,-0.7,-0.3,3.7,9.05,7.6,1.3,-0.5,-0.3,-0.4,-0.2,2.7,4.3,10.6,0.8
64 DATA 1.7,-0.4,-0.3,-0.5,-0.4,-0.1,1.1,1.1,1.7,0.2,-0.6,0,0,0,0,0,0,0,0,0,0,0
66 DATA 0,0,0,0,0,0,0,0,0,0,0,0,0,0,0,0,0,0,-0.5,-0.6,-0.6,-0.5,-0.5
68 DATA 0.3,2.5,0.1,-0.1,-0.3,-0.4,-0.3,1.3,3.9,8.1,1.7,0.9,- 0.3,-0.3,-0.4,-0.6,-0.8,1.5
70 DATA 1.65,4.7,1.3,-0.3,-0.2,-0.2,0.1,2.1,3.5,7.1,0.7,0.7,- 0.3,-0.2,-0.4,-0.2,0.2,1.2
72 DATA 1.1,1.4,0.4,-0.3,0,0,0,0,0,0,0,0,0,0,0,0,0,0,0,0,0,0,0,0,0,0
74 DATA 0,0,0,0,0,0,0,0,0,-0.4,-0.5,0,-0.1,-0.1,1.7,1.5, 0.2,-0.1,-0.2,-0.2,0,1.3,3.1
76 DATA 4.1,3.4,0.9,0,-0.2,-0.3,-0.4,-0.4,1.1,0.65,2.9,1.1,-0.2,-0.1,-0.1,0.2,1.2,1.6
78 DATA 4.9,0.1,0.5,-0.3,-0.2,-0.3,-0.1,0,0.3,1.3,0.6,0.1,-0.1,0,0,0,0,0,0,0,0,0,0
80 DATA 0,0,0,0,0,0,0,0,0,0,0,0,0,0,0,0,0,0,0,0,-0.3,-0.2, 0.1,0.9,1.6,1.6
```

82 DATA 0.4,0,0,−0.1,−0.1,0.2,1.0,2.2,2.7,3.7,0.5,0,−0.2,−0.2,−0.2,−0.1,0.6,0.25,1.6,0.7
84 DATA −0.2,−0.1,−0.1,0.1,0.7,0.9,2.8,0,0.3,−0.2,−0.1,−0.2,−0.1,0,0.2,0.3,0.3,0,−0.1,0,0,0
85 DATA 0,0,0,0,0,0,0,0,0,0,0,0,0,0
86 DATA 0,0,0,0,0,0,0,0,0,0,0,0,0,0,0,0,−0.2,−0.1,0.1,1.0,1.4,1.3,0.2,0,0
88 DATA −0.1,0,0.2,0.7,1.5,2.0,2.9,0.3,0,−0.1,−0.1,0.1,0,0.7,0.25,0.9,0.4,−0.1,0,0,0.1,0.5
90 DATA −0.5,1.3,0,0.2,−0.1,0,−0.1,0,0.1,0.2,0.1,0.2,0,−0.1,0,0,0,0,0,0,0,0,0,0,0
92 DATA 0,0,0,0,0,0,0,0,0,0,0,0,0,0,0,0,0,0,−0.1,0,0.1,0.8,0.9,1.0,0.1,0,0
94 DATA 0,0,0.2,0.5,1.1,1.3,2.0,0.3,0,0,−0.1,0,0,0.3,0.15,0.6, 0.2,−0.1,0,0,0.1,0.4,0.3,0.9
96 DATA 0,0.2,−0.1,0,−0.1,0.1,0.1,0.1,0.1,0.2,0,0,0,0,0,0,0,0,0,0,0,0,0,0,0
98 DATA 0,0,0,0,0,0,0,0,0,0,0,0,0,0,0,0,−0.1,0,0,0.7,0.7,0.6,0.1,0,0.1
100 DATA 0,0.1,0.2,0.3,0.6,0.8,1.0,0.2,0,0,−0.1,0,0,0.1,0.15,0.3, 0.1,0,0,0,0,0.2,0.2,0.5
102 DATA 0,0.1,−0.1,0,0,0.1,0.1,0.1,0.1,0,0,0,0,0,0,0,0,0,0,0,0,0,0
104 DATA 0,0,0,0,0,0,0,0,0,0,0,0,0,0,0,0,0.5,0.4,0.4, 0.1,0,0,0,0,0.1,0.1
106 DATA 0.4,0.5,0.6,0.1,0,0,0,0,0,0.05,0.1,0,0,0,0,0.1,0.1,0.3,0,0.1,−0.1,0,0,0,0
108 DATA 0.1,0,0,0,0,0,0,0,0,0,0,0,0,0,0,0,0,0
120 DIM V(9,9,9)
130 FOR Z=1 TO 9 STEP 1
140 FOR Q=1 TO 9 STEP 1
145 FOR U=1 TO 9 STEP 1
147 READ V(Z,Q,U)
222 NEXT U
223 NEXT Q
224 NEXT Z
225 PRINT #1, "VOLTAGE DATA"
226 DIM VO(9,9)
227 FOR Q=1 TO 9 STEP 1
228 FOR R=1 TO 9 STEP 1
229 FOR U=1 TO 9 STEP 1
230 LET H=V(U,R,Q)
231 LET VO(U,R)=H
232 NEXT U
233 NEXT R
234 MAT PRINT #1, VO,
235 NEXT Q
254 !FFT THE ROWS OF SAMPLED VOLTAGES IN THE X DIRECTION
255 DIM MR(9)
256 DIM MI(9)
257 DIM R(9)
258 DIM RV(9,9,9)
259 DIM IV(9,9,9)
260 FOR V=0 TO 9 STEP 1
270 FOR M=1 TO 9 STEP 1
280 FOR N=1 TO 9 STEP 1
290 LET Y=V(M,N,V)
300 LET R(N)=Y
305 NEXT N
310 EXTERNAL SUB FFT(DIM( ),DIM( ),DIM( ))
320 CALL FFT(R( ),MR( ),MI( ))
330 FOR N=1 TO 9 STEP 1
340 LET Y=MR(N)
350 LET RV(M,N,V)=Y
360 NEXT N
370 FOR N=1 TO 9 STEP 1
380 LET G=MI(N)
390 LET IV(M,N,V)=G
400 NEXT N
410 NEXT M
415 NEXT V
417 DIM RVO(9,9)
419 DIM IVO(9,9)
420 PRINT #1, "RV"
421 FOR Q=1 TO 9 STEP 1
422 FOR R=1 TO 9 STEP 1
423 FOR U=1 TO 9 STEP 1
424 LET H=RV(U,R,Q)
425 LET RVO(U,R)=H
426 NEXT U
427 NEXT R
428 MAT PRINT #1, RVO,
429 NEXT Q
430 PRINT #1, "IV"
431 FOR Q=1 TO 9 STEP 1
432 FOR R=1 TO 9 STEP 1
433 FOR U=1 TO 9 STEP 1
434 LET H=IV(U,R,Q)
435 LET IVO(U,R)=H
436 NEXT U
437 NEXT R
438 MAT PRINT #1, IVO,
439 NEXT Q
455 !FPT THE COLUMNS OF THE SAMPLED VOLTAGE IN THE Z DIRECTION
460 DIM RRV(9,9,9)
470 DIM IRV(9,9,9)
475 FOR V=1 TO 9 STEP 1
480 FOR N=1 TO 9 STEP 1
490 FOR M=1 TO 9 STEP 1
500 LET Y=RV(M,N,V)
510 LET R(M)=Y
520 NEXT M
530 CALL FFT(R( ),MR( ),MI( ))
540 FOR M=1 TO 9 STEP 1
550 LET H=MR(M)
560 LET RRV(M,N,V)=H
570 NEXT M
580 FOR M=1 TO 9 STEP 1
590 LET G=MI(M)
600 LET IRV(M,N,V)=G
610 NEXT M
620 NEXT N
625 NEXT V
626 DIM RRVO(9,9)
627 DIM IRVO(9,9)
630 PRINT #1, "RRV"
631 FOR Q=1 TO 9 STEP 1
632 FOR R=1 TO 9 STEP 1
633 FOR U=1 TO 9 STEP 1
634 LET H=RRV(U,R,Q)
637 LET RRVO(U,R)=H
638 NEXT U
639 NEXT R
640 MAT PRINT #1, RRVO,
641 NEXT Q

```
650 PRINT #1, "IRV"
651 FOR Q=1 TO 9 STEP 1
653 FOR R=1 TO 9 STEP 1
654 FOR U=1 TO 9 STEP 1
655 LET H=IRV(U,R,Q)
656 LET IRVO(U,R)=H
657 NEXT U
658 NEXT R
659 MAT PRINT #1, IRVO,
660 NEXT Q
661 DIM RIV(9,9,9)
662 DIM IIV(9,9,9)
685 FOR V=1 TO 9 STEP 1
690 FOR N=1 TO 9 STEP 1
700 FOR M=1 TO 9 STEP 1
710 LET Y=IV(M,N,V)
760 LET R(M)=Y
770 NEXT M
830 CALL FFT(R( ),MR( ),MI( ))
840 FOR M=1 TO 9 STEP 1
850 LET H=MR(M)
860 LET RIV(M,N,V)=H
870 NEXT M
872 FOR M=1 TO 9 STEP 1
873 LET G=MI(M)
874 LET IIV(M,N,V)=G
875 NEXT M
876 NEXT N
877 NEXT V
878 DIM RIVO(9,9)
879 DIM IIVO(9,9)
880 PRINT #1, "RIV"
881 FOR Q=1 TO 9 STEP 1
882 FOR R=1 TO 9 STEP 1
883 FOR U=1 TO 9 STEP 1
884 LET H=RIV(U,R,Q)
885 LET RIVO(U,R)=H
886 NEXT U
887 NEXT R
888 MAT PRINT #1, RIVO,
889 NEXT Q
890 PRINT #1, "IIV"
891 FOR Q=1 TO 9 STEP 1
892 FOR R=1 TO 9 STEP 1
893 FOR U=1 TO 9 STEP 1
894 LET H=IIV(U,R,Q)
895 LET IIVO(U,R)=H
896 NEXT U
897 NEXT R
898 MAT PRINT #1, IIVO,
899 NEXT Q
900 DIM RVA(9,9,9)
901 DIM IVA(9,9,9)
904 DIM RVAO(9,9)
906 DIM IVAO(9,9)
908 FOR Q=1 TO 9 STEP 1
910 FOR R=1 TO 9 STEP 1
911 FOR U=1 TO 9 STEP 1
912 LET H=IIV(U,R,Q)
913 H=(−1)*H
914 LET G=RRV(U,R,Q)
915 LET L=G+H
916 LET RVA(U,R,Q)=L
917 NEXT U
918 NEXT R
919 NEXT Q
920 FOR Q=1 TO 9 STEP 1
921 FOR R=1 TO 9 STEP 1
922 FOR U=1 TO 9 STEP 1
923 LET H=IRV(U,R,Q)
924 LET L=RIV(U,R,Q)
925 LET IVA(U,R,Q)=H+L
927 NEXT U
928 NEXT R
930 NEXT Q
932 PRINT #1, "RVA"
934 FOR Q=1 TO 9 STEP 1
936 FOR R=1 TO 9 STEP 1
938 FOR U=1 TO 9 STEP 1
940 LET H=RVA(U,R,Q)
942 LET RVAO(U,R)=H
944 NEXT U
946 NEXT R
948 MAT PRINT #1, RVAO,
950 NEXT Q
952 PRINT #1, "IVA"
954 FOR Q=1 TO 9 STEP 1
956 FOR R=1 TO 9 STEP 1
958 FOR U=1 TO 9 STEP 1
960 LET H=IVA(U,R,Q)
962 LET IVAO(U,R)=H
964 NEXT U
966 NEXT R
968 MAT PRINT #1, IVAO,
970 NEXT Q
972 !FFT THE ROWS OF THE SAMPLED VOLTAGES IN THE Y DIRECTION
980 DIM RVAY(9,9,9)
990 DIM IRVAY(9,9,9)
992 DIM RVAYO(9,9)
994 DIM IRVAYO(9,9)
1012 FOR M=1 TO 9 STEP 1
1013 FOR N=1 TO 9 STEP 1
1014 FOR V=1 TO 9 STEP 1
1015 LET Y=RVA(M,N,V)
1016 LET R(V)=Y
1017 NEXT V
1018 CALL FFT(R( ),MR( ),MI( ))
1019 FOR V=1 TO 9 STEP 1
1020 LET H=MR(V)
1021 LET RVAY (M,N,V)=H
1022 NEXT V
1023 FOR V=1 TO 9 STEP 1
1024 LET G=MI(V)
1025 LET IRVAY(M,N,V)=G
1026 NEXT V
1027 NEXT N
1028 NEXT M
1030 PRINT #1, "RVAY"
1032 FOR Q=1 TO 9 STEP 1
1034 FOR R=1 TO 9 STEP 1
1036 FOR U=1 TO 9 STEP 1
1038 LET H=RVAY(U,R,Q)
1040 LET RVAYO(U,R)=H
1042 NEXT U
1044 NEXT R
1046 MAT PRINT #1, RVAYO,
1048 NEXT Q
1050 PRINT #1, "IRVAY"
1052 FOR Q=1 TO 9 STEP 1
1054 FOR R=1 TO 9 STEP 1
1056 FOR U=1 TO 9 STEP 1
1058 LET H=IRVAY(U,R,Q)
1060 LET IRVAYO(U,R)=H
```

1062 NEXT U
1064 NEXT R
1066 MAT PRINT #1, IRVAYO,
1068 NEXT Q
1070 DIM RIVY(9,9,9)
1080 DIM IIVY(9,9,9)
1085 DIM RIVYO(9,9)
1086 DIM IIVYO(9,9)
1090 FOR M=1 TO 9 STEP 1
1100 FOR N=1 TO 9 STEP 1
1138 FOR V=1 TO 9 STEP 1
1139 LET Y=IVA(M,N,V)
1140 LET R(V)=Y
1141 NEXT V
1142 CALL FFT(R( ),MR( ),MI( ))
1143 FOR V=1 TO 9 STEP 1
1144 LET H=MR(V)
1145 LET RIVY(M,N,V)=H
1146 NEXT V
1147 FOR V=1 TO 9 STEP 1
1148 LET G=MI(V)
1149 LET IIVY(M,N,V)=G
1150 NEXT V
1151 NEXT N
1152 NEXT M
1153 PRINT #1, "RIVY"
1160 FOR Q=1 TO 9 STEP 1
1162 FOR R=1 TO 9 STEP 1
1164 FOR U=1 TO 9 STEP 1
1166 LET H=RIVY(U,R,Q)
1170 LET RIVYO(U,R)=H
1172 NEXT U
1174 NEXT R
1178 MAT PRINT #1, RIVYO,
1180 NEXT Q
1185 PRINT #1, "IIVY"
1190 FOR Q=1 TO 9 STEP 1
1200 FOR R=1 TO 9 STEP 1
1210 FOR U=1 TO 9 STEP 1
1212 LET H=IIVY(U,R,Q)
1214 LET IIVYO(U,R)=H
1216 NEXT U
1218 NEXT R
1220 MAT PRINT #1, IIVYO,
1222 NEXT Q
1230 DIM YRVA(9,9,9)
1240 DIM YIVA(9,9,9)
1241 FOR Q=1 TO 9 STEP 1
1250 FOR R=1 TO 9 STEP 1
1260 FOR U=1 TO 9 STEP 1
1270 LET L=IIVY(U,R,Q)
1280 LET B=RVAY(U,R,Q)
1290 LET YRVA(U,R,Q)=B−L
1300 NEXT U
1310 NEXT R
1320 NEXT Q
1330 FOR Q=1 TO 9 STEP 1
1340 FOR R=1 TO 9 STEP 1
1345 FOR U=1 TO 9 STEP 1
1350 LET H=RIVY(U,R,Q)
1360 LET L=IRVAY(U,R,Q)
1370 LET YIVA(U,R,Q)=L+H
1380 NEXT U
1390 NEXT R
1400 NEXT Q
1410 PRINT #1, "YRVA"
1412 DIM YRVAO(9,9)
1414 DIM YIVAO(9,9)
1420 FOR Q=1 TO 9 STEP 1
1430 FOR R=1 TO 9 STEP 1
1440 FOR U=1 TO 9 STEP 1
1450 LET H=YRVA(U,R,Q)
1460 LET YRVAO(U,R)=H
1470 NEXT U
1480 NEXT R
1490 MAT PRINT #1, YRVAO,
1500 NEXT Q
1510 PRINT #1, "YIVA"
1520 FOR Q=1 TO 9 STEP 1
1530 FOR R-1 TO 9 STEP 1
1540 FOR U=1 TO 9 STEP 1
1545 LET H=YIVA(U,R,Q)
1550 LET YIVAO(U,R)=H
1560 NEXT U
1570 NEXT R
1580 MAT PRINT #1, YIVAO,
1590 NEXT Q
2050 !GENERATE THE DISCRETE SPECTRUM OF THE SYSTEM FUNCTION AND THE SINC
2055 !FUNCTION OF THE SAMPLE AND HOLD CORRESPONDING TO THE FINITE DETECTOR
2057 !DIMENSIONS
2060 DIM SFH(9,9,9)
2061 DIM SFHO(9,9)
2062 DIM SINC (9,9,9)
2063 DIM SINCO(9,9)
2065 LET SFH(4,4,4)=4*PI
2066 FOR M=−4 TO 4 STEP 1
2070 FOR V=−4 TO 4 STEP 1
2080 FOR N=−4 TO 4 STEP 1
2081 H=0.04
2082 J=ABS (M)+ABS (N)+ABS (V)
2085 IF J=0 THEN GO TO 2098
2090 T=4*PI*((2*PI*N/9*1/0.1)ô2+((2*PI*V/9*1/0.1)ô2))
2092 B=(2*PI*N/9*1/0.1)ô2+(2*PI*M/9*1/C)ô2+(2*PI*V/9*1/0.1)ô2
2095 LET SFH(M+5,N+5,V+5)=T/B
2098 G=ABS (N)+ABS (V)
2100 IF G=0 THEN GO TO 2114
2101 A=1
2105 IF N=0 THEN GO TO 2107
2106 A=SIN (2*PI*10*N/9*0.1)/(PI*N/9*10)
2107 B=1
IF V=0 THEN GO TO 2110
2109 B=SIN (2*PI*10*V/9*0.1)/(PI*V/9*10)
2110 H=A*B
2111 IF N=0 THEN H=0.2*H
2112 IF V=0 THEN H=0.2*H
2114 LET SINC(M+5,N+5,V+5)=H
2130 NEXT N
2131 NEXT V
2132 NEXT M
2135 PRINT #1, "SFH"
2136 FOR Q=1 TO 9 STEP 1
2137 FOR R=1 TO 9 STEP 1
2138 FOR U=1 TO 9 STEP 1
2139 LET S=SFH(U,R,Q)
2140 LET SFHO(U,R)=S
2141 NEXT U
2142 NEXT R
2143 MAT PRINT #1, SFHO,
2144 NEXT Q
2145 PRINT #1, "SINC"
2146 FOR Q=1 TO 9 STEP 1

2147 FOR R=1 TO 9 STEP 1
2148 FOR U=1 TO 9 STEP 1
2149 LET S=SINC(U,R,Q)
2150 LET SINCO(U,R)=S
2151 NEXT U
2152 NEXT R
2153 MAT PRINT #1, SINCO,
2154 NEXT Q
2155 !INVERSE THE DISCRETE SPECTRUM OF THE SYSTEM FUNCTION AND THE SINC
2157 !FUNCTION
2160 DIM HR(9,9,9)
2170 DIM HRO(9,9)
2171 DIM SINCR(9,9,9)
2175 FOR V=1 TO 9 STEP 1
2180 FOR M=1 TO 9 STEP 1
2190 FOR N=1 TO 9 STEP 1
2200 LET Y=SFH(M,N,V)
2201 LET H=SINC(M,N,V)
2210 IF Y=0 THEN GO TO 2212
2211 Y=1/Y
2212 IF H=0 THEN GO TO 2230
2221 H=1/H
2230 LET HR(M,N,V)=Y
2235 LET SINCR(M,N,V)=H
2240 NEXT N
2250 NEXT M
2260 NEXT V
2310 PRINT #1, "HR"
2311 FOR Q=1 TO 9 STEP 1
2312 FOR R=1 TO 9 STEP 1
2313 FOR U=1 TO 9 STEP 1
2314 LET S=HR(U,R,Q)
2315 LET HRO(U,R)=S
2316 NEXT U
2317 NEXT R
2320 MAT PRINT #1, HRO,
2321 NEXT Q
2340 !DIVIDE THE TRANSFORMED DATA BY THE TRANSFORM OF THE SYSTEM FUNCTION
2345 !AND THE SINC FUNCTION
3030 DIM FR(9,9,9)
3050 DIM FI(9,9,9)
3052 DIM FRO(9,9)
3054 DIM FIO(9,9)
3056 FOR V=1 TO 9 STEP 1
3057 FOR M=1 TO 9 STEP 1
3058 FOR N=1 TO 9 STEP 1
3059 T=YRVA(M,N,V)
3060 S=HR(M,N,V)
3062 L=SINCR(M,N,V)
3065 K=S*T*L
3066 LET FR(M,N,V)=K
3067 NEXT N
3068 NEXT M
3070 NEXT V
3080 FOR V=1 TO 9 STEP 1
3081 FOR M=1 TO 9 STEP 1
3082 FOR N=1 TO 9 STEP 1
3083 H=SINCR(M,N,V)
3093 K=HR(M,N,V)
3094 L=YIVA(M,N,V)
3095 E=K*L*H
3096 LET FI(M,N,V)=E
3097 NEXT N
3098 NEXT M
3100 NEXT V
3130 PRINT #1, "FR"
3131 FOR Q=1 TO 9 STEP 1
3132 FOR R=1 TO 9 STEP 1
3133 FOR U=1 TO 9 STEP 1
3134 LET H=FR(U,R,Q)
3135 LET FRO(U,R)=H
3136 NEXT U
3137 NEXT R
3138 MAT PRINT #1, FRO,
3140 NEXT Q
3141 PRINT #1, "FI"
3142 FOR Q=1 TO 9 STEP 1
3143 FOR R=1 TO 9 STEP 1
3144 FOR U=1 TO 9 STEP 1
3145 LET H=FI(U,R,Q)
3146 LET FIO(U,R)=H
3156 NEXT U
3157 NEXT R
3158 MAT PRINT #1, FIO,
3160 NEXT Q
3170 !INVERSE TRANSFORM THE ROWS IN THE X DIRECTION
3180 DIM RF(9,9,9)
3185 DIM RFO(9,9)
3187 DIM MIFO(9,9)
3190 DIM MIF(9,9,9)
3195 DIM I(9)
3196 FOR V=1 TO 9 STEP 1
3200 FOR M=1 TO 9 STEP 1
3210 FOR N=1 TO 9 STEP 1
3220 LET Y=FR(M,N,V)
3230 LET R(N)=Y
3240 NEXT N
3250 FOR N=1 TO 9 STEP 1
3260 LET Y=FI(M,N,V)
3270 LET I(N)=Y
3280 NEXT N
3285 EXTERNAL SUB IFT(DIM( ),DIM( ),DIM( ),DIM( ))
3290 CALL IFT(R( ),I( ),MR( ),MI( ))
3300 FOR N=1 TO 9 STEP 1
3310 LET Y=MR(N)
3320 LET RF(M,N,V)=Y
3330 NEXT N
3340 FOR N=1 TO 9 STEP 1
3350 LET Y=MI(N)
3360 LET MIF(M,N,V)=Y
3370 NEXT N
3380 NEXT M
3385 NEXT V
3390 PRINT #1, "RF"
3391 FOR Q=1 TO 9 STEP 1
3392 FOR R=1 TO 9 STEP 1
3393 FOR U=1 TO 9 STEP 1
3394 LET H=RF(U,R,Q)
3395 LET RFO(U,R)=H
3396 NEXT U
3397 NEXT R
3400 MAT PRINT #1, RFO,
3405 NEXT Q
3410 PRINT #1, "MIF"
3411 FOR Q=1 TO 9 STEP 1
3412 FOR R=1 TO 9 STEP 1
3413 FOR U=1 TO 9 STEP 1
3414 LET H=MIF(U,R,Q)
3415 LET MIFO(U,R)=H
3416 NEXT U
3417 NEXT R

```
3420 MAT PRINT #1, MIFO,
3421 NEXT Q
3422 !INVERSE TRANSFORM THE ROWS IN THE Y
     DIRECTION
3430 DIM RFY(9,9,9)
3432 DIM MIFY(9,9,9)
3433 DIM RFYO(9,9)
3434 DIM MIFYO(9,9)
3435 FOR M=1 TO 9 STEP 1
3440 FOR N=1 TO 9 STEP 1
3450 FOR V=1 TO 9 STEP 1
3460 LET Y=RF(M,N,V)
3470 LET R(V)=Y
3480 NEXT V
3490 FOR V=1 TO 9 STEP 1
3500 LET Y=MIF(M,N,V)
3510 LET I(V)=Y
3520 NEXT V
3525 EXTERNAL SUB IFT(DIM( ),DIM( ),DIM( ),DIM( ))
3526 CALL IFT(R( ),I( ),MR( ),MI( ))
3527 FOR V=1 TO 9 STEP 1
3528 LET Y=MR(V)
3529 LET RFY(M,N,V)=Y
3530 NEXT V
3531 FOR V=1 TO 9 STEP 1
3532 LET Y=MI(V)
3533 LET MIFY(M,N,V)=Y
3534 NEXT V
3535 NEXT N
3536 NEXT M
3537 PRINT #1, "RFY"
3538 FOR Q=1 TO 9 STEP 1
3539 FOR R=1 TO 9 STEP 1
3540 FOR U=1 TO 9 STEP 1
3541 LET H=RFY(U,R,Q)
3542 LET RFYO(U,R)=H
3543 NEXT U
3544 NEXT R
3545 MAT PRINT #1, RFYO,
3546 NEXT Q
3547 PRINT #1, "MIFY"
3550 FOR Q=1 TO 9 STEP 1
3555 FOR R=1 TO 9 STEP 1
3560 FOR U=1 TO 9 STEP 1
3565 LET H=MIFY(U,R,Q)
3566 LET MIFYO(U,R)=H
3567 NEXT U
3568 NEXT R
3570 MAT PRINT #1, MIFYO,
3575 NEXT Q
3580 !INVERSE TRANSFORM THE COLUMNS IN THE
     Z DIRECTION
3581 DIM F(9,9,9)
3590 DIM FO(9,9)
3592 FOR V=1 TO 9 STEP 1
3593 FOR N=1 TO 9 STEP 1
3594 FOR M=1 TO 9 STEP 1
3600 LET Y=RFY(M,N,V)
4546 LET R(M)=Y
4547 NEXT M
4548 FOR M=1 TO 9 STEP 1
4549 LET Y=MIFY(M,N,V)
4550 LET I(M)=Y
4552 NEXT M
4553 EXTERNAL SUB IFTZ(DIM( ),DIM( ),DIM( ),DIM( ))
4554 CALL IFTZ(R( ),I( ),MR( ),MI( ))
4556 FOR M=1 TO 9 STEP 1
4557 LET Y=MR(M)
4559 LET F(M,N,V)=Y
4600 NEXT M
4602 NEXT N
4604 NEXT V
4605 PRINT #1, "F"
4610 FOR Q=1 TO 9 STEP 1
4620 FOR R=1 TO 9 STEP 1
4630 FOR U=1 TO 9 STEP 1
4635 LET H=F(U,R,Q)
4640 LET FO(U,R)=H
4650 NEXT U
4660 NEXT R
4666 MAT PRINT #1, FO,
4670 NEXT Q
4677 !CORRECT FOR THE U(Z) CONVOLUTION AND
     NORMALIZE THE RECONSTRUCTION
4678 DIM CF(9,9,9)
4780 DIM CFO(9,9)
4809 FOR V=1 TO 9 STEP 1
4810 FOR N=1 TO 9 STEP 1
4871 LET K=F(1,N,V)
4873 K=K/10E8
4974 LET CF(1,N,V)=K
5915 NEXT N
6616 NEXT V
6617 FOR V=1 TO 9 STEP 1
6620 FOR M=2 TO 9 STEP 1
6630 FOR N=1 TO 9 STEP 1
6640 LET K=F(M,N,V)
6642 P=0.5*PI/(M−1)Ô2/CÔ2
6650 K=K/P
6660 LET CF(M,N,V)=K
6670 NEXT N
6680 NEXT M
6681 NEXT V
6690 PRINT #1, "RECONSTRUCTION"
6691 FOR Q=1 TO 9 STEP 1
6692 FOR R=1 TO 9 STEP 1
6693 FOR U=1 TO 9 STEP 1
6694 LET H=CF(U,R,Q)
6695 H=H/CF(5,5,6)
6696 LET CFO(U,R)=H
6697 NEXT U
6698 NEXT R
6700 MAT PRINT #1, CFO,
6705 NEXT Q
6710 END
6722 SUB FFT(R( ),MR( ),MI( ))
6726 FOR M=1 TO 9 STEP 1
6730 A=0
6740 FOR N=1 TO 9 STEP 1
6750 LET H=R(N)
6760 B=H*COS (2*PI*(M−5)*(N−5)/9)
6770 A=A+B
6780 NEXT N
6790 A=A/9
6800 LET MR(M)=A
6810 NEXT M
6820 FOR M=1 TO 9 STEP 1
6830 A=0
6840 FOR N=1 TO 9 STEP 1
6880 LET H=R(N)
6890 H=−H
6900 B=H*SIN(2*PI*(M−5)*(N−5)/9)
6910 A=A+B
```

```
6920 NEXT N
6930 A=A/9
6935 LET MI(M)=A
6940 NEXT M
6950 END SUB
6960 SUB IFT(R( ),I( ),MR( ),MI( ))
6970 DIM MRR(9)
6980 DIM MRI(9)
6990 DIM MIR(9)
7000 DIM MII(9)
7010 FOR N=1 TO 9 STEP 1
7020 A=0
7030 FOR M=1 TO 9 STEP 1
7040 LET G=R(M)
7050 B=G*COS (2*PI*(M-5)*(N-5)/9)
7060 A=A+B
7070 NEXT M
7080 LET MRR(N)=A
7090 NEXT N
7100 FOR N=1 TO 9 STEP 1
7110 A=0
7120 FOR M=1 TO 9 STEP 1
7130 LET G=R(M)
7140 B=G*SIN(2*PI*(M-5)*(N-5)/9)
7150 A=A+B
7160 NEXT M
7170 LET MRI(N)=A
7180 NEXT N
7190 FOR N=1 TO 9 STEP 1
7200 A=0
7210 FOR M=1 TO 9 STEP 1
7220 LET G=I(M)
7230 B=G*COS(2*PI*(M-5)*(N-5)/9)
7240 A=A+B
7250 NEXT M
7260 LET MIR(N)=A
7270 NEXT N
7280 FOR N=1 TO 9 STEP 1
7290 A=0
7300 FOR M=1 TO 9 STEP 1
7310 LET G=I(M)
7320 B=G*SIN(2*PI*(M-5)*(N-5)/9)
7330 A=A+B
7340 NEXT M
7350 LET MII(N)=A
7360 NEXT N
7365 MAT MII=(-1)*MII
7375 MAT MR=MRR+MII
7385 MAT MI=MIR+MRI
7400 END SUB
7410 SUB IFTZ(R( ),I( ),MR( ),MI( ))
7420 DIM MRR(9)
7430 DIM MRI(9)
7440 DIM MIR(9)
7450 DIM MII(9)
7460 FOR N=1 TO 9 STEP 1
7470 A=0
7480 FOR M=1 TO 9 STEP 1
7490 LET G=R(M)
7500 B=G*COS(2*PI*(M-5)*(-N+1)/9)
7510 A=A+B
7520 NEXT M
7530 LET MRR(N)=A
7540 NEXT N
7550 FOR N=1 TO 9 STEP 1
7560 A=0
7570 FOR M=1 TO 9 STEP 1
7580 LET G=R(M)
7590 B=G*SIN(2*PI*(M-5)*(-N+1)/9)
7600 A=A+B
7610 NEXT M
7620 LET MRI(N)=A
7630 NEXT N
7640 FOR N=1 TO 9 STEP 1
7641 A=0
7642 FOR M=1 TO 9 STEP 1
7650 LET G=I(M)
7660 B=G*COS(2*PI*(M-5)*(-N+1)/9)
7670 A=A+B
7680 NEXT M
7690 LET MIR(N)=A
7700 NEXT N
7710 FOR N=1 TO 9 STEP 1
7720 A=0
7730 FOR M=1 TO 9 STEP 1
7740 LET G=I(M)
7750 B=G*SIN(2*PI*(M-5)*(-N+1)/9)
7760 A=A+B
7770 NEXT M
7780 LET MII(N)=A
7790 NEXT N
7795 MAT MII=(-1)*MII
7800 MAT MR=MRR+MII
7810 MAT MI=MRI+MIR
7880 END SUB
$
```

In an embodiment, the matrix inversion and/or the reiterative algorithms are used in combination with the Fourier Transform Algorithm. For example, an NMR image created by the Fourier Transform Algorithm may used as input for the first reiteration of the reiterative algorithm.

The Nyquist Theorem With The Determination Of The Spatial Resolution

Figure 1C:
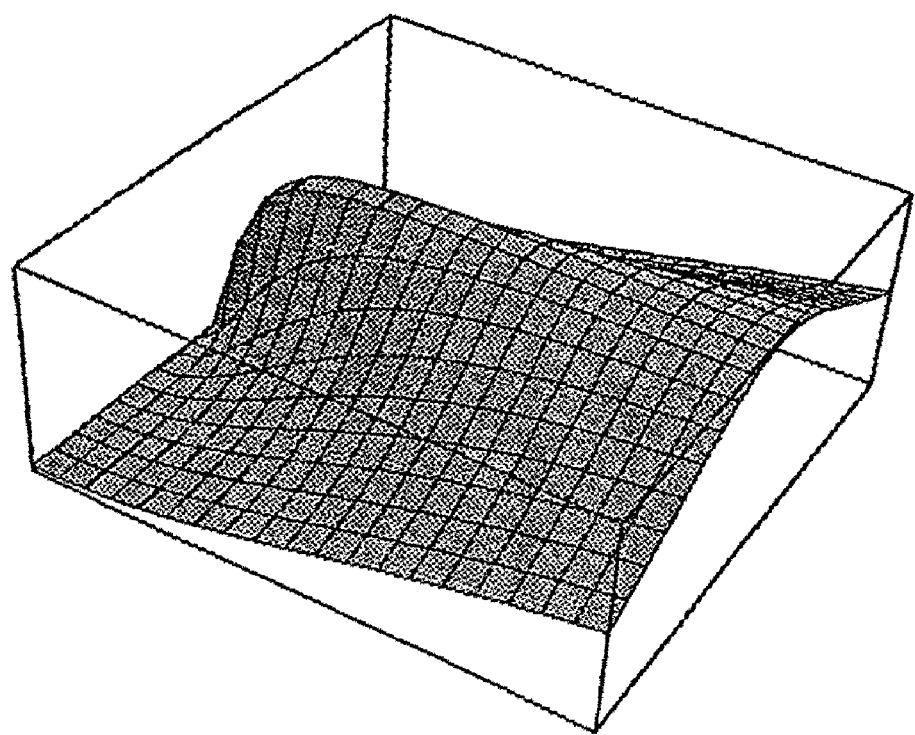
FIG. 1c is a plot of the Fourier transform $H[k_x,k_y,k_z]$ of the system function $h(x,y,z)$ (Eq. (1)) corresponding to the z-component of a magnetic dipole oriented in the z-direction in accordance with the invention.

The derivation of Eq. (41) demonstrates that the system function behaves as a filter of the spectrum of the bulk magnetization function (NMR image). It is well known in the art of signal processing that if such a filter passes all frequencies for which an input function has significant energy, then the input function can be recovered completely from samples of the filtered function taken at the Nyquist rate. This premise embodies the Nyquist Sampling Theorem. The spectrum of the system function (Eq. (1)) is derived in APPENDIX V and shown in FIG. 1c. This function is a band-pass for all frequencies of the bulk magnetization function where $k_\rho$ and $k_z$ are comparable. Thus, the bulk magnetization function can be recovered by sampling the continuous RF field function given by Eq. (40) at the Nyquist rate, twice the highest frequency of the bulk magnetization function, in each spatial dimension over the sample space for which the function has appreciable energy. Sampling operations other than the present operation and the negligible error encountered by not sampling over the entire sample space are discussed in McC. Siebert [11] and the references therein disclosed which are all incorporated herein by reference. In the absence of noise, the spectrum of the bulk magnetization function can be completely recovered if the detector spacing frequency is equal to the Nyquist rate which is twice the highest frequency of the bulk magnetization function, and this represents the limit of resolution. However, the density of the detector spacing is limited by noise. The three-dimensional bulk magnetization map is a reconstruction from independent recordings at independent detector spatial locations relative to the voxels of the image space where two detector signals are independent if they are sufficiently spatially displaced from each other such that the difference in signal between the two detectors due to a test voxel is above the noise level. The resolution based on signal-to-noise arguments is discussed in the Contrast and Limits of Resolution Section.

Contrast and Limits of Resolution

The ability to visualize a structure in a noise-free environment depends, among other factors, on the local contrast C, which is defined as $$C = \frac{\Delta I}{I} \quad (75)$$

where I is the average background intensity and $\Delta I$ is the intensity variation in the region of interest. The main source of NMR image (also called magnetic resonance images (MRI)) contrast is $T_1$ and $T_2$ which depend on tissue types. The contrast may be increased by using RF pulse sequences to polarize the protons which encode $T_1$ (spin/lattice) and $T_2$ (spin/spin) relaxation time information in the data of the secondary RF field in a manner straightforward to those skilled in the NMR art.

Contrast, is not a fundamental limit on visualization since it can be artificially enhanced by, for example, subtracting part of the background or raising the intensity pattern to some power. Noise, however, represents a fundamental limitation on the ability to visualize structures. The signal-to-noise ratio, a basic measure of visualization, is determined by the ratio of the desired intensity variations to the random intensity variations, which are governed by the statistical properties of the system. The signal-to-noise ratio (SNR) is defined as $$SNR = \frac{\Delta I}{\theta_I} = C \frac{\overline{I}}{\theta_I} \quad (76)$$

where $\theta_1$ is the standard deviation of the background intensity representing the rms value of the intensity fluctuations. The noise properties of the 4D-MRI imager involve additive noise only principally from thermal $$\left(\frac{1}{f}\right)$$

noise in the RF measurement circuits of the antennas of the detector array and from the fluctuations of the primary magnetic field.

A feature of superconducting magnets is their extreme stability. The object to be imaged is magnetized with a highly stable magnet such as a superconducting magnet. In this case, a magnetic field stability of $10^{-8}\%$ over a month's time is feasible. Small antennas measure the RF signals as point samples without significant decrease in the signal to noise ratio relative to large antennas by using impedance matching while minimizing resistive losses by using superconducting reactance elements, for example. In an embodiment, cross talk between antennas is ameliorated or eliminated by time multiplexing the signal detection over the array of antennas. External sources of RF noise can be ameliorated by placing the 4D-MRI scanner in a shielded room (Faraday cage).

The quality of the image (i.e. the signal to noise ratio of the image) can be increased by repeating the reconstruction over multiple time points wherein each data set of a given time point is the set of matrices of the intensity variation over the sample space of the RF field of the bulk magnetization M of each voxel having the corresponding magnetic moment at that synchronized (common) time point.

Sources of detector error are random, and the noise averages out as the number of detectors increases. Typically, the noise is suppressed by a factor of the inverse square root of the number of detectors. Thus, the effective limit of RF field detection is increased by a factor of the square root of the number of detectors for a constant SNR.

Figure 3:
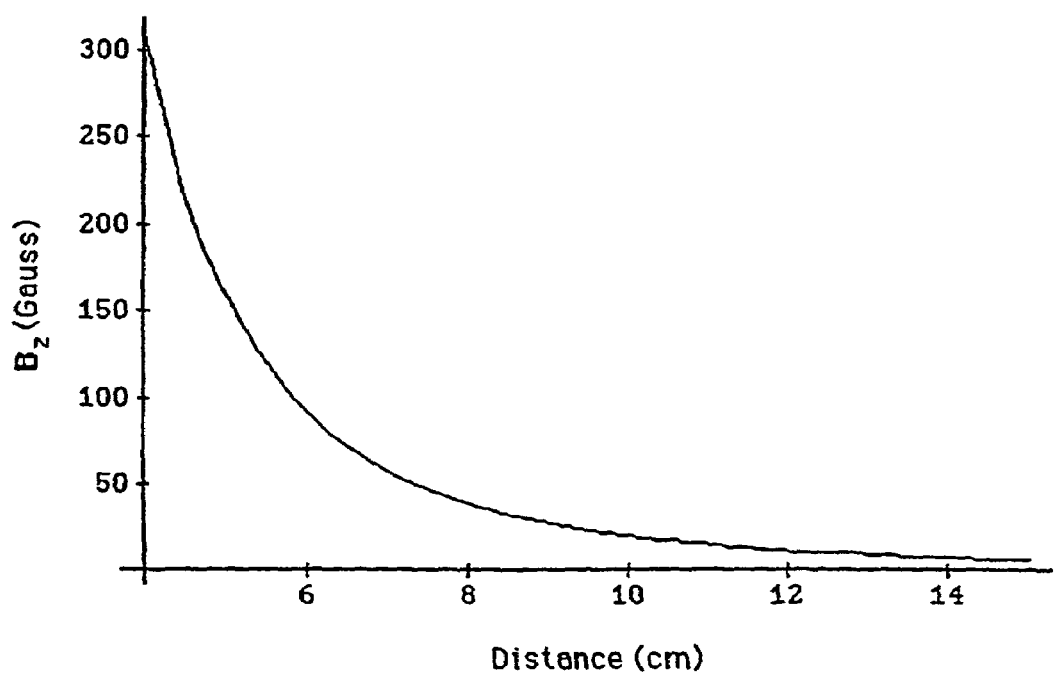
FIG. 3 is the plot of the field of a ring of dipoles of radius R=0.2 cm and magnetic moment $m=10^4$ $Gcm^3$ given by Eq. (I.14) as a function of the distance between the detector at the origin and the center of the ring at the points (0,0, z=4 cm to z=15 cm) in accordance with the invention.
Figure 5:
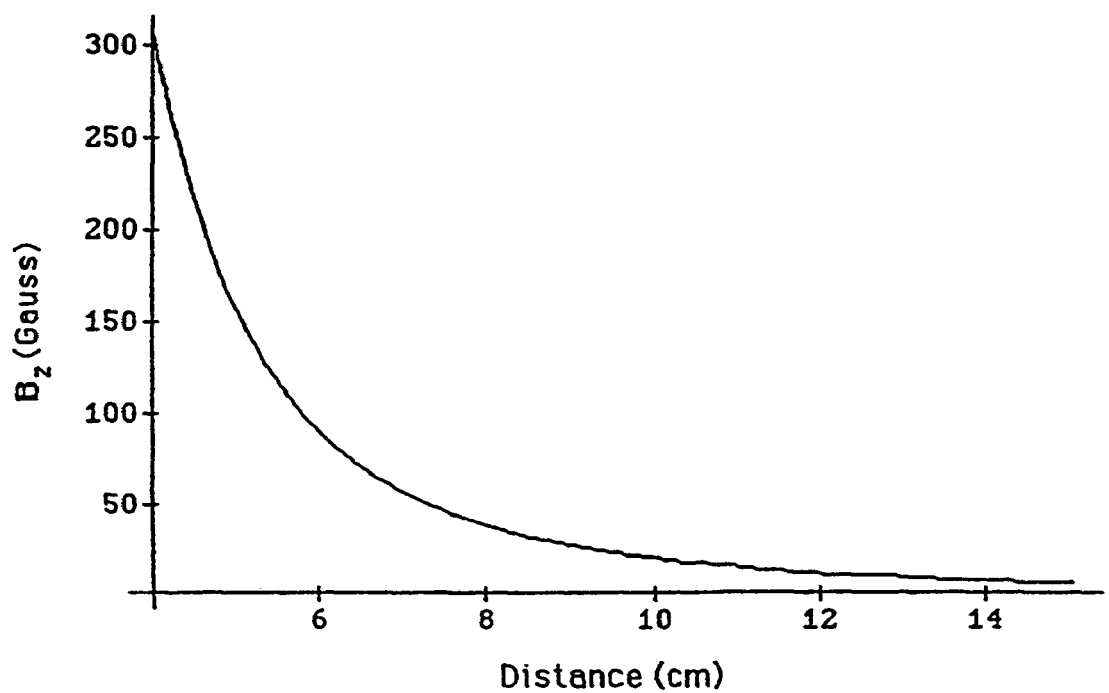
FIG. 5 is the plot of the field of a shell of dipoles of radius R=0.2 cm and magnetic moment $m=10^4$ $Gcm^3$ given by Eq. (II.17) as a function of the distance between the detector at the origin and the center of the shell at the points (0,0, z=4 cm to z=15 cm) in accordance with the invention.
Figure 7:
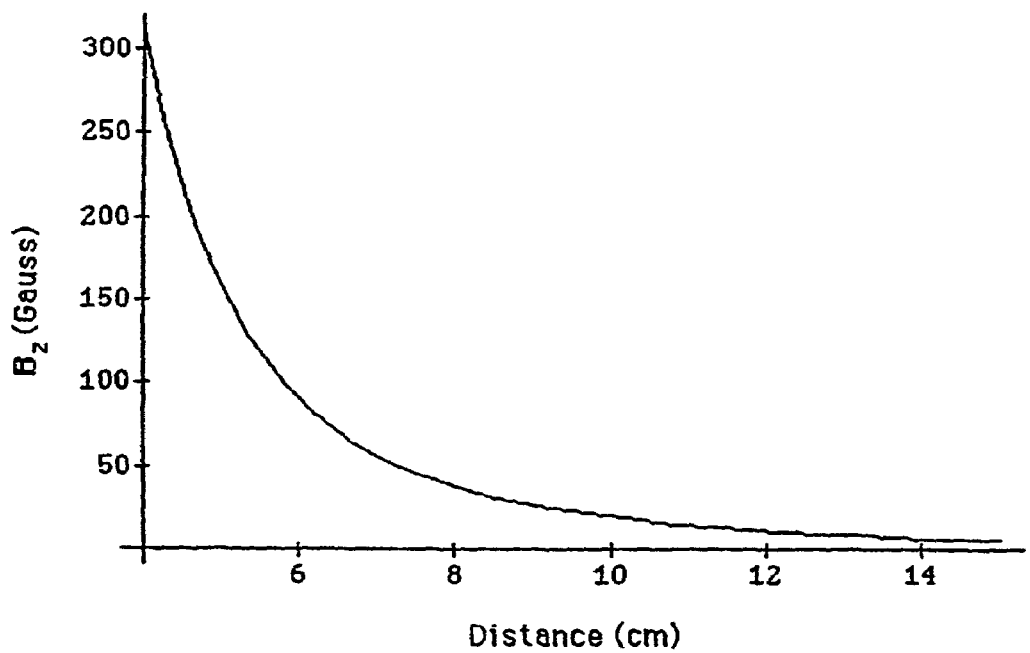
FIG. 7 is the plot of the field of a sphere of dipoles of radius R=0.2 cm and magnetic moment $m=10^4$ $Gcm^3$ given by Eq. (IV.16) as a function of the distance between the detector at the origin and the center of the sphere at the points (0,0, z=4 cm to z=15 cm) in accordance with the invention.

The resolution depends on the extent that the field of the ring, shell, or sphere of dipoles differs from that of a single dipole at the center. The plot of the three cases of the field of a ring, shell, and a sphere of dipoles each of radius R and magnetic moment m=$10^4$ Gcm$^3$ given by Eq. (I.14), Eq. (II.17), and Eq. (IV.16) of APPENDIX I, APPENDIX II, and APPENDIX IV, respectively, as a function of radius R where the position of the center of the ring, shell, and sphere relative to the detector is the point (0,0,10) is given in FIGS. 2, 4, and 6, respectively. The plot of the three cases of the field of a ring, shell, and sphere of dipoles of radius R=0.2 cm and magnetic moment m=$10^4$ Gcm$^3$ given by Eq. (I.14), Eq. (II.17), and Eq. (IV.16) of APPENDIX I, APPENDIX II, and APPENDIX IV, respectively, as a function of the distance between the detector at the origin and the center of the ring, shell, and sphere at the points (0,0, z=4 cm to z=15 cm) is shown in FIGS. 3, 5, and 7, respectively. From FIGS. 2-7, it can be appreciated that the detector must be able to resolve three to four significant figures in order to reconstruct a map of 0.2 cm resolution with a field depth of 15 cm.

Finite Detector Length

The system function, h, of the Reconstruction Algorithm Section is the impulse response for a point detector. The following analysis will concern the impulse response for an NMR detector which has finite dimensions. Consider a detector array 401 as shown in FIG. 12 comprising multiple parallel planes 402 wherein each plane has a plurality of antennae coils 403 wherein each has an area A. The signal at any coil 403 is given by the integral of Eq. (40) over the area of the coil. This is the impulse response which is the system function which replaces h for a finite area detector. The Fourier Transform of this system function contains an argument of a product of the detector area A and the spatial frequency variables. Reconstruction could be performed as previously described in the Reconstruction Algorithm Section where this system function is substituted for the system function for a point detector. In the limit of zero area, the measurement is that of a point sample. Thus, another approach is to use the linearity of the superposition of RF signal to gain a higher signal to noise ratio advantage by taking the difference of relatively large signals as opposed to performing the measurements with miniature antennas. In this case, the set of n coils each of area A of each plane comprise a grid of n blocks each of area a<<A formed by the absence of common area overlap of one or more of the coils. The signal of each element of the grid of area a can be solved by the set of linear difference equations of the signals of coils each of area A that corresponds to the noncommon area for the overlapping coils. The solution of the signals due to the grid elements can be obtain using a computer by matrix inversion.

The resulting values represent the average signal for each grid center location. The effect of this data processing operation on the spectrum can be modeled as a sample and hold, where the voltages at the centers of the grid elements are sampled by multiplying by a picket fence of delta functions spaced s units apart which are convolved with d, a square wave function in the x-direction and the y-direction of width s units where the coordinates of Eq. (1) and FIG. 9 are used. In the frequency domain, this data processing operation causes the spectrum of the signal function s to be multiplied by D, the Fourier Transform of the square wave function of width s units, to form function S*. If this multiplication does not multiply S, the Fourier Transform of the signal function, s, by zero for any frequency less than its bandwidth, then S can be recovered from S* by multiplying S* with the inverse of the Fourier transform of the sample and hold square wave function, a two dimensional sinc function for the x and y-directions. This analysis applies to all axes in which direction the detectors have finite length. Furthermore, z-sampling is achieved by translating the array in the z-direction by interval distances at which points discrete signals are recorded or by using multiple parallel plane detector arrays spaced at the sampling interval along the z-axis. However, if the signals are not sampled at discrete z-points, but each sample point is the integral resultant of the signal acquired continuously over a z-displacement of q units which is much greater than the dimension of the detector in the z-direction, then the corresponding sample and hold square wave has a width of q units.

It will thus be seen that the invention efficiently attains the objects set forth above, among those made apparent from the preceding description. Since certain changes may made in the above constructions without departing from the scope of the invention, it is intended that all matter contained in the above description or shown in the accompanying drawings be interpreted as illustrative and not in a limiting sense. In particular, other methods such as electronic and optical methods of detection of magnetic resonance are within the scope of the present invention.

While the claimed invention has been described in detail and with reference to specific embodiments thereof, it will be apparent to one of ordinary skill in the art that various changes and modifications can be made to the claimed invention without departing from the spirit and scope thereof.

APPENDIX I

Integration of a RING of Dipoles

Derivation of the Field Produced by a Ring of Magnetic Dipoles

The $\vec{z}$-component of the magnetic field due to a dipole or a loop of current of radius R with dipole moment $m = i\pi R^2$ at the origin is given as follows:

$$B_z = m \left[ \frac{2z^2 - x^2 - y^2}{(x^2 + y^2 + z^2)^{5/2}} \right] \quad (I.1)$$

The $\vec{z}$-component of the magnetic field at the position (x,y,z) due to a ring of dipoles of radius R with dipole density $$\frac{m}{2\pi R}$$

centered at the origin is $$B_z = \frac{m}{2\pi R} \int_0^{2\pi} \frac{(2(z-z')^2 - (x-x')^2 - (y-y')^2) R d\phi}{((x-x')^2 + (y-y')^2 + (z-z')^2)^{5/2}} \quad (I.2)$$

wherein (x',y',z') is a variable which corresponds to the position of each individual dipole of the ring. The relationship between Cartesian coordinates and cylindrical coordinates with z'=0 is $$r = \sqrt{x^2 + y^2 + z^2} \quad R = \sqrt{x'^2 + y'^2 + z'^2} \quad (I.3)$$

$$x' = R\cos\phi$$

$$y' = R\sin\phi$$

Substitution of Eq. (I.3) into Eq. (I.2) gives $$B_z = \frac{m}{2\pi} \int_0^{2\pi} \frac{(2z^2 - (x - R\cos\phi)^2 - (y - R\sin\phi)^2) d\phi}{((x - R\cos\phi)^2 + (y - R\sin\phi)^2 + z^2)^{5/2}} \quad (I.4)$$

Multiplying out terms gives $$B_z = \frac{m}{2\pi} \int_0^{2\pi} \frac{(2z^2 - (x^2 + R^2\cos^2\phi - 2xR\cos\phi) - (y^2 + R^2\sin^2\phi - 2yR\sin\phi)) d\phi}{((x^2 + R^2\cos^2\phi - 2xR\cos\phi) + (y^2 + R^2\sin^2\phi - 2yR\sin\phi) + z^2))} \quad (I.5)$$

Substitution of Eq. (I.3) in the denominator and using the associative relationship and the trigonometric identity, $\cos^2\alpha + \sin^2\alpha = 1$ in the denominator gives $$B_z = \frac{m}{2\pi}\int_0^{2\pi} \frac{(2z^2 - (x^2 + R^2\cos^2\phi - 2xR\cos\phi) - (y^2 + R^2\sin^2\phi - 2yR\sin\phi))d\phi}{(r^2 + R^2 - 2R(x\cos\phi + y\sin\phi))^{5/2}} \quad (I.6)$$

The denominator can be approximated using the following relationship $$(a+b)^n \cong a^n + nba^{n-1} \quad (I.7)$$

where $$a = r^2 + R^2 \quad (I.8)$$

$$b = -2R(x\cos\phi + y\sin\phi) \quad (I.9)$$

and $$n = -5/2 \quad (I.10)$$

This case gives the far field where a<<b and/or r>>R. Using Eqs. (I.7-I.10) gives $$(r^2 + R^2 - 2R(x\cos\phi + y\sin\phi))^{-5/2} \cong \quad (I.11)$$
$$\frac{1}{(r^2+R^2)^{5/2}} + \frac{5R}{(r^2+R^2)^{7/2}}(x\cos\phi + y\sin\phi)$$

Substitution of Eq. (I.11) into Eq. (I.6) gives $$B_z = \frac{m}{2\pi}\int_0^{2\pi} 2z^2 \left[\frac{1}{(r^2+R^2)^{5/2}} + \frac{5R}{(r^2+R^2)^{7/2}}(x\cos\phi + y\sin\phi)\right]d\phi - \quad (I.12)$$
$$\frac{m}{2\pi}\int_0^{2\pi}\left[\frac{x^2}{(r^2+R^2)^{5/2}} + \frac{R^2\cos^2\phi}{(r^2+R^2)^{5/2}} - \frac{2xR\cos\phi}{(r^2+R^2)^{5/2}}\right]d\phi -$$
$$\frac{m}{2\pi}\int_0^{2\pi}\left[\frac{5Rx^3\cos\phi}{(r^2+R^2)^{7/2}} + \frac{5Rx^2y\sin\phi}{(r^2+R^2)^{7/2}} + \frac{5R^3x\cos^3\phi}{(r^2+R^2)^{7/2}} + \frac{5R^3y\cos^2\phi\sin\phi}{(r^2+R^2)^{7/2}} - \frac{10x^2R^2\cos^2\phi}{(r^2+R^2)^{7/2}} - \frac{10xyR^2\cos\phi\sin\phi}{(r^2+R^2)^{7/2}}\right]d\phi -$$
$$\frac{m}{2\pi}\int_0^{2\pi}\left[\frac{y^2}{(r^2+R^2)^{5/2}} + \frac{R^2\sin^2\phi}{(r^2+R^2)^{5/2}} - \frac{2yR\sin\phi}{(r^2+R^2)^{5/2}}\right]d\phi -$$
$$\frac{m}{2\pi}\int_0^{2\pi}\left[\frac{5Ry^2x\cos\phi}{(r^2+R^2)^{7/2}} + \frac{5Ry^3\sin\phi}{(r^2+R^2)^{7/2}} + \frac{5R^3x\cos\phi\sin^2\phi}{(r^2+R^2)^{7/2}} + \frac{5R^3y\sin^3\phi}{(r^2+R^2)^{7/2}} - \frac{10R^2xy\cos\phi\sin\phi}{(r^2+R^2)^{7/2}} - \frac{10R^2y^2\sin^2\phi}{(r^2+R^2)^{7/2}}\right]d\phi$$

The integration of Eq. (I.12) gives $$B_z = \frac{m}{2\pi}\left\{\frac{4\pi z^2}{(r^2+R^2)^{5/2}} - \frac{2\pi x^2}{(r^2+R^2)^{5/2}} - \frac{\pi R^2}{(r^2+R^2)^{5/2}} + \quad (I.13)\right.$$
$$\left.\frac{10\pi x^2 R^2}{(r^2+R^2)^{7/2}} - \frac{2\pi y^2}{(r^2+R^2)^{5/2}} - \frac{\pi R^2}{(r^2+R^2)^{5/2}} + \frac{10\pi R^2 y^2}{(r^2+R^2)^{7/2}}\right\}$$

Collecting Terms Gives

Ring of Dipoles:

$$B_z \cong m\left\{\left[\frac{2z^2 - x^2 - y^2}{(r^2+R^2)^{5/2}}\right] - \left[\frac{R^2}{(r^2+R^2)^{5/2}}\right] + \left[\frac{5R^2(x^2+y^2)}{(r^2+R^2)^{7/2}}\right]\right\} \quad (I.14)$$

Eq. (I.14) demonstrates that the magnetic field of a ring of dipoles is not equal to that of a single dipole at the origin. The ring radius, R, appears in the denominator of each term. The first term is the magnetic field of a dipole at the origin only when the variable corresponding to the radius of the ring, R, is zero. The second and third terms are additional perturbations of the field of a dipole at the origin whose magnitude is a function of the radius of the ring. The second and third terms vanish only when the radius of the ring is zero. A ring of dipoles has a field that is cylindrically symmetrical. A shell, a cylinder, and a sphere of dipoles are the only other cases which have this symmetry. A cylinder is a linear combination of rings. Thus, the uniqueness of the dipole field is demonstrated by showing that it is different from that of a ring, a shell, and a sphere. The present result that the field of a dipole is different for that of a ring of dipoles as well as the same result in the cases of a shell and a sphere of dipoles shown in APPENDS II and APPENDIX IV, respectively, demonstrate that dipole field is unique. All other fields are a linear combination of dipoles. Thus, the dipole is a basis element for the reconstruction of a NMR image. The resolution depends on the extent that the field of the zing of dipoles differs from that of a single dipole at the origin. The plot of the field of a ring of dipoles of radius R and magnetic moment $m = 10^4$ Gcm$^3$ given by Eq. (I.14) as a function of radius R is given in FIG. 2. The position of the center of the ring relative to the detector is the point (0,0,10). The plot of the field of a ring of dipoles of radius R=0.2 cm and magnetic moment $m = 10^4$ Gcm$^3$ given by Eq. (I.14) as a function of the distance between the detector at the origin and the center of the ring at the points (0,0, z=4 cm to z=15 cm) is shown in FIG. 3. From FIGS. 2 and 3 it can be appreciated that the detector must be able to resolve three to four significant figures in order to reconstruct a map of 0.2 cm resolution with a field depth of 15 cm.

APPENDIX II
Integration of a Spherical Shell of Dipoles
Derivation of the Field Produced by a Shell of Magnetic Dipoles The $\vec{z}$-component of the magnetic field due to a dipole or a loop of current of radius R with dipole moment $m = i\pi R^2$ at the origin is given as follows:

$$B_z = m\left[\frac{2z^2 - x^2 - y^2}{(x^2 + y^2 + z^2)^{5/2}}\right] \tag{II.1}$$

The $\vec{z}$-component of the magnetic field at the position (x,y,z) due to a shell of dipoles of radius R with dipole density $$\frac{m}{4\pi R^2}$$

centered at the origin is $$B_z = \frac{m}{4\pi R^2} \int_0^{2\pi} \int_0^{\pi} \frac{(2(z-z')^2 - (x-x')^2 - (y-y')^2) R^2 \sin\phi \, d\phi \, d\theta}{((x-x')^2 + (y-y')^2 + (z-z')^2)^{5/2}} \tag{II.2}$$

wherein (x',y',z') is a variable which corresponds to the position of each individual dipole of the shell. The relationship between Cartesian coordinates and spherical coordinates is $$\rho = \sqrt{x^2 + y^2 + z^2} \quad R = \sqrt{x'^2 + y'^2 + z'^2} \tag{II.3}$$
$$x = \rho\sin\phi\cos\theta \quad x' = R\sin\phi\cos\theta$$
$$y = \rho\sin\phi\sin\theta \quad y' = R\sin\phi\sin\theta$$

Substitution of Eq. (II.3) into Eq. (II.2) gives $$B_z = \frac{m}{4\pi R^2} \int_0^{2\pi} \int_0^{\pi} \frac{(2(z - R\cos\phi)^2 - (x - R\sin\phi\cos\theta)^2 - (y - R\sin\phi\sin\theta)^2) R^2 \sin\phi \, d\phi \, d\theta}{((x - R\sin\phi\cos\theta)^2 + (y - R\sin\phi\sin\theta)^2 + (z - R\cos\phi)^2)^{5/2}} \tag{II.4}$$

Multiplying out terms gives $$B_z = \frac{m}{4\pi R^2} \int_0^{2\pi} \int_0^{\pi} \frac{\begin{array}{c}(2z^2 - 4zR\cos\phi + 2R^2\cos^2\phi - x^2 + 2xR\sin\phi\cos\theta - \\ R^2\sin^2\phi\cos^2\theta - y^2 + 2yR\sin\phi\sin\theta - R^2\sin^2\phi\sin^2\theta) R^2 \sin\phi \, d\phi \, d\theta\end{array}}{(x^2 - 2xR\sin\phi\cos\theta + R^2\sin^2\phi\cos^2\theta + y^2 - 2yR\sin\phi\sin\theta + R^2\sin^2\phi\sin^2\theta + z^2 - 2zR\cos\phi + R^2\cos^2\phi)^{5/2}} \tag{II.5}$$

Multiplying out the $R^2 \sin\phi$ term gives $$B_z = \frac{m}{4\pi R^2} \int_0^{2\pi} \int_0^{\pi} \frac{\begin{array}{c}(2R^2 z^2 \sin\phi - 4zR^3 \sin\phi\cos\phi + 2R^4\cos^2\phi\sin\phi - x^2 R^2\sin\phi + 2xR^3\sin^2\phi\cos\theta - \\ R^4\sin^3\phi\cos^2\theta - y^2 R^2\sin\phi + 2yR^3\sin^2\phi\sin\theta - R^4\sin^3\phi\sin^2\theta) d\phi \, d\theta\end{array}}{\begin{array}{c}(x^2 - 2xR\sin\phi\cos\theta + R^2\sin^2\phi\cos^2\theta + y^2 - 2yR\sin\phi\sin\theta + \\ R^2\sin^2\phi\sin^2\theta + z^2 - 2zR\cos\phi + R^2\cos^2\phi)^{5/2}\end{array}} \tag{II.6}$$

Substitution of Eq. (II.3) in the denominator gives $$B_z = \frac{m}{4\pi R^2} \int_0^{2\pi} \int_0^{\pi} \frac{\begin{array}{c}(2R^2z^2\sin\phi - 4zR^3\sin\phi\cos\phi + 2R^4\cos^2\phi\sin\phi - x^2R^2\sin\phi + 2xR^3\sin^2\phi\cos\theta - \\ R^4\sin^3\phi\cos^2\theta - y^2R^2\sin\phi + 2yR^3\sin^2\phi\sin\theta - R^4\sin^3\phi\sin^2\theta)d\phi d\theta\end{array}}{(\rho^2 - 2xR\sin\phi\cos\theta + R^2\sin^2\phi\cos^2\theta - 2yR\sin\phi\sin\theta + R^2\sin^2\phi\sin^2\theta - 2zR\cos\phi + R^2\cos^2\phi)^{5/2}} \qquad (II.7)$$

Using the associative relationship and using the trigonometric identity, $\cos^2\alpha + \sin^2\alpha = 1$ in the denominator gives $$B_z = \frac{m}{4\pi R^2} \int_0^{2\pi} \int_0^{\pi} \frac{\begin{array}{c}(2R^2z^2\sin\phi - 4zR^3\sin\phi\cos\phi + 2R^4\cos^2\phi\sin\phi - x^2R^2\sin\phi + 2xR^3\sin^2\phi\cos\theta - \\ R^4\sin^3\phi\cos^2\theta - y^2R^2\sin\phi + 2yR^3\sin^2\phi\sin\theta - R^4\sin^3\phi\sin^2\theta)d\phi d\theta\end{array}}{(\rho^2 + R^2 - 2xR\sin\phi\cos\theta - 2yR\sin\phi\sin\theta - 2zR\cos\phi)^{5/2}} \qquad (II.8)$$

The denominator can be approximated using the following relationship $$(a+b)^n \cong a^n + nba^{n-1} \qquad (II.9)$$

where $$a = \rho^2 + R^2 \qquad (II.10)$$

$$b = -2xR\sin\phi\cos\theta - 2yR\sin\phi\sin\theta - 2zR\cos\phi \qquad (II.11)$$

and $$n = -5/2 \qquad (II.12)$$

This case gives the far field where $a \ll b$ and/or $\rho \gg R$. Using Eqs. (II.8–II.12) gives $$(\rho^2 + R^2 - 2xR\sin\phi\cos\theta - 2yR\sin\phi\sin\theta - 2zR\cos\phi)^{-5/2} \cong \qquad (II.13)$$

$$\frac{1}{(\rho^2 + R^2)^{5/2}} + \frac{5R}{(\rho^2 + R^2)^{7/2}}(x\sin\phi\cos\theta + y\sin\phi\sin\theta + z\cos\phi)$$

Substitution of Eq. (II.13) into Eq. (II.8) gives $$B_z = \frac{m}{4\pi R^2} \int_0^{2\pi} \int_0^{\pi} \left[ \frac{2R^2z^2\sin\phi}{(\rho^2+R^2)^{5/2}} + \frac{10R^3z^2\sin\phi}{(\rho^2+R^2)^{7/2}}(x\sin\phi\cos\theta + y\sin\phi\sin\theta + z\cos\phi) - \right. \qquad (II.14)$$

$$\frac{4zR^3\sin\phi\cos\phi}{(\rho^2+R^2)^{5/2}} - \frac{20zR^4\sin\phi\cos\phi}{(\rho^2+R^2)^{7/2}}(x\sin\phi\cos\theta + y\sin\phi\sin\theta + z\cos\phi) +$$

$$\frac{2R^4\cos^2\phi\sin\phi}{(\rho^2+R^2)^{5/2}} + \frac{10R^5\cos^2\phi\sin\phi}{(\rho^2+R^2)^{7/2}}(x\sin\phi\cos\theta + y\sin\phi\sin\theta + z\cos\phi) -$$

$$\frac{x^2R^2\sin\phi}{(\rho^2+R^2)^{5/2}} - \frac{5x^2R^3\sin\phi}{(\rho^2+R^2)^{7/2}}(x\sin\phi\cos\theta + y\sin\phi\sin\theta + z\cos\phi) + \frac{2xR^3\sin^2\phi\cos\theta}{(\rho^2+R^2)^{5/2}} -$$

$$\frac{10xR^4\sin^2\phi\cos\theta}{(\rho^2+R^2)^{7/2}}(x\sin\phi\cos\theta + y\sin\phi\sin\theta + z\cos\phi) - \frac{R^4\sin^3\phi\cos^2\theta}{(\rho^2+R^2)^{5/2}} - \frac{5R^5\sin^3\phi\cos^2\theta}{(\rho^2+R^2)^{7/2}}$$

$$(x\sin\phi\cos\theta + y\sin\phi\sin\theta + z\cos\phi) - \frac{y^2R^2\sin\phi}{(\rho^2+R^2)^{5/2}} - \frac{5y^2R^3\sin\phi}{(\rho^2+R^2)^{7/2}}(x\sin\phi\cos\theta + y\sin\phi\sin\theta + z\cos\phi) +$$

$$\frac{2yR^3\sin^2\phi\sin\theta}{(\rho^2+R^2)^{5/2}} + \frac{10yR^4\sin^2\phi\sin\theta}{(\rho^2+R^2)^{7/2}}(x\sin\phi\cos\theta + y\sin\phi\sin\theta + z\cos\phi) -$$

$$\left. \frac{R^4\sin^3\phi\sin^2\theta}{(\rho^2+R^2)^{5/2}} - \frac{5R^5\sin^3\phi\sin^2\theta}{(\rho^2+R^2)^{7/2}}(x\sin\phi\cos\theta + y\sin\phi\sin\theta + z\cos\phi) \right] d\phi d\theta$$

The integral of a sum is equal to the sum of the integrals.

$$B_z = \frac{m}{4\pi R^2} \left\{ \int_0^{2\pi}\int_0^{\pi}\left[\frac{2R^2 z^2 \sin\phi}{(\rho^2+R^2)^{5/2}} + \frac{10R^3 z^2 \sin\phi}{(\rho^2+R^2)^{7/2}}(x\sin\phi\cos\theta + y\sin\phi\sin\theta + z\cos\phi)\right]d\phi d\theta - \right.$$ (II.15)

$$\int_0^{2\pi}\int_0^{\pi}\left[\frac{4zR^3\sin\phi\cos\phi}{(\rho^2+R^2)^{5/2}} + \frac{20zR^4\sin\phi\cos\phi}{(\rho^2+R^2)^{7/2}}(x\sin\phi\cos\theta + y\sin\phi\sin\theta + z\cos\phi)\right]d\phi d\theta +$$

$$\int_0^{2\pi}\int_0^{\pi}\left[\frac{2R^4\cos^2\phi\sin\phi}{(\rho^2+R^2)^{5/2}} + \frac{10R^5\cos^2\phi\sin\phi}{(\rho^2+R^2)^{7/2}}(x\sin\phi\cos\theta + y\sin\phi\sin\theta + z\cos\phi)\right]d\phi d\theta -$$

$$\int_0^{2\pi}\int_0^{\pi}\left[\frac{x^2 R^2 \sin\phi}{(\rho^2+R^2)^{5/2}} + \frac{5x^2 R^3 \sin\phi}{(\rho^2+R^2)^{7/2}}(x\sin\phi\cos\theta + y\sin\phi\sin\theta + z\cos\phi)\right]d\phi d\theta +$$

$$\int_0^{2\pi}\int_0^{\pi}\left[\frac{2xR^3\sin^2\phi\cos\theta}{(\rho^2+R^2)^{5/2}} + \frac{10xR^4\sin^2\phi\cos\theta}{(\rho^2+R^2)^{7/2}}(x\sin\phi\cos\theta + y\sin\phi\sin\theta + z\cos\phi)\right]d\phi d\theta -$$

$$\int_0^{2\pi}\int_0^{\pi}\left[\frac{R^4\sin^3\phi\cos^2\theta}{(\rho^2+R^2)^{5/2}} + \frac{5R^5\sin^3\phi\cos^2\theta}{(\rho^2+R^2)^{7/2}}(x\sin\phi\cos\theta + y\sin\phi\sin\theta + z\cos\phi)\right]d\phi d\theta -$$

$$\int_0^{2\pi}\int_0^{\pi}\left[\frac{y^2 R^2 \sin\phi}{(\rho^2+R^2)^{5/2}} + \frac{5y^2 R^3 \sin\phi}{(\rho^2+R^2)^{7/2}}(x\sin\phi\cos\theta + y\sin\phi\sin\theta + z\cos\phi)\right]d\phi d\theta +$$

$$\int_0^{2\pi}\int_0^{\pi}\left[\frac{2yR^3\sin^2\phi\sin\theta}{(\rho^2+R^2)^{5/2}} + \frac{10yR^4\sin^2\phi\sin\theta}{(\rho^2+R^2)^{7/2}}(x\sin\phi\cos\theta + y\sin\phi\sin\theta + z\cos\phi)\right]d\phi d\theta -$$

$$\left. \int_0^{2\pi}\int_0^{\pi}\left[\frac{R^4\sin^3\phi\sin^2\theta}{(\rho^2+R^2)^{5/2}} + \frac{5R^5\sin^3\phi\sin^2\theta}{(\rho^2+R^2)^{7/2}}(x\sin\phi\cos\theta + y\sin\phi\sin\theta + z\cos\phi)\right]d\phi d\theta \right\}$$

The integration of Eq. (II.15) gives $$B_z = \frac{m}{4\pi R^2}\left\{ \frac{8\pi z^2 R^2}{(\rho^2+R^2)^{5/2}} - \frac{80\pi z^2 R^4}{3(\rho^2+R^2)^{7/2}} + \frac{8\pi R^4}{3(\rho^2+R^2)^{5/2}} - \right.$$ (II.16)

$$\frac{4\pi x^2 R^2}{(\rho^2+R^2)^{5/2}} + \frac{40\pi x^2 R^4}{3(\rho^2+R^2)^{7/2}} - \frac{4\pi R^4}{3(\rho^2+R^2)^{5/2}} -$$

$$\left. \frac{4\pi y^2 R^2}{3(\rho^2+R^2)^{5/2}} + \frac{40\pi y^2 R^4}{3(\rho^2+R^2)^{7/2}} - \frac{4\pi R^4}{3(\rho^2+R^2)^{5/2}} \right\}$$

Collecting terms gives

Shell of Dipoles:

$$B_z = \frac{m}{4\pi R^2}\left\{4\pi R^2\left[\frac{2z^2 - x^2 - y^2}{(\rho^2+R^2)^{5/2}}\right] - \frac{40\pi R^4}{3}\left[\frac{2z^2 - x^2 - y^2}{(\rho^2+R^2)^{7/2}}\right]\right\}$$ (II.17)

Eq. (II.17) demonstrates that the magnetic field of a shell of dipoles is not equal to that of a single dipole at the origin. The shell radius, R, appears in the denominator of the first term. The first term is the magnetic field of a dipole at the origin only when the variable corresponding to the radius of the shell, R, is zero. The second term is an additional perturbation of the field of a dipole at the origin whose magnitude is a function of the radius of the shell. The second term vanishes only when the radius of the shell is zero. Thus, the dipole is a basis element for the reconstruction of a NMR image. The resolution depends on the extent that the field of the shell of dipoles differs from that of a single dipole at the origin. The plot of the field of a shell of dipoles of radius R and magnetic moment m=$10^4$ Gcm$^3$ given by Eq. (II.17) as a function of radius R is given in FIG. 4. The position of the center of the shell relative to the detector is the point (0,0,10). The plot of the field of a shell of dipoles of radius R=0.2 cm and magnetic moment m=$10^4$ Gcm$^3$ given by Eq. (II.17) as a function of the distance between the detector at the origin and the center of the shell at the points (0,0, z) is shown in FIG. 5. From FIGS. 4 and 5 it can be appreciated that the detector must be able to resolve three to four significant figures in order to reconstruct a map of 0.2 cm resolution with a field depth of 15 cm.

APPENDIX III

Proof that the Field Produced by a Shell of Magnetic Dipoles is Different from that of a Single Dipole Consider Eq. (II.5).

$$B_z = \frac{m}{4\pi R^2} \int_0^{2\pi} \int_0^{\pi} \frac{\begin{pmatrix} 2z^2 - 4zR\cos\phi + 2R^2\cos^2\phi - x^2 + 2xR\sin\phi\cos\theta - \\ R^2\sin^2\phi\cos^2\theta - y^2 + 2yR\sin\phi\sin\theta - R^2\sin^2\phi\sin^2\theta \end{pmatrix} R^2\sin\phi \, d\phi \, d\theta}{(x^2 - 2xR\sin\phi\cos\theta + R^2\sin^2\phi\cos^2\theta + y^2 - 2yR\sin\phi\sin\theta + R^2\sin^2\phi\sin^2\theta + z^2 - 2zR\cos\phi + R^2\cos^2\phi)^{5/2}} \quad \text{(III.1)}$$

The conditions for this integral to equal that of the field of a dipole at the origin are $$-4zR\cos\phi + 2R^2\cos^2\phi + 2xR\sin\phi\cos\theta - R^2\sin^2\phi\cos^2\theta + 2yR\sin\phi\sin\theta - R^2\sin^2\phi\sin^2\theta = 0 \quad \text{(III.2)}$$

and $$-2xR\sin\phi\cos\theta + R^2\sin^2\phi\cos^2\theta - 2yR\sin\phi\sin\theta + R^2\sin^2\phi\sin^2\theta - 2zR\cos\phi + R^2\cos^2\phi = 0 \quad \text{(III.3)}$$

Thus, Eq. (III.2) must equal Eq. (III.3).

$$-4zR\cos\phi + 2R^2\cos^2\phi + 2xR\sin\phi\cos\theta - R^2\sin^2\phi\cos^2\theta + 2yR\sin\phi\sin\theta - R^2\sin^2\phi\sin^2\theta = -2xR\sin\phi\cos\theta + R^2\sin^2\phi\cos^2\theta - 2yR\sin\phi\sin\theta + R^2\sin^2\phi\sin^2\theta - 2zR\cos\phi + R^2\cos^2\phi \quad \text{(III.4)}$$

Therefore, $$-2zR\cos\phi + R^2\cos^2\phi - 2R^2\sin^2\phi\cos^2\theta + 4x\sin\phi\cos\theta + 4yR\sin\phi\sin\theta - 2R^2\sin^2\phi\sin^2\theta = 0 \quad \text{(III.5)}$$

Using the associative relationship and the trigonometric identity, $\cos^2\alpha + \sin^2\alpha = 1$ as well as factoring out an R in Eq. (III.5) gives $$-2zR\cos\phi + R^2\cos^2\phi - 2R^2\sin^2\phi + 4x\sin\phi\cos\theta + 4yR\sin\phi\sin\theta = 0 \quad \text{(III.6)}$$

$$-2z\cos\phi + 3R\cos^2\phi - 2R + 4x\sin\phi\cos\theta + 4y\sin\phi\sin\theta = 0 \quad \text{(III.7)}$$

For $x \neq 0$, $y \neq 0$, $z \neq 0$, Eq. (III.7) is true only if R=0 which proves that the field of a shell of dipoles centered on the origin is different from that of a single dipole at the origin.

Eq. (III.5) can not be integrated in closed form; however, the integral can be approximated so that the detector tolerances for a given image resolution can be determined. The denominator of Eq. (III.5) can be approximated using the following relationship $$(a+b)^n \approx a^n + nba^{n-1} \quad \text{(III.8)}$$

where $$a = \rho^2 + R^2 \quad \text{(III.9)}$$

$$b = -2xR\sin\phi\cos\theta - 2yR\sin\phi\sin\theta - 2zR\cos\phi \quad \text{(III.10)}$$

and $$n = -5/2 \quad \text{(III.11)}$$

The result given by Eq. (II.17) is $$B_z = \frac{m}{4\pi R^2} \left\{ 4\pi R^2 \left[ \frac{2z^2 - x^2 - y^2}{(\rho^2 + R^2)^{5/2}} \right] - \frac{40\pi R^4}{3} \left[ \frac{2z^2 - x^2 - y^2}{(\rho^2 + R^2)^{7/2}} \right] \right\} \quad \text{(III.12)}$$

Higher order terms of the approximation given by Eq. (III.8) would contain mixed products of the coordinate variables which would increase the deviation of the derivation of the field a shell of dipoles from that of a single dipole at the origin.

APPENDIX IV

Integration of a Sphere of Dipoles

Derivation of the Field Produced by a Sphere of Magnetic Dipoles

The $\vec{z}$-component of the magnetic field due to a sphere of dipoles is derived using the equation for a shell of dipoles with the substitution of the dipole density of the sphere $$\frac{3m}{4\pi R^3}$$

where the radius of the sphere is R. The field of a shell of dipoles is given approximately by Eq. (II.17) of the Derivation of the Field Produced by a Shell of Magnetic Dipoles Section $$B_z = \frac{m}{4\pi r^2} \left\{ 4\pi r^2 \left[ \frac{2z^2 - x^2 - y^2}{(\rho^2 + r^2)^{5/2}} \right] - \frac{40\pi r^4}{3} \left[ \frac{2z^2 - x^2 - y^2}{(\rho^2 + r^2)^{7/2}} \right] \right\} \quad \text{(IV.1)}$$

where the radius of the shell is r (The parameter r replaces the constant R of Eq. (II.17) as the radius of the shell.). For small r, the first term of Eq. (IV.1) dominates and is used to approximately calculate the $\vec{z}$-component of the magnetic field due to a sphere of $\vec{z}$-oriented dipoles as follows:

A sphere of dipoles is equivalent to the integral over concentric shells of dipoles each of radius r where $0 \leq r \leq R$. Thus, the $\vec{z}$-component of the magnetic field due to a sphere of dipoles is the integral of the field of the shells given by Eq. (IV.1).

$$B_z = \frac{m}{4/3\pi R^3} 4\pi \int_0^R \left[ \frac{2z^2 - x^2 - y^2}{(\rho^2 + r^2)^{5/2}} \right] r^2 dr \tag{IV.2}$$

Let $$\frac{r}{\rho} = \tan\theta; \quad dr = \rho \sec^2\theta \, d\theta \tag{IV.3}$$

and using the trigonometric identity $$1 + \tan^2\theta = \sec^2\theta \tag{IV.4}$$

Eq. (IV.2) becomes $$B_z = (2z^2 - x^2 - y^2) \frac{m}{\frac{4}{3}\pi R^3} \int_0^R \frac{4\pi}{\rho^2} \frac{\tan^2\theta}{\sec^5\theta} \sec^2\theta \, d\theta \tag{IV.5}$$

Substitution in of $$\tan\theta = \frac{\sin\theta}{\cos\theta} \tag{IV.6}$$

and $$\sec\theta = \frac{1}{\cos\theta} \tag{IV.7}$$

into Eq. (IV.5) gives $$B_z = (2z^2 - x^2 - y^2) \frac{m}{\frac{4}{3}\pi R^3} \int_0^R \frac{4\pi}{\rho^2} \sin^2\theta \cos\theta \, d\theta \tag{IV.8}$$

Let $$u = \sin\theta; \quad du = \cos\theta \, d\theta \tag{IV.9}$$

Substitution of Eq. (IV.9) into Eq. (IV.8) followed by integration gives $$B_z = (2z^2 - x^2 - y^2) \frac{m}{\frac{4}{3}\pi R^3} \frac{4\pi}{\rho^2} \frac{u^3}{3} \tag{IV.10}$$

Substitution of Eq. (IV.9) into Eq. (IV.10) gives $$B_z = (2z^2 - x^2 - y^2) \frac{m}{\frac{4}{3}\pi R^3} \frac{4\pi}{\rho^2} \frac{\sin^3\theta}{3} \tag{IV.11}$$

From Eq. (IV.3)

$$\frac{r}{\rho} = \tan\theta; \quad \sin\theta = \frac{\frac{r}{\rho}}{\sqrt{1 + \left(\frac{r}{\rho}\right)^2}} \tag{IV.12}$$

Substitution of Eq. (IV.12) into Eq. (IV.11) gives $$B_z = (2z^2 - x^2 - y^2) \frac{m}{R^3 \rho^5} \frac{r^3}{\left(1 + \left(\frac{r}{\rho}\right)^2\right)^{3/2}} \Big|_0^R \tag{IV.13}$$

Evaluation at the limits of the integral gives $$B_z = (2z^2 - x^2 - y^2) \frac{m}{R^3 \rho^5} \frac{r^3}{\left(1 + \left(\frac{r}{\rho}\right)^2\right)^{3/2}} \Big|_0^R \tag{IV.14}$$

Multiplication of Eq. (IV.14) by $1 = \frac{\left(1 + \left(\frac{R}{\rho}\right)^2\right)}{\left(1 + \left(\frac{R}{\rho}\right)^2\right)}$ gives $$B_z = (2z^2 - x^2 - y^2) \frac{m}{R^3 \rho^5} \left\{ \frac{R^3 \left(1 + \left(\frac{R}{\rho}\right)^2\right)}{\left(1 + \left(\frac{R}{\rho}\right)^2\right)^{5/2}} \right\} \tag{IV.15}$$

Multiplying out the $\rho^5$ term in the denominator gives

Sphere of Dipoles:

$$B_z = \frac{m(2z^2 - x^2 - y^2)}{(R^3 + \rho^2)^{5/2}} \left(1 + \left(\frac{R}{\rho}\right)^2\right) \tag{IV.16}$$

Eq. (IV.16) demonstrates that the magnetic field of a sphere of dipoles is not equal to that of a single dipole at the origin. The shell radius, R, appears in the denominator of the first term. The first term is the magnetic field of a dipole at the origin only when the variable corresponding to the radius of the shell, R, is zero. The second term is an additional perturbation of the field of a dipole at the origin whose magnitude is a function of the radius of the sphere. The second term vanishes only when the radius of the sphere is zero. Thus, the dipole is a basis element for the reconstruction of a NMR image. The resolution depends on the extent that the field of the sphere of dipoles differs from that of a single dipole at the origin. The plot of the field of a sphere of dipoles of radius R and magnetic moment $m=10^4$ $Gcm^3$ given by Eq. (IV.16) as a function of radius R is given in FIG. 6. The position of the center of the sphere relative to the detector is the point (0,0,10). The plot of the field of a sphere of dipoles of radius R=0.2 cm and magnetic moment $m=10^4$ $Gcm^3$ given by Eq. (IV.16) as a function of the distance between the detector at the origin and the center of the sphere at the points (0,0, z) is shown in FIG. 7. From FIGS. 6 and 7 it can be appreciated that the detector must be able to resolve three to four significant figures in order to reconstruct a map of 0.2 cm resolution with a field depth of 15 cm.

APPENDIX V

Fourier Transform of the System Function

The system function, $h(\rho,\phi,z)$, in cylindrical coordinates is $$h(\rho, \phi, z) = \frac{2z^2 - x^2 - y^2}{[x^2 + y^2 + z^2]^{5/2}} = \frac{2z^2 - \rho^2}{[\rho^2 + z^2]^{5/2}} \quad (V.1)$$

The spacetime Fourier transform in three dimensions in cylindrical coordinates, $H(k_\rho,\Phi,k_z)$, is given [9] as follows:

$$H(k_\rho, \Phi, k_z) = \quad (V.2)$$
$$\int_{-\infty}^{\infty}\int_0^{2\pi}\int_0^{\infty} h(\rho, \phi, z)\exp(-i2\pi[k_\rho\rho\cos(\Phi - \phi) + k_z z])\rho\,d\rho\,d\phi\,dz$$

With circular symmetry [9]

$$H(k_\rho, k_z) = 2\pi \int_0^{\infty}\int_{-\infty}^{\infty} h(\rho, z)J_o[k_\rho\rho]e^{-iwz}\rho\,d\rho\,dz \quad (V.3)$$

The Fourier transform of the system function is given by the substitution of Eq. (V.1) into Eq. (V.3).

$$H = \int_{-\infty}^{\infty} 2\pi \int_0^{\infty} \frac{2z^2 - \rho^2}{[\rho^2 + z^2]^{5/2}} J_0(k_\rho\rho)\rho\,d\rho e^{-jk_z z}dz \quad (V.4)$$

Consider the integral of Eq. (V.4) with respect to $d\rho$ only. Factorization of $h(\rho,\phi,z)$ gives $$2\pi \int_0^{\infty}\left[\frac{2z^2\rho}{[\rho^2 + z^2]^{5/2}} - \frac{\rho^3}{[\rho^2 + z^2]^{5/2}}\right]J_0[k_\rho\rho]d\rho \quad (V.5)$$

Consider the definite integral $$\int_0^{\infty} \frac{t^{v+1}J_v[at]dt}{[t^2 + z^2]^{u+1}} = \frac{a^u z^{v-u}K_{v-u}[az]}{2^u \Gamma[u+1]} \quad (V.6)$$

and the modified Bessel function of the third kind relationship, $$K_{-v}[x] = K_v[x] \quad (V.7)$$

The first factor of Eq. (V.5) is the same form as Eq. (V.6) with v=0; u=3/2, thus, $$2z^2(2\pi)\int_0^{\infty}\frac{\rho}{[\rho^2+z^2]^{5/2}}J_0[k_\rho\rho]d\rho = \quad (V.8)$$
$$\frac{2z^2(2\pi)k_\rho^{3/2}z^{-3/2}}{2^{3/2}\Gamma[5/2]}K_{-3/2}[k_\rho z] = \frac{[2^{1/2}]\pi z^{1/2}k_\rho^{3/2}}{\Gamma[5/2]}K_{3/2}[k_\rho z]$$

where $K_{-3/2}[k_\rho z] = K_{3/2}[k_\rho z]$ (Eq. (V.7)). The second factor of Eq. (V.5) can be made into the same form as Eq. (V.6) using the Bessel function of the first kind recurrence relationship $$J_{v-1}[x] + J_{v+1}[x] = \frac{2v}{x}J_v[x] \quad (V.9)$$

Consider the second factor of the integral of Eq. (V.5).

$$-2\pi \int_0^{\infty} \frac{\rho^3}{[\rho^2 + z^2]} J_0[k_\rho\rho]d\rho \quad (V.10)$$

Eq. (V.9) with $\upsilon=1$ is $$J_o[x] + J_2[x] = \frac{2}{x}J_1[x] \quad (V.11)$$

$$J_o[x] = \frac{2}{x}J_1[x] - J_2[x] \quad (V.12)$$

Let $$x = k_\rho\rho \quad (V.13)$$

Substitution of Eq. (V.13) into Eq. (V.12) is $$J_o[k_\rho\rho] = \frac{2}{k_\rho\rho} J_1[k_\rho\rho] - J_2[k_\rho\rho] \qquad (V.14)$$

Substitution of Eq. (V.10) into Eq. (V.14) is $$-2\pi \int_0^\infty \frac{\rho^3}{[\rho^2+z^2]^{5/2}} J_o[k_\rho\rho] d\rho = -2\pi \int_0^\infty \frac{\rho^3}{[\rho^2+z^2]^{5/2}} \left[\frac{2}{k_\rho\rho} J_1[k_\rho\rho] - J_2[k_\rho\rho]\right] d\rho \qquad (V.15)$$

$$= -2\pi \int_0^\infty \frac{2\rho^2}{k_\rho[\rho^2+z^2]^{5/2}} J_1[k_\rho\rho] d\rho +$$

$$2\pi \int_0^\infty \frac{\rho^3}{[\rho^2+z^2]^{5/2}} J_2[k_\rho\rho] d\rho$$

The first factor of the right hand side of Eq. (V.15) is the same form as Eq. (V.6) with $$\nu = 1; u = \frac{3}{2}, \text{ thus,}$$

$$-2\pi \int_0^\infty \frac{2\rho^2}{k_\rho[\rho^2+z^2]^{5/2}} J_1[k_\rho\rho] d\rho = \frac{-(4\pi)k_\rho^{3/2} z^{-1/2}}{k_\rho 2^{3/2} \Gamma[5/2]} K_{-1/2}[k_\rho z] \qquad (V.16)$$

$$= -\frac{[2^{1/2}]\pi z^{-1/2} k_\rho^{1/2}}{\Gamma[5/2]} K_{1/2}[k_\rho z]$$

where $K_{-1/2}[k_\rho z] = K_{1/2}[k_\rho z]$ (Eq.(V.7)). The second factor of the right hand side of Eq. (V.15) is the same form as Eq. (V.6) with $$\nu = 2; u = \frac{3}{2}, \text{ thus,}$$

$$2\pi \int_0^\infty \frac{\rho^3}{[\rho^2+z^2]^{5/2}} J_2[k_\rho\rho] d\rho = \qquad (V.17)$$

$$\frac{(2\pi)k_\rho^{3/2} z^{1/2}}{2^{3/2}\Gamma[5/2]} K_{1/2}[k_\rho z] = \frac{\pi z^{1/2} k_\rho^{3/2}}{[2^{1/2}]\Gamma[5/2]} K_{1/2}[k_\rho z]$$

Combining the parts of the integration with respect to d$\rho$ of Eq. (V.4) by adding Eq. (V.8), Eq. (V.16), and Eq. (V.17) gives $$\int_{-\infty}^\infty \left[ \frac{[2^{1/2}]\pi z^{1/2} k_\rho^{1/2}}{\Gamma[5/2]} K_{3/2}[k_\rho z] - \right. \qquad (V.18)$$

$$\left. \frac{[2^{1/2}]\pi z^{1/2} k_\rho^{1/2}}{\Gamma[5/2]} K_{1/2}[k_\rho z] + \frac{\pi z^{1/2} k_\rho^{3/2}}{[2^{1/2}]\Gamma[5/2]} K_{1/2}[k_\rho z] \right] e^{-jk_z z} dz$$

The modified Bessel function of the third kind formulae is $$K_{n+1/2}[x] = \left[\frac{\pi}{2x}\right]^{1/2} e^{-x} \sum_{m=0}^n [2x]^{-m} \frac{\Gamma[n+m+1]}{m!\Gamma[n+m-1]} \qquad (V.19)$$

Substitution of Eq. (V.13) into Eq. (V.19) with $\nu=1$ is $$K_{3/2}[k_\rho z] = \left[\frac{\pi}{2k_\rho z}\right]^{1/2} e^{-k_\rho z} \left[1 + \frac{1}{2k_\rho z}\Gamma[3]\right] \qquad (V.20)$$

Substitution of Eq. (V.13) into Eq. (V.19) with $\nu=0$ is $$K_{1/2}[k_\rho z] = \left[\frac{\pi}{2k_\rho z}\right]^{1/2} e^{-k_\rho z} \qquad (V.21)$$

Substitution of Eq. (V.20) and Eq. (V.21) into Eq. (V.18) is $$\int_{-\infty}^{\infty}\left\{\left[\frac{(2^{1/2})\pi z^{1/2}k_\rho^{3/2}}{\Gamma[5/2]}\left[1+\frac{1}{2k_\rho z}\Gamma[3]\right]-\frac{(2^{1/2})\pi z^{1/2}k_\rho^{1/2}}{\Gamma[5/2]}+\frac{\pi z^{1/2}k_\rho^{3/2}}{(2^{1/2})\Gamma[5/2]}\right]\left[\frac{\pi}{2k_\rho z}\right]^{1/2}e^{-k_\rho z}\right\}e^{-jk_z z}dz \quad (V.22)$$

$$\int_{-\infty}^{\infty}\left\{\frac{\pi^{3/2}}{\Gamma[5/2]}k_\rho e^{-[jk_z+k_\rho]z}+\frac{z^{-1}\pi^{3/2}\Gamma[3]}{\Gamma[5/2]2}e^{-[jk_z+k_\rho]z}-\frac{z^{-1}\pi^{3/2}}{\Gamma[5/2]}e^{-[jk_z+k_\rho]z}+\frac{\pi^{3/2}}{\Gamma[5/2]2}k_\rho e^{-[jk_z+k_\rho]z}\right\}dz$$

Collecting terms gives $$\int_{-\infty}^{\infty}\frac{\pi^{3/2}}{\Gamma[5/2]}\left\{k_\rho[1+1/2]+\left[\frac{\Gamma[3]}{2}-1\right]z^{-1}\right\}e^{-[jk_z+k_\rho]z}dz \quad (V.24)$$

With $\Gamma[3]=2$ and $\Gamma[5/2]=3/4\pi^{1/2}$, Eq. (V.24) is $$\int_{-\infty}^{\infty}\frac{\pi^{3/2}}{\Gamma[5/2]}\{k_\rho[3/2]+[1-1]z^{-1}\}e^{-k_\rho z}e^{-jk_z z}dz \quad (V.25)$$

$$\int_{-\infty}^{\infty}\frac{\pi^{3/2}}{3/4\pi^{1/2}}3/2k_\rho e^{-k_\rho z}e^{-jk_z z}dz \quad (V.26)$$

$$2\pi k_\rho\int_{-\infty}^{\infty}e^{-k_\rho z}e^{-jk_z z}dz \quad (V.27)$$

$$4\pi k_\rho\int_{0}^{\infty}e^{-k_\rho z}e^{-jk_z z}dz \quad (V.28)$$

$$4\pi k_\rho\int_{0}^{\infty}e^{-[jk_z+k_\rho]z}dz \quad (V.29)$$

Integration of Eq. (V.29) with respect to dz gives $$4\pi k_\rho\left\{\frac{-1}{jk_z+k_\rho}e^{-[jk_z+k_\rho]z}\Big|_0^\infty\right\} \quad (V.30)$$

$$4\pi k_\rho\left[\frac{-1}{jk_z+k_\rho}\right] \quad (V.31)$$

Multiplication of Eq. (V.31) by $$1=\left[\frac{-jk_z+k_\rho}{-jk_z+k_\rho}\right] \quad (V.32)$$

gives $$4\pi k_\rho\left[\frac{-jk_z+k_\rho}{k_z^2+k_\rho^2}\right] \quad (V.33)$$

The system function (Eq. (V.1)) is an even function; thus, the spacetime Fourier transform in three dimensions in cylindrical coordinates, $H(k_\rho,k_z)$, is given by taking the real part of Eq. (V.33) [8].

$$H[k_\rho,k_z]=\frac{4\pi k_\rho^2}{k_z^2+k_\rho^2} \quad (V.34)$$

The spacetime Fourier transform in three dimensions in Cartesian coordinates, $H(k_\rho,k_z)$, is $$H[k_x,k_y,k_z]=\frac{4\pi[k_x^2+k_y^2]}{[k_x^2+k_y^2+k_z^2]} \quad (V.35)$$

where the relationship between the wavenumber and the spatial Cartesian coordinates is as follows:

$$k_x=\frac{2\pi}{\lambda_x}=\frac{2\pi}{x} \quad (V.36)$$

$$k_y=\frac{2\pi}{\lambda_y}=\frac{2\pi}{y} \quad (V.37)$$

$$k_z=\frac{2\pi}{\lambda_z}=\frac{2\pi}{z} \quad (V.38)$$

APPENDIX VI

Derivation of $S = HF \; U(k_z)$ from Eq. (55).

$$S = HF \otimes U[k_z] \quad (VI.1)$$

$$= \frac{2\pi k_\rho^2}{k_\rho^2 + k_z^2} \sum_{z_n=0}^{-l_3} \sum_{y_n=-l_2/2}^{+l_2/2} \sum_{x_n=-l_1/2}^{+l_1/2} \chi_{n_1,n_2,n_3} e^{-j[k_x x_n + k_y y_n + k_z z_n]} +$$

$$\frac{1}{jk_z} \otimes \frac{4\pi k_\rho^2}{k_\rho^2 + k_z^2} \sum_{z_n=0}^{-l_3} \sum_{y_n=-l_2/2}^{+l_2/2} \sum_{x_n=-l_1/2}^{+l_1/2} \chi_{n_1,n_2,n_3} e^{-j[k_x x_n + k_y y_n + k_z z_n]}$$

where the Fourier transform of $u(z) = 1$ for $z \geq 0$ and $u(z) = 1$ for $z < 0$ [8] is $$U(k_z) = \frac{1}{2}\delta(k_z) + \frac{1}{jk_z} \quad (VI.2)$$

and where H is given by Eq. (52) and F is given by Eq. (49). The convolution integral of the second term of Eq. (VI.1) is Collecting exponential terms gives $$S = \frac{1}{2}HF + \quad (VI.4)$$

$$\sum_{z_n=0}^{-l_3} \sum_{y_n=-l_2/2}^{+l_2/2} \sum_{x_n=-l_1/2}^{+l_1/2} \chi_{n_1,n_2,n_3} e^{-j[k_x x_n + k_y y_n + k_z z_n]} \frac{4\pi k_\rho^2}{j} \int_{-\infty}^{\infty} \frac{e^{+j\kappa_z z_n}}{\kappa_z [k_\rho^2 + [k_z - \kappa_z]^2]} d\kappa_z$$

Expansion of the denominator of the second term gives $$S = \frac{1}{2}HF + \sum_{z_n=0}^{-l_3} \sum_{y_n=-l_2/2}^{+l_2/2} \sum_{x_n=-l_1/2}^{+l_1/2} \chi_{n_1,n_2,n_3} e^{-j[k_x x_n + k_y y_n + k_x z_n]} \quad (VI.5)$$

$$\frac{4\pi k_\rho^2}{j} \int_{-\infty}^{\infty} \frac{e^{+j\kappa_z z_n}}{\kappa_z[\kappa_z^2 - 2k_z\kappa_z + k_\rho^2 + k_z^2]} d\kappa_z$$

The factorization of the denominator of the second term, $\kappa_z^2 - 2k_z\kappa_z + k_p^2 + k_z^2$, using the quadratic formula is $$\frac{2k_z \pm [4k_z^2 - 4[k_\rho^2 + k_z^2]]^{\frac{1}{2}}}{2} = \frac{2k_z \pm [4k_z^2 - 4k_\rho^2 - 4k_z^2]^{\frac{1}{2}}}{2} \kappa_z = k_z \pm jk_o \quad (VI.6)$$

Substitution of Eq. (VI.6) into Eq. (VI.5) is $$S = \frac{1}{2}HF + \sum_{z_n=0}^{-l_3} \sum_{y_n=-l_2/2}^{+l_2/2} \sum_{x_n=-l_1/2}^{+l_1/2} \chi_{n_1,n_2,n_3} e^{-j[k_x x_n + k_y y_n + k_x z_n]} \quad (VI.7)$$

$$\frac{4\pi k_\rho^2}{j} \int_{-\infty}^{\infty} \frac{e^{+j\kappa_z z_n}}{\kappa_z[\kappa_z - k_z + jk_\rho][\kappa_z - k_z - jk_\rho]} d\kappa_z$$

The expansion of Eq. (VI.7) by the method of partial fractions is $$S = \frac{1}{2}HF + \sum_{z_n=0}^{-l_3} \sum_{y_n=-l_2/2}^{+l_2/2} \sum_{x_n=-l_1/2}^{+l_1/2} \chi_{n_1,n_2,n_3} e^{-j[k_x x_n + k_y y_n + k_x z_n]} \frac{4\pi k_\rho^2}{j} \quad (VI.8)$$

$$\int_{-\infty}^{\infty} e^{+j\kappa_z z_n} \left[\frac{A}{\kappa_z} + \frac{B}{\kappa_z - k_z + jk_\rho} + \frac{C}{\kappa_z - k_z - jk_\rho}\right] d\kappa_z$$

The factors A, B, C of Eq. (VI.8) are determined as follows:

$$A[\kappa_z^2 - 2k_z\kappa_z + k_\rho^2 + k_z^2] + B[\kappa_z][\kappa_z - k_z - jk_\rho] + C[\kappa_z][\kappa_z - k_z + jk_\rho] = 1 \quad (VI.9)$$

Let $\kappa_z = 0$. Then, Eq. (VI.9) gives $$A[k_\rho^2 + k_z^2] = 1 \quad (VI.10)$$

Thus,

-continued $$A = \frac{1}{[k_\rho^2 + k_z^2]} \quad (VI.11)$$

Let $\kappa_z = k_z + jk_\rho$. Then Eq. (VI.9) is $$A[[k_z + jk_\rho]^2 - 2k_z[k_z + jk_\rho] + k_\rho^2 + k_z^2] + B[k_z + jk_\rho][k_z + jk_\rho - k_z - jk_\rho] + \quad (VI.12)$$
$$C[k_z + jk_\rho][k_z + jk_\rho - k_z - jk_\rho] = 1$$

The term in B vanishes. Substitution of Eq. (VI.11) into Eq. (VI.12) gives $$\frac{1}{[k_\rho^2 + k_z^2]}[k_x^2 + 2jk_zk_\rho - k_\rho^2 - 2k_z^2 - 2jk_zk_\rho + k_\rho^2 + k_z^2] + C[2jk_zk_\rho - 2k_\rho^2] = 1 \quad (VI.13)$$

where the term in A also vanishes. Solving for C gives $$C = \frac{1}{[-2k_\rho^2 + 2jk_zk_\rho]} \quad (VI.14)$$

Let $\kappa_z = k_z - jk_\rho$. Then, Eq. (VI.9) is $$A[[k_z - jk_\rho]^2 - 2k_z[k_z - jk_\rho] + k_\rho^2 + k_z^2] + \quad (VI.15)$$
$$B[k_z - jk_\rho][k_z - jk_\rho - k_z - jk_\rho] +$$
$$C[k_z - jk_\rho][k_z - jk_\rho - k_z + jk_\rho] = 1$$

The term in C vanishes. Substitution of Eq. (VI.11) into Eq. (VI.15) gives $$\frac{1}{[k_\rho^2 + k_z^2]}[k_z^2 - 2jk_zk_\rho - k_\rho^2 - 2k_z^2 + 2jk_zk_\rho + k_\rho^2 + k_z^2] + \quad (VI.16)$$
$$B[-2jk_zk_\rho - 2k_\rho^2] = 1$$

where the term in A also vanishes. Solving for B gives $$B = \frac{1}{[-2k_\rho^2 - 2jk_zk_\rho]} \quad (VI.17)$$

Substitution of A, B, and C into the convolution integral (Eq. (VI.8)) gives:

$$S = \frac{1}{2}HF + \sum_{z_n=0}^{-l_3} \sum_{y_n=-l_2/2}^{+l_2/2} \sum_{x_n=-l_1/2}^{+l_1/2} \chi_{n_1,n_2,n_3} e^{-j[k_xx_n + k_yy_n + k_zz_n]} \quad (VI.18)$$

$$\left\{ \begin{array}{l} \frac{4\pi k_\rho^2}{j} \int_{-\infty}^{\infty} \frac{e^{+j\kappa_z z_n}}{\kappa_z[k_\rho^2 + k_z^2]} d\kappa_z + \\ \frac{4\pi k_\rho^2}{j} \int_{-\infty}^{\infty} \frac{e^{+j\kappa_z z_n}}{[\kappa_z - k_z + jk_\rho][-2k_\rho^2 - 2jk_zk_\rho]} d\kappa_z + \\ \frac{4\pi k_\rho^2}{j} \int_{-\infty}^{\infty} \frac{e^{+j\kappa_z z_n}}{[\kappa_z - k_z - jk_\rho][-2k_\rho^2 + 2jk_zk_\rho]} d\kappa_z \end{array} \right\}$$

The first convolution integral is of the form given by Mc Seibert [8].

$$\frac{2}{jk_z} \Leftrightarrow sgnz_n; sgnz_n = -1 \text{ where } z_n < 0 \quad (VI.19)$$

Thus, $$\frac{4\pi k_\rho^2}{[k_\rho^2 + k_z^2]} \int_{-\infty}^{\infty} \frac{e^{+j\kappa_z z_n}}{j\kappa_z} d\kappa_z = -\frac{2\pi k_\rho^2}{[k_\rho^2 + k_z^2]} \text{ where } z_n < 0 \quad (VI.20)$$

A change of variable in the second convolution integral given by letting $$\kappa_z = -k_z jk_\rho; d\kappa_z = -dk_z \quad (VI.21)$$

in $$\frac{4\pi k_\rho^2}{[-2k_\rho^2 - 2jk_zk_\rho]} \int_{-\infty}^{\infty} \frac{e^{+j\kappa_z z_n}}{j[\kappa_z - k_z + jk_\rho]} d\kappa_z \quad (VI.22)$$

$$\frac{4\pi k_\rho^2}{[-2k_\rho^2 - 2jk_zk_\rho]} \int_{-\infty}^{\infty} \frac{e^{+j[-k_z - jk_\rho]z_n}}{j[-2k_z]} [-dk_z] \text{ where } z_n < 0 = \quad (VI.23)$$

$$\frac{2\pi k_\rho^2 e^{-k_\rho|z_n|}}{[-2k_\rho^2 - 2jk_zk_\rho]} \int_{-\infty}^{\infty} \frac{2e^{+jk_z|z_n|}}{2jk_z} dk_z = \quad (VI.24)$$

$$\frac{\pi k_\rho^2}{2[k_\rho^2 + jk_zk_\rho]} e^{-k_\rho|z_n|} \text{ where } z_n < 0 \quad (VI.25)$$

A change of variable in the third convolution integral given by letting $$\kappa_z = -k_z + jk_\rho; d\kappa_z = -dk_z \quad (VI.26)$$

in $$\frac{2\pi k_\rho^2}{[-2k_\rho^2 + 2jk_zk_\rho]} \int_{-\infty}^{\infty} \frac{2e^{+j\kappa_z z_n}}{j[\kappa_z - k_z - jk_\rho]} d\kappa_z \text{ is} \quad (VI.27)$$

$$\frac{2\pi k_\rho^2}{[-2k_\rho^2 - 2jk_zk_\rho]} \int_{-\infty}^{\infty} \frac{2e^{+j[-k_z + jk_\rho]z_n}}{j[-2k_z]} [-dk_z] \text{ where } z_n < 0 \quad (VI.28)$$

$$\frac{2\pi k_\rho^2 e^{+k_\rho|z_n|}}{[-2k_\rho^2 + 2jk_zk_\rho]} \int_{-\infty}^{\infty} \frac{2e^{+jk_z|z_n|}}{2jk_z} dk_z = \quad (VI.29)$$

-continued $$\frac{\pi k_\rho^2}{2[k_\rho^2 - jk_z k_\rho]} e^{+k_\rho |z_n|} \text{ where } z_n < 0 \tag{VI.30}$$

Combining Eqs. (VI.20), (VI.25), and (VI.30) gives the convolution of Eq. (VI.1).

$$S = \frac{1}{2} HF + \tag{VI.31}$$

$$\sum_{z_n=0}^{-l_3} \sum_{y_n=-l_2/2}^{+l_2/2} \sum_{x_n=-l_1/2}^{+l_1/2} \chi_{n_1,n_2,n_3} e^{-j[k_x x_n + k_y y_n + k_z z_n]} \left[ \frac{-2\pi k_\rho^2}{k_\rho^2 + k_z^2} \right] +$$

$$\sum_{z_n=0}^{-l_3} \sum_{y_n=-l_2/2}^{+l_2/2} \sum_{x_n=-l_1/2}^{+l_1/2} \chi_{n_1,n_2,n_3} e^{-j[k_x x_n + k_y y_n + k_z z_n]}$$

$$\left\{ \frac{\pi k_\rho^2}{2[k_\rho^2 + jk_z k_\rho]} e^{-k_\rho |z_n|} + \frac{\pi k_\rho^2}{2[k_\rho^2 + jk_z k_\rho]} e^{+k_\rho |z_n|} \right\}$$

APPENDIX VII

Derivation of the Inverse Transform of Eq. (68) to Give Inverse Transform 1, Eq. (69).

$$F^{-1}\left\{ \frac{1}{8} \sum_{z_n=0}^{-l_3} \sum_{y_n=-l_2/2}^{+l_2/2} \sum_{x_n=-l_1/2}^{+l_1/2} \chi_{n_1,n_2,n_3} \right. \tag{VII.1}$$

$$\left. e^{-j[k_x x_n + k_y y_n + k_z z_n]} \left[ e^{-k_\rho |z_n|} + e^{+k_\rho |z_n|} + j\frac{k_z}{k_\rho} [e^{+k_\rho |z_n|} - e^{-k_\rho |z_n|}] \right] \right\} =$$

$$\frac{1}{8} \sum_{z_n} \sum_{y_n} \sum_{x_n} \chi_{n_1,n_2,n_3} \delta[x - x_n, y - y_n, z - z_n] \tag{VII.2}$$

$$\begin{cases} 2\pi \int_{-\infty}^{\infty} \int_0^\infty e^{-k_\rho |z_n|} J_o[k_\rho \rho] k_\rho dk_\rho e^{jk_z z} dk_z + \\ 2\pi \int_{-\infty}^{\infty} \int_0^\infty e^{+k_\rho |z_n|} J_o[k_\rho \rho] k_\rho dk_\rho e^{jk_z z} dk_z + \\ j2\pi \int_{-\infty}^{\infty} \int_0^\infty e^{+k_\rho |z_n|} J_o[k_\rho \rho] dk_\rho k_z e^{jk_z z} dk_z - \\ j2\pi \int_{-\infty}^{\infty} \int_0^\infty e^{-k_\rho |z_n|} J_o[k_\rho \rho] dk_\rho k_z e^{jk_z z} dk_z \end{cases} \text{ where } z_n < 0$$

Consider the definite integral:

$$\int_0^\infty e^{-at} J_\nu[bt] t^{\nu+1} dt = \frac{2a[2b]^\nu \Gamma[\nu + 3/2]}{[a^2 + b^2]^{3/2} \pi^{1/2}}; \alpha > 0 \tag{VII.3}$$

In the case of the first integral of Eq. (VII.2), the parameters of Eq. (VII.3) are $$\nu = 0 \tag{VII.4}$$
$$t = k_\rho$$
$$b = \rho$$
$$a = |z_n|$$

Thus, $$\int_0^\infty e^{-k_\rho |z_n|} J_o[k_\rho \rho] k_\rho dk_\rho = \frac{|z_n|}{[z_n^2 + \rho^2]^{3/2}} \tag{VII.5}$$

where $$\frac{2|z_n| \Gamma[3/2]}{\pi^{1/2} [z_n^2 + \rho^2]^{3/2}} = \frac{|z_n|}{[z_n^2 + \rho^2]^{3/2}} \tag{VII.6}$$

Consider the following relationship of the modified Bessel function of the third kind:

$$\pi J_\nu[z] = e^{+j\frac{\pi}{2}[\nu+1]} K_\nu\left[ze^{+j\frac{\pi}{2}}\right] + e^{-j\frac{\pi}{2}[\nu+1]} K_\nu\left[ze^{-j\frac{\pi}{2}}\right] \tag{VII.7}$$

In the case that $\nu=0$, Eq. (VII.7) is $$\pi J_o[k_\rho \rho] - jK_o[jk_\rho \rho] - jK_o[-jk_\rho \rho] \tag{VII.8}$$

Thus, $$\int_0^\infty e^{+k_\rho |z_n|} J_o[k_\rho \rho] dk_\rho = \tag{VII.9}$$

$$\int_0^\infty \frac{e^{+k_\rho |z_n|}}{\pi} [jK_o[jk_\rho \rho] - jK_o[-jk_\rho \rho]] dk_\rho$$

$$= \int_0^\infty j\frac{e^{+k_\rho|z_n|}}{\pi} K_o[jk_\rho\rho]dk_\rho - \frac{j}{\pi}\int_0^\infty e^{+k_\rho|z_n|} K_o[-jk_\rho\rho]dk_\rho \qquad (VII.10)$$

With a change of variable as follows:

First Integral: Second Integral:

$$k_\rho = jk_\rho \quad k_\rho = -jk_\rho$$

$$dk_\rho = jdk_\rho \quad dk_\rho = -jdk_\rho \qquad (VII.11)$$

and an expansion of the complex exponential factor, Eq. (VII.10) becomes $$\frac{-1}{\pi}\int_0^\infty e^{+jk_\rho|z_n|} K_o[k_\rho\rho]dk_\rho - \frac{1}{\pi}\int_0^\infty e^{+jk_\rho|z_n|} K_o[k_\rho\rho]dk_\rho = \qquad (VII.12)$$

$$\frac{-1}{\pi}\int_0^\infty [[\cos k_\rho z_n] + j\sin[k_\rho z_n] + \cos[k_\rho z_n] - j\sin[k_\rho z_n]]$$

$$K_o[k_\rho\rho]dk_\rho = \int_0^\infty \frac{-2\rho^{1/2}}{\pi\rho^{1/2}}\cos[k_\rho z_n] K_o[k_\rho\rho]dk_\rho$$

The transform is given by Bateman [12].

$$\int_0^\infty \frac{-2\rho^{1/2}}{\pi\rho^{1/2}}\cos[k_\rho z_n] K_o[k_\rho\rho]dk_\rho = \qquad (VII.13)$$

$$\frac{-2\rho^{1/2}\pi}{2\pi\rho^{1/2}[z_n^2+\rho^2]^{1/2}} = \frac{-1}{[z_n^2+\rho^2]^{1/2}}$$

Thus, $$\int_0^\infty e^{k_\rho|z_n|} J_o[k_\rho\rho]dk_\rho = \frac{-1}{[z_n^2+\rho^2]^{1/2}} \qquad (VII.14)$$

The Fourier transform relationship between a function $f[x]$ and its Fourier transform $g[y]$ given by McC. Siebert [8] is $$xf[x] \Leftrightarrow -\frac{1}{j}\frac{d}{dk}g[k] \qquad (VII.15)$$

Consider the following Inverse Fourier transform integral from Eq. (VII.2)

$$\int_0^\infty k_\rho e^{k_\rho|z_n|} J_o[k_\rho\rho]dk_\rho \qquad (VII.16)$$

Eq. (VII.16) is equivalent to the following Inverse Fourier transform $$k_\rho F^{-1}\{J_o[k_\rho\rho]\} \qquad (VII.17)$$

From Eq. (VII.15) with $$g[y] = \frac{-1}{[z_n^2+\rho^2]^{1/2}} \qquad (VII.18)$$

Eq. (VII.16) is $$\int_0^\infty k_\rho e^{k_\rho|z_n|} J_o[k_\rho\rho]dk_\rho = \frac{1}{-j}\frac{d}{dz_n}\left[\frac{-1}{[z_n^2+\rho^2]^{1/2}}\right] = j\frac{z_n}{[z_n^2+\rho^2]^{3/2}} \qquad (VII.19)$$

Taking the imaginary part because Eq. (V.19) has odd symmetry gives $$\int_0^\infty k_\rho e^{k_\rho|z_n|} J_o[k_\rho\rho]dk_\rho = \frac{-|z_n|}{[z_n^2+\rho^2]^{3/2}}; z_n < 0 \qquad (VII.20)$$

In the case of the third and fourth terms of Eq. (VII.2), consider the following Fourier transform given by Gray [13]:

$$\int_0^\infty e^{-ax} J_o[bx]dx = \frac{1}{[a^2+b^2]^{1/2}} \qquad (VII.21)$$

Thus, $$\int_0^\infty e^{-k_\rho z_n} J_o[k_\rho\rho]dk_\rho = \frac{1}{[z_n^2+\rho^2]^{1/2}}; z_n > 0 \qquad (VII.22)$$

The Inverse Fourier transform with respect to $k_z$ is given by McC. Siebert [8]. In the case of the first two terms of Eq. (VII.2), $$\int_{-\infty}^\infty e^{+jk_z z}dk_z = \delta[z] \qquad (VII.23)$$

In the case of the third and fourth terms of Eq. (VII.2), $$\int_{-\infty}^\infty jk_z e^{+jk_z z}dk_z = \overset{*}{\delta}[z] \qquad (VII.24)$$

Combining transforms from Eqs. (VII.6), (VII.20), and (VII.23) in the case of the first and second terms of Eq. (VII.2) and combining transforms from Eqs. (VII.14) (VII.22) and (VII.24) in the case of the third and fourth terms of Eq. (VII.2) gives:

$$F^{-1}\left\{\frac{1}{8}\sum_{z_n=0}^{-l_3}\sum_{y_n=-l_2/2}^{+l_2/2}\sum_{x_n=-l_1/2}^{+l_1/2} \chi_{n_1,n_2,n_3} e^{-j[k_x x_n + k_y y_n + k_z z_n]}\right\}\left[e^{-k_\rho|z_n|}+\right. \qquad (VII.25)$$

-continued $$e^{+k_\rho|z_n|} + j\frac{k_z}{k_\rho}[e^{+k_\rho|z_n|} - e^{-k_\rho|z_n|}]\bigg]\bigg\} =$$

$$F^{-1}\left\{\frac{1}{8}\sum_{z_n=0}^{-l_3}\sum_{y_n=-l_2/2}^{+l_2/2}\sum_{x_n=-l_1/2}^{+l_1/2}\chi_{n_1,n_2,n_3}e^{-j[k_xx_n+k_yy_n+k_zz_n]}\right\}\otimes$$

$$\left\{2\pi\delta[z]\left[\frac{|z_n|}{[z_n^2+\rho^2]^{3/2}} - \frac{|z_n|}{[z_n^2+\rho^2]^{3/2}}\right] + \right.$$
$$\left. 2\pi\delta[z]\left[\frac{-1}{[z_n^2+\rho^2]^{1/2}} - \frac{1}{[z_n^2+\rho^2]^{1/2}}\right]\right\}\text{ where }z_n<0$$

Substitution of Eq. (48) into Eq. (VII.25) gives $$F^{-1}\left\{\frac{1}{8}\sum_{z_n=0}^{-l_3}\sum_{y_n=-l_2/2}^{+l_2/2}\sum_{x_n=-l_1/2}^{+l_1/2}\chi_{n_1,n_2,n_3}e^{-j[k_xx_n+k_yy_n+k_zz_n]}\right\}\left[e^{-k_\rho|z_n|}+\right.\quad\text{(VII.26)}$$

$$e^{+k_\rho|z_n|} + j\frac{k_z}{k_\rho}[e^{+k_\rho|z_n|} - e^{-k_\rho|z_n|}]\bigg]\bigg\} =$$

$$\frac{1}{8}\sum_{n_3=0}^{-l_3/k}\sum_{n_2=-l_2/2k}^{+l_2/2k}\sum_{n_1=-l_1/2k}^{+l_1/2k}\chi_{n_1,n_2,n_3}\delta[x-n_1k, y-n_2k, z-n_3k]\otimes$$

$$\left[2\pi\delta[z]\left[\frac{|z_n|}{[z_n^2+\rho^2]^{3/2}} - \frac{|z_n|}{[z_n^2+\rho^2]^{3/2}}\right] + \right.$$
$$\left. 2\pi\delta[z]\left[\frac{-1}{[z_n^2+\rho^2]^{1/2}} - \frac{1}{[z_n^2+\rho^2]^{1/2}}\right]\right]\text{ where }z_n<0$$

where $z_n<0$ (VII.26)

Taking the derivative given by the doublet function gives $$F^{-1}\left\{\frac{1}{8}\sum_{z_n=0}^{-l_3}\sum_{y_n=-l_2/2}^{+l_2/2}\sum_{x_n=-l_1/2}^{+l_1/2}\chi_{n_1,n_2,n_3}e^{-j[k_xx_n+k_yy_n+k_zz_n]}\right\}\left[e^{-k_\rho|z_n|}+\right.\quad\text{(VII.27)}$$

$$e^{+k_\rho|z_n|} + j\frac{k_z}{k_\rho}[e^{+k_\rho|z_n|} - e^{-k_\rho|z_n|}]\bigg]\bigg\} =$$

$$\frac{\pi}{2}\frac{1}{8}\sum_{n_3=0}^{-l_3/k}\sum_{n_2=-l_2/2k}^{+l_2/2k}\sum_{n_1=-l_1/2k}^{+l_1/2k}\chi_{n_1,n_2,n_3}$$

$$\delta[x-n_1k, y-n_2k, z-n_3k]\otimes\left[\delta[z]\frac{z_n}{[z_n^2+\rho^2]^{3/2}}\right]$$

Inverse Transform 1

REFERENCES

The following citations are incorporated by reference.
1. Mills, R., Magnetic Susceptibility Imaging (MSI), U.S. Pat. No. 5,073,858 (1991).
2. Reynolds, G. O., DeVelis, J. B., Parrent, G. B., Thompson, B. J., *The New Physical Optics Notebook,* SPIE Optical Engineering Press, (1990).
3. Patz, S., Cardiovasc Interven Radiol, (1986), 8:25, pp. 225-237.
4. Jackson, J. D., *Classical Electrodynamics,* Second Edition, John Wiley & Sons, New York, (1962), pp. 391-394.
5. Ogawa, S., Lee, T, Nayak, A. S., Glynn, P., Magnetic Resonance in Medicine, Vol. 14, (1990), pp. 68-78.
6. Sarwinski, R. E., "Superconducting Instruments", Cryogenics, December. 1977, pp. 671-679.
7. Hounsfield, G. N., U.S. Pat. No. 4,322,684, Mar. 30, 1982.
8. Siebert, W., McC., *Circuits, Signals, and Systems,* The MIT Press, Cambridge, Mass., (1986), p. 399.2. Siebert, W., McC., *Circuits, Signals, and Systems,* The MIT Press, Cambridge, Mass., (1986), pp. 415-416.
9. Bracewell, R. N., *The Fourier Transform and Its Applications,* McGraw-Hill Book Company, New York, (1978), pp. 252-253.
10. Siebert, W., McC., *Circuits, Signals, and Systems,* The MIT Press, Cambridge, Mass., (1986), p. 574.
11. Siebert, W., McC., *Circuits, Signals, and Systems,* The MIT Press, Cambridge, Mass., (1986), pp. 435-439
12. Bateman, H., *Tables of Integral Transforms,* Vol. III, McGraw-Hill, New York, (1954), p. 149.
13. Gray, A., Mathews, G. B., A Treatise on Bessel Functions and Their Applications to Physics, MacMillian and Co., Limited, London, (1952), p. p. 65.
14. Mills, R., Resonant Magnetic Susceptibility Imaging (ReMSI), U.S. patent application Ser. No. 09/191,454 filed Nov. 12, 1998.

The invention claimed is:

1. Apparatus for providing a multidimensional image of inanimate or animate objects comprising:
   a magnetization source for producing a magnetic field to magnetize a volume of an object to be imaged, the volume comprising a plurality of voxels;
   a radiation source for applying a radiation field to the object to be imaged when the object is disposed in the magnetic field to produce a secondary radiation field emanating from the object;
   an output signal detector for producing output signals in response to said secondary radiation at a plurality of spatial locations outside of the object as a function of time;
   a first processor for determining a plurality of Fourier components, each having the same frequency, an intensity and a phase angle;
   a second processor for associating the Fourier components due to each voxel of the object to be imaged by phase to form a set corresponding to a spatial variation of intensity of the secondary radiation due to each voxel at said plurality of spatial locations outside of the object;
   a third processor for converting each said set of components into a voxel location; and
   an image processor for producing an image based on the secondary radiation intensity from each voxel and the location of each voxel.

2. The apparatus according to claim 1, further comprising a display for displaying the image.

3. The apparatus according to claim 2, characterized in that said display comprises at least one selected from the group consisting of printers, cathode ray tube displays, liquid crystal displays, plasma screens, three dimensional modelers, laser monitors, projections monitors and holographic displays.

4. The apparatus according to claim 1, characterized in that one processor handles the processing functions of at least two of said first processor, second processor, third processor and image processor.

5. The apparatus according to claim 1, characterized in that one processor handles the processing functions of at least three of said first processor, second processor, third processor and image processor.

6. The apparatus according to claim 1, characterized in that the third processor comprises a reconstruction processor.

7. The apparatus according to claim 1, characterized in that the image is a magnetic resonance image.

8. The apparatus according to claim 1, characterized in that the magnetization source comprises a superconducting magnet.

9. The apparatus according to claim 1, characterized in that the radiation source comprises a radio frequency generator and transmitter.

10. The apparatus according to claim 9, characterized in that the radio frequency generator and transmitter comprises an antennae to excite protons in a magnetized volume.

11. The apparatus according to claim 10, characterized in that the antenna comprises two saddle coils driven in parallel to provide a rotating radio frequency field.

12. The apparatus according to claim 1, characterized in that the source of radiation produces a component of secondary radiation which is transverse to a direction of magnetization of a volume.

13. The apparatus according to claim 12, characterized in that the secondary radiation which is transverse to the direction of the magnetization of the volume comprises radio frequency dipole radiation.

14. The apparatus according to claim 13, characterized in that the radio frequency dipole radiation comprises near field radiation.

15. The apparatus according to claim 1, characterized in that the output signal detector comprises a plurality of detectors.

16. The apparatus according to claim 15, characterized in that each of the detectors comprises an associated antenna.

17. The apparatus according to claim 16, characterized in that the plurality of detectors comprises a three dimensional array of antennas.

18. The apparatus according to claim 17, characterized in that each antenna of the three dimensional array of antennas responds to a secondary radio frequency field as a function of time.

19. The apparatus according to claim 18, characterized in that the plurality of detectors are located at spatial locations outside of an object to be imaged.

20. The apparatus according to claim 1, characterized in that the output signal detector produces output signals in response to secondary radiation at a plurality of spatial locations as a function of time samples at a Nyquist rate in time over the proton free induction decay.

21. The apparatus according to claim 1, characterized in that the first processor further comprises an analog to digital converter to digitize signals of secondary radiation.

22. The apparatus according to claim 1, characterized in that the first processor comprises a time Fourier transform processor to convert secondary signals from the signal output detector over time into Fourier components, each having the same frequency, an intensity and a phase angle.

23. The apparatus according to claim 1, characterized in that the plurality of Fourier components each having the same frequency, an intensity and a phase angle are such that the phase of each component is unique.

24. The apparatus according to claim 23, characterized in that the unique phase of each component is provided by a combination of the angle θ suspended between each spatial location at which the secondary field is detected and a radial vector, a vector from each voxel to each spatial location, and the angle φ due to a separation distance r between each voxel and each spatial location given by a wavenumber of detected field k times r.

25. The apparatus according to claim 1, characterized in that said first processor uses a first component having a phase angle, calculates the phase angle as a function of spatial position of a first spatial position relative to any other spatial location and identifies a component at each spatial location having the calculated phase angle.

26. The apparatus according to claim 25, characterized in that a separate detector samples each separate spatial location.

27. The apparatus according to claim 26, characterized in that each detector comprises a point detector.

28. The apparatus claim 1, characterized in that the source of radiation comprises at least one radio frequency generator selected from the group consisting of klystrons, backward wave oscillators, Gunn diodes, and traveling wave tube amplifiers.

29. The apparatus according to claim 1, characterized in that the third processor uses a spatial variation of the secondary radiation over a sample volume comprising a plurality of spatial locations at which the radiation is detected to determine a location of the voxels.

30. The apparatus according to claim 29, characterized in that the location of each voxel is determined independently by the third processor.

31. The apparatus according to claim 2, wherein the image processor and display can rotate and display an image from a plurality of desired perspectives.

32. The apparatus according to claim 2, characterized in that the image processor and display can display a reduced dimensional image.

33. The apparatus according to claim 1, characterized in that the apparatus provides a two dimensional or three dimensional nuclear magnetic resonance image of inanimate or animate objects.

34. The apparatus according to claim 33, characterized in that the output signal detector comprises a nuclear magnetic resonance detector for detecting a time dependent transverse radio frequency field component as a function of time of over a three dimensional sample volume outside of an object.

35. The apparatus according to claim 34, characterized in that secondary radiation emanating from a magnetized object comprises the transverse, time harmonic nuclear magnetic resonance magnetic dipole radiation.

36. The apparatus according to claim 34, characterized in that the time dependent transverse radio frequency field component comprises a harmonic oscillation of each radio frequency dipole that is equivalent to a dipole rotating in a transverse plane.

37. The apparatus according to claim 34, characterized in that the apparatus can generate an image from a three-dimensional map of a transverse resonant radio frequency magnetic flux external to an object and said nuclear magnetic resonance detector comprises a plurality of detectors at spatial locations, and wherein a nuclear magnetic resonance signal of each voxel at a given detector gives rise to
a Fourier component with a unique phase angle relative to a Fourier component of other voxels of the object at that detector;

a set of Fourier components that correspond to the nuclear magnetic resonance signal of a given voxel over the detectors is determined; and an intensity variation of a transverse radio frequency field over space is used to determine a coordinate location of each voxel.

38. The apparatus according to claim 37, characterized in that the each detector is selectively responsive to a component of the secondary field.

39. The apparatus according to claim 38, characterized in that a transverse radio frequency field is a near field which is a dipole that serves as a basis element to form a unique reconstruction.

40. The apparatus according to claim 39, characterized in that the each detector is responsive to a component of radio frequency in a transverse plane.

41. The apparatus according to claim 40, characterized in that each detector is responsive to a component of the radio frequency dipole field parallel to the radio frequency dipole.

42. The apparatus according to claim 41, characterized in that each detector is responsive to the component of the radio frequency dipole field parallel to the radio frequency dipole as a function of time and detects a maximum intensity of the signal during each time harmonic cycle.

43. The apparatus according to any one of the preceding claims, characterized in that the third processor determines a location of a voxel from signals recorded of a dipole transverse radio frequency field.

44. The apparatus according to claim 43, characterized in that a geometric system function corresponding to a dipole determines a spatial intensity variations of the radio frequency field.

45. The apparatus according to claim 44, characterized in that the system function is a band-pass when $k_\rho = k_z$, the frequency of spatial variation of the recorded secondary radiation in the rho direction is equal or comparable to that in the z direction of the three dimensional space comprising said plurality of spatial locations.

46. The apparatus according to claim 45, characterized in that each voxel is reconstructed independently in parallel with other voxels using each unique set of components associated by phase such that the scan time is no greater than the nuclear free induction decay time.

47. The apparatus according to claim 46, characterized in that all voxels comprising an image are reconstructed in parallel.

48. The apparatus according to claim 46, characterized in that the apparatus can generate high resolution, three-dimensional, real-time anatomical images and images based on physiological parameters with little or no deterioration from motion artifact.

49. The apparatus according to claim 41, characterized in that at each point in time, each radio frequency dipole rotating in the transverse plane is directed at an angle θ relative to the direction of detection of each detector.

50. The apparatus according to claim 49, characterized in that the phase angle θ of the radio frequency dipole relative to the direction of detection axis of the detector gives rise to a phase angle term $e^{-i\theta}$.

51. The apparatus according to claim 50, characterized in that at each point in time, each radio frequency dipole rotating in the transverse plane with a separation distance r between each voxel and each spatial location at a detector gives rise to an angle φ given by a wavenumber of the detected secondary radiation k times r directed at the angle θ relative to a direction of detection of each detector.

52. The apparatus according to claim 51, characterized in that the phase angle φ of the radio frequency dipole relative to a direction of detection axis of a detector gives rise to a phase angle term $e^{-i\phi}$ directed at angle θ relative to the direction of detection of each detector and wherein the angle θ gives rise to a phase angle term $e^{-i\theta}$.

53. The apparatus according to claim 52, characterized in that a sum of the phase angles, kr and θ, is unique for each voxel at each detector.

54. The apparatus according to claim 37, characterized in that the unique phase of each component is provided by a combination of angle θ suspended between each spatial location at which a secondary nuclear magnetic resonance field is detected and a radial vector from each voxel to each spatial location, and angle φ due to a separation distance r between each voxel and each spatial location given by the wavenumber of detected nuclear magnetic resonance field k times r.

55. The apparatus according to claim 37, further comprising a processor, characterized in that a set of Fourier components that correspond to a nuclear magnetic resonance signal of a given voxel over detectors is determined by the processor using a position of a first detector relative to a different detector to calculated the phase angle of the different detector relative to the first detector.

56. The apparatus according to claim 55, characterized in that the processor determines the set of Fourier components that correspond to the nuclear magnetic resonance signal of a given voxel over the detectors by using the position of each first detector relative to a different detector to calculated the phase angle of the different detector relative to the first detectors, and the process is repeated over all of the detectors to give the set of intensities of the nuclear magnetic resonance signal over the plurality of detectors due to each voxel.

57. The apparatus according to claim 56, characterized in that the set of intensities of the nuclear magnetic resonance signal over the plurality of detectors due to each voxel is processed to determine a coordinate location of each voxel.

58. The apparatus according to claim 1, further comprises coils for providing $B_0$, a steady primary field,
$G_x$, a field gradient in an x-axis direction,
$G_y$, a field gradient in a y-axis direction,
a radio frequency field, and
$G_z$, a field gradient in a z-axis direction.

59. The apparatus according to claim 58, associated amplifiers for driving the coils and associated control circuits for controlling the coils which provide $T_1$ and $T_2$ pulse sequences to alter an intensity of the secondary radio frequency field as a function of time to provide corresponding signals to be processed.

60. The apparatus according to claim 9, characterized in that nuclei present in object are subjected to an additional rotating radio frequency field $H_1$, which is synchronous with precession and their magnetic moments, and magnetization M is caused to precess about $H_1$ and rotate away from the primary field $H_0$ by an angle φ in a coordinate frame which rotates at the Larmor frequency, the precession about $H_1$ continues as long as $H_1$ exists, and a final value of φ which depends on the strength of $H_1$, which determines the precession rate, and the time for which it is turned on is such that φ=90° that a dipole is perpendicular to a detector array that is responsive to the nuclear magnetic resonance radiation at a plurality of spatial locations external to the object.

61. The apparatus according to claim 1, characterized in that the magnetizing source is constructed to provide a magnetic field which permeates the object to be imaged and is confined to a volume to be imaged, and the confined magnetic field limits the source of signal to the volume of interest, characterized in that the volume to be reconstructed is limited to the magnetized volume which sets a limit to required computations and reduces end effects of signal originating outside of edges of the output signal detector.

62. The apparatus according to claim 61, characterized in that the apparatus is constructed to provide a magnetizing field which limits an imaged volume of an object by providing a range of Larmor frequencies and data is rejected at a threshold Larmor frequency.

63. The apparatus according to claim 1, characterized in that the apparatus is constructed to provide a magnetizing field which limits an imaged volume of an object by providing a range of Larmor frequencies and data is rejected at a threshold Larmor frequency.

64. The apparatus according to claim 1, characterized in that the output signal detector comprises detector elements disposed on a first axis and having corresponding output signals.

65. The apparatus according to claim 64, characterized in that the output signal detector includes detector elements disposed on a second axis and having a corresponding output signal, and the detectors on the second axis are responsive to the corresponding oriented field components of the secondary radiation.

66. The apparatus according to claim 1, characterized in that the third processor comprises at least one reconstruction processor selected from the group consisting of a detector processor for processing the detector output signal with an inverse matrix, a reiterative processor, a time Fourier transform processor, a sinc function filter processor for detecting the detector output signals, a space and time Fourier transform processor, and a compensating processor for compensating for a distance from the detector along a detector responsive axis.

67. The apparatus according to claim 1, characterized in that the signal output detector further comprises a line or plane of detectors and a drive mechanism that moves the detectors to sample an external secondary radiation over a three-dimensional volume.

68. The apparatus according to claim 67, characterized in that the secondary radiation is a radio frequency magnetic field due to nuclear magnetic resonance of nuclei in a magnetic field produced by the magnetization source and excited by a radiation field from the source of radiation.

69. The apparatus according to claim 68, characterized in that the nuclear magnetic resonance active nuclei are protons.

70. The apparatus according to claim 19, characterized in that each antenna of the three dimensional array of antennas are impedance matched.

71. The apparatus according to claim 70, characterized in that each antenna of the three dimensional array of antennas further comprises superconducting reactance elements which minimize resistive losses.

72. The apparatus according to claim 19, characterized in that cross talk between antennas is ameliorated or eliminated by time multiplexing the signal detection over the array of antennas.

73. The apparatus according to claim 19, characterized in that the signal output detector comprises a synchronous detector wherein the radio frequency field is sampled synchronously so that a phase at any given detector may be related to that at any other detector.

74. The apparatus according to claim 19, characterized in that the signal output detector comprises a synchronous detector wherein the radio frequency field is sampled at known times so that a phase at any given detector may be related to that at any other detector.

75. The apparatus according to claim 19, characterized in that each antenna of the three dimensional array of antennas responds selectively to a component of the secondary radio frequency field at a spatial location outside of the body as a function of time.

76. The apparatus according to claim 19, characterized in that each antenna of the three dimensional array of antennas responds selectively to a parallel component of the secondary radio frequency field at a spatial location outside of an object as a function of time.

77. The apparatus according to claim 19, characterized in that each antenna of the three dimensional array of antennas responds selectively to a perpendicular component of the secondary radio frequency field at a spatial location outside of an object as a function of time.

78. Apparatus for providing a multidimensional image of inanimate or animate objects comprising:
  means for producing a magnetic field to magnetize a volume of an object to be imaged, the volume comprising a plurality of voxels;
  means for applying a radiation field to the object to be imaged when the object is disposed in the magnetic field to produce a secondary radiation field emanating from the object;
  means for producing output signals in response to said secondary radiation at a plurality of spatial locations outside of the object as a function of time;
  first processor means for determining a plurality of Fourier components, each having the same frequency, an intensity and a phase angle;
  second processor means for associating the Fourier components due to each voxel of the object to be imaged by phase to form a set corresponding to a spatial variation of intensity of the secondary radiation due to each voxel at said plurality of spatial locations outside of the object;
  third processor means for converting each said set of components into a voxel location; and
  image processor means for producing an image based on the secondary radiation intensity from each voxel and the location of each voxel.

79. An apparatus for providing a two dimensional or three-dimensional nuclear magnetic resonance image of an object comprising:
  means for generating an image from a three-dimensional map of a transverse resonant radio frequency magnetic flux external to an object having a volume to be imaged, the volume comprising a plurality of voxels; and
  processor means for determining the location of each voxel which is a source of the radio frequency field through spatial variations of an intensity of the nuclear magnetic resonance field of a set of components associated by phase.

80. An apparatus for providing a two dimensional or three-dimensional nuclear magnetic resonance image of an object comprising:
  a magnetizing source for magnetizing a volume an object in a first direction, the volume comprising a plurality of voxels;

means for causing nuclear magnetic resonance magnetization to rotate into a plane transverse to the first direction;

an output signal detector for detecting the nuclear magnetic resonance field rotated into a transverse plane external to the object at a plurality of spatial locations;

a first processor for determining a set of components of spatial variation of the nuclear magnetic resonance field over a sample volume by association of the components by phase;

a second processor for determining a location of each voxel which is a source of the radio frequency field through each set of components representative of spatial variations of an intensity of the nuclear magnetic resonance field over the sample volume, and an image processor for displaying the voxel locations representative of anatomical images of the object based on selected physiological.

81. An apparatus for providing a two dimensional or three-dimensional nuclear magnetic resonance image of an object comprising:

means for magnetizing a volume an object in a first direction, the volume comprising a plurality of voxels;

means for causing nuclear magnetic resonance magnetization to rotate into a plane transverse to the first direction;

means for detecting the nuclear magnetic resonance field rotated into a transverse plane external to the object over a sample volume comprising a plurality of spatial locations;

processor means for determining a set of components of spatial variation of the nuclear magnetic resonance field over a sample volume by association of the components by phase;

processor means for determining a location of each voxel which is a source of the radio frequency field through each set of components representative of spatial variations of an intensity of the nuclear magnetic resonance field over the sample volume, and processor means for displaying the voxel locations representative of anatomical images of the object based on selected physiological parameters.

82. An apparatus for providing a two dimensional or three-dimensional nuclear magnetic resonance image of an object comprising:

means for generating an image from a three-dimensional map of a transverse resonant radio frequency magnetic flux external to an object comprising a volume to be imaged, the volume comprising a plurality of voxels; and processor means for determining locations of voxels which is a source of a radio frequency field through spatial variations of an intensity of a nuclear magnetic resonance field of a set of components associated by phase.

83. A method for providing a multidimensional image of inanimate and animate objects comprising the steps of:

placing an object having a volume in a magnetic field, the volume comprising a plurality of voxels;

applying a first source of radiation to the object;

recording a secondary source of radiation emanating from the object at a plurality of spatial locations;

forming components of the spatial variation of the secondary source of radiation external to the object due to voxels of the object;

determining the location of voxels from the intensity variation of the components;

generating and displaying the image from the locations and the intensity of the secondary radiation of each voxel.

84. The method according to claim 83, characterized in that the secondary recorded radiation is a three-dimensional transverse resonant radio frequency magnetic flux external to the object recorded as a function of time.

85. The method according to claim 84, characterized in that the three-dimensional transverse resonant radio frequency magnetic flux external to the object is nuclear magnetic resonance radiation.

86. The method according to claim 81, further comprising recording the secondary source of radiation emanating from the object at a plurality of spatial locations using a plurality of detectors at each spatial location.

87. The method according to claim 83, characterized in that the recorded signals from each voxel contains components each having a unique phase angle relative to other components from different voxels.

88. The method according to claim 83, characterized in that a time dependent signal at each detector may be transformed into a series of components having intensity and phase data.

89. The method according to claim 83, characterized in that said image is displayed on at least one display selected from the group consisting of printers, cathode ray tube displays, liquid crystal displays, plasma screens, three dimensional modelers, laser monitors, projections monitors and holographic displays.

90. The method according to claim 83, characterized in that an intensity variation of a transverse radio frequency field over the sample volume is used to determine the coordinate location of each voxel.

91. The method according to claim 83, characterized in that the radio frequency field is a near field which is a dipole that serves as a basis element to form a unique reconstruction.

92. The method according to claim 83, characterized in that each volume element is reconstructed independently in parallel with all other volume elements such that a scan time is no greater than a nuclear free induction decay time.

93. The method according to claim 83, characterized in that said object is at least one selected from the group consisting of a human body, an animal and tissue.

94. A method for providing a multidimensional image of inanimate and animate objects comprising the steps of:

magnetizing a volume of an object to be imaged, the volume comprising a plurality of voxels;

applying a radiation field to the object to be imaged when disposed in the magnetic field to produce a secondary radiation field emanating from the object;

producing output signals from a detector in response to said secondary radiation at a plurality of spatial locations outside of the object as a function of time;

determining a plurality of Fourier components each having the same frequency, an intensity and a phase angle;

associating the Fourier components due to each voxel of the object to be imaged by phase to form a set corresponding to the spatial variation of intensity of the secondary radiation due to each voxel at the plurality of spatial locations outside of the object;

converting each set of components into a voxel location; and producing an image based on an intensity of the secondary radiation from each voxel, the location of each voxel, and plotting the superposition of results for each voxel.

95. A method for providing a two dimensional or three-dimensional nuclear magnetic resonance image of an object comprising the steps of:
generating an image from a three-dimensional map of a transverse resonant radio frequency magnetic flux external to a volume of an object being scanned, the volume comprising a plurality of voxels, characterized in that a nuclear magnetic resonance signal of each voxel at any given detector gives rise to a Fourier component with a unique phase angle relative to the Fourier component of any other voxel of the object at a detector;
a set of Fourier components that correspond to a nuclear magnetic resonance signal of a given voxel over detectors is determined;
an intensity variation of the transverse radio frequency field over space is used to determine a coordinate location of each voxel; and
a superposition of results for each voxel is plotted to provide a total image.

96. A method of providing a multidimensional image of inanimate and animate objects comprising the steps of:
aligning magnetic moments of nuclei of a volume of an object to be imaged using a primary field, the volume comprising a plurality of voxels;
further aligning the magnetic moments by a radio frequency pulse or series of pulses;
recording free induction decay signals;
Fourier transforming time dependent nuclear magnetic resonance signals to give intensity and phase of each Fourier component, characterized in that nuclear magnetic resonance signal of each voxel at any given detector gives rise to a Fourier component with a unique phase angle relative to the Fourier component of any other voxel at that detector;
determining a matrix of Fourier components that correspond to the nuclear magnetic resonance signal of a given voxel over the detectors;
determining matrices for a plurality of voxels;
determining a coordinate location of each voxel from measurements of spatial variations of a transverse radio frequency field of each corresponding matrix; and
processing and displaying the position of each voxel with a representation of the intensity of the nuclear magnetic resonance signal emitted by each voxel.

97. A method according to claim 83, characterized in that a strength and duration of rotating $H_1$ radio frequency field that is resonant with the protons of the magnetized volume and is oriented perpendicularly to a direction of the magnetizing field is applied such that final precession angle of magnetization is 90°, $\phi_{H_1}$=90°, such that a radio frequency dipole is transverse to a primary magnetizing field and perpendicular to a radio frequency magnetic field detector.

98. The method according to claim 83, characterized in that nuclear magnetic resonance pulse sequences which provide signals for a $T_1$ or $T_2$ image are applied.

99. The method according to claim 98, characterized in that the nuclear magnetic resonance pulse sequences which provide the signals for a $T_1$ or $T_2$ image comprises applying a 90° pulse followed by a series of 180° pulses.

100. The method according to claim 99, characterized in that the step of applying a 90° pulse followed by a series of 180° pulses comprises the Carr-Purcell-Meiboom-Gill sequence.

101. The method according to claim 96, characterized in that the step of determining the matrix of Fourier components that correspond to the nuclear magnetic resonance signal of a given voxel over the detectors is achieved by using a first component having a phase angle and calculating the phase angle as a function of spatial position of a first detector relative to any other detector and identifying a component at each detector having the calculated phase angle.

102. The method according to claim 96, characterized in that each matrix of components associated by phase comprises the intensity variation over the sample volume of the radio frequency field of bulk magnetization M of each voxel.

103. The method according to claim 96, further comprising reconstructing a multidimensional image representation according to spatial variations of the detected radio frequency magnetic field using at least one of a matrix inversion algorithm, a reiterative algorithm or Fourier transform algorithm.

104. The method according to claim 103, characterized in that a spatial Fourier transform algorithm is used.

105. The method according to claim 104, characterized in that the spatial Fourier transform algorithm is performed on each set of components over the detector array to map each bulk magnetization M corresponding to a voxel to a spatial location of the imaged object.

106. The method according to claim 104, characterized in that the spatial Fourier transform comprises the steps of:
recording a nuclear magnetic resonance signal and ratio frequency at discrete points in the sampling space at position x, y, z;
designating each point, x, y, z, radio frequency, and each radio frequency value as an element in matrix A;
Fourier transforming time dependent signals to give an intensity and phase of each component wherein the nuclear magnetic resonance signal of each voxel at any given detector gives rise to a Fourier component with a unique phase angle relative to the Fourier component of any other voxel of the object at that detector;
determining a matrix of Fourier components that correspond to the nuclear magnetic resonance signal of a given voxel over the detectors;
determining matrices $A_n$ for all of the voxels;
determining a coordinate location of each voxel using the measurements of the spatial variations of the transverse radio frequency field of a given matrix; and
plotting a superposition of results for each voxel to provide a total image.

107. The method according to claim 106, characterized in that the step of determining the coordinate location of each voxel using the measurements of the spatial variations of the transverse radio frequency field of a given matrix comprises the steps of
a.) discrete Fourier transforming each matrix $A_n$ to obtain a matrix $B_n$;
b.) multiplying each element of each matrix $B_n$ by a corresponding inverse value or reciprocal value of the Fourier transform of a system function which gives the spatial variation of the radio frequency field emitted by each voxel as a function of distance from the voxel to each detector, evaluated at the same frequency as the element of the matrix $A_n$ to form matrix $C_n$;
c.) generating matrix $D_n$ by taking the discrete inverse Fourier transform of matrix $C_n$;
d.) multiplying each element of each matrix $D_n$ by the distance squared along the z-axis to which the element corresponds to generate the position of the bulk magnetization M of voxel n which corrects the limitation of the sample volume to $z \geq 0$;

e.) repeating steps a-d for all matrices $A_z$; and f.) plotting superposition of results for each voxel to provide a total image.

108. The method according to claim 106, characterized in that at each sampled external spatial location, x, y, and z in Cartesian coordinates, a magnitude B' of the transverse radio frequency magnetic flux emitted by the corresponding z-axis aligned magnetic moment $m_1$ of each voxel is given by $$B' = m_z \frac{2z^2 - x^2 - y^2}{(x^2 + y^2 + z^2)^{5/2}}$$

where the magnetic moment corresponds to the voxel's bulk magnetization M.

109. The method according to claim 106, further comprising the step of determining a matrix of Fourier components that correspond to the nuclear magnetic resonance signal of a given voxel over the detectors by using a first component having a phase angle and calculating the phase angle as a function of spatial position of a first detector relative to any other detector and identifying a component at each detector having the calculated phase angle.

110. The method according to claim 109, characterized in that each matrix of components associated by phase comprises the intensity variation over the sample volume of the radio frequency field of the bulk magnetization M of each voxel.

111. The method according to claim 106, characterized in that a system function as a function of the detector location relative to each voxel in Cartesian coordinates, x, y, z, is by $$B' = m_z \frac{2z^2 - x^2 - y^2}{(x^2 + y^2 + z^2)^{5/2}}.$$

112. The method according to claim 106, further comprising the step of correcting a point spread of each reconstructed voxel by assigning one voxel above a certain threshold with the bulk magnetization M and the other voxels are assigned a zero value.

113. The method according to claim 106, further comprising the step of correcting a finite size of each detector by multiplying each numeric value of matrix $B_z$ by the corresponding matrix element of the inverse or reciprocal of the Fourier transform of a waveform representative of a detector geometry.

114. The method according to claim 106, characterized in that each matrix element of the inverse or reciprocal of the Fourier transform of a waveform representative of the detector geometry is given by:

$$\frac{1}{\text{sinc}(k_x, k_y, k_z)}.$$

115. The method according to claim 106, characterized in that each volume element is reconstructed independently in parallel with all other volume elements such that a scan time is no greater than a nuclear free induction decay time.

116. The method according to claim 106, wherein the system function is given by:

$$H[k_x, k_y, k_z] = \frac{4\pi[k_x^2 + k_y^2]}{k_x^2, k_y^2, k_z^2}.$$

117. The method according to claim 106, characterized in that each matrix element for the step of multiplying each element of each matrix $D_z$ by the distance squared along the z-axis to which the element corresponds to generate the position of the bulk magnetization M of voxel n which corrects the limitation of the sample volume to $z \geq 0$ is given by:

$$1 \bigg/ \frac{\pi}{2y_n^2}.$$

118. The method according to claim 103, characterized in that the step of reconstructing the multidimensional image uses a matrix inversion reconstruction algorithm.

119. The method according to claim 118, characterized in that the matrix inversion reconstruction algorithm comprises the steps of:

using the geometric system function to determine the spatial intensity variation of the transverse radio frequency field over a detector array to form a corresponding matrix;

inverting the corresponding matrix; and multiplying the signal over the detector array by the inverted matrix to give voxel sources.

120. The method according to claim 119, further comprising the steps of a.) determining a coefficient for each voxel mathematically or by calibration which when multiplied by the bulk magnetization M of each voxel is that voxel's contribution to the signal at a given detector with the corresponding unique phase at each detector;

b.) repeating step a for every detector;

c.) using the coefficients to determine a matrix which when multiplied by a column vector of the bulk magnetization M values of the voxels, gives the signals at the detectors;

d.) inverting the matrix and storing the result in memory;

e.) recording signals as a function of time over the detector array;

f.) Fourier transforming the signals as a function of time to give the Fourier components each having an amplitude and a unique phase; and g.) multiplying the components by the inverse matrix to generate a bulk magnetization M map which is displayed.

121. The method according to claim 120, characterized in that the coefficient for each voxel determined mathematically is given by $$V[x, y, z] = C_o \sum_{n_3=0}^{+l_3/k} \sum_{n_2=-l_2/2k}^{+l_2/k} \sum_{n_1=-l_1/2k}^{+l_1/2k} \frac{[2[z+n_3k_3]^2 - [y-n_2k_2]^2 - [x-n_1k_1]^2]}{[[x-n_1k_1]^2 + [y-n_2k_2]^2 + [z+n_3k_3]^2]^{5/2}}$$

where V[x,y,z] is a detector signal at Cartesian coordinate x, y, z, $C_p$ is a constant characteristic of each detector, $l_1$, $l_2$, and $l_3$ are the total lengths of the detector array in the x, y, and z directions, $k_1$, $k_2$, and $k_3$ are spacing of elements of the detector array in the x, y, and z directions, and $n_1$, $n_2$, and $n_3$ are integer indices of the elements of the detector array in the x, y, and z directions.

122. The method according to claim 118, further comprising the steps of
  determining a matrix of Fourier components that correspond to the nuclear magnetic resonance signal of a given voxel over the detectors;
  determining corresponding matrices for a plurality of voxels;
  determining a coordinate location of each voxel from measurements of spatial variations of the transverse radio frequency field of a given matrix wherein each matrix of components associated by phase comprises the intensity variation over the sample volume of the radio frequency field of the bulk magnetization M of each voxel; and
  multiplying each matrix of components by the inverse matrix of system function to generate the bulk magnetization M map.

123. The method according to claim 122, further comprising the steps of
  a.) correcting a point spread of a reconstructed voxel by assigning one voxel above a certain threshold with the bulk magnetization M;
  b.) assigning other voxels with a zero value;
  c.) repeating steps a-b for other voxels; and
  d.) plotting and displaying the superposition of the separate maps for each voxel which comprises the total bulk magnetization map as a nuclear magnetic resonance image.

124. The method according to claim 103, characterized in that said multidimensional image is reconstructed using a reiterative reconstruction algorithm.

125. The method according to claim 124, characterized in that the reiterative reconstruction algorithm comprises the steps of
  a.) using the geometric system function to determine a system of linear equations which gives the intensity, spatial variation, and phase of radio frequency field over a sample volume wherein the system of linear equations gives the signal and phase from each voxel at each detector based on the bulk magnetization M value of each voxel and the position of the voxel relative to the detector;
  b.) Fourier transforming the signal as a function of time to give Fourier components each having an amplitude and a unique phase;
  c.) determining weighting coefficients based on the linear equations;
  d.) determining coefficients for each voxel mathematically or by calibration;
  e.) estimating bulk magnetization M for each voxel;
  f.) calculating signals at each phase at each detector;
  g.) comparing a result of multiplying the bulk magnetization M value of each voxel times its weighting coefficient and its calculated phase at a given detector to a measured signal and phase;
  h.) making a correction to M of each voxel to give a second, or recomputed, estimate for M of each voxel;
  i.) computing the signal value from this second estimate and making corrections according to steps f-h;
  j.) repeating steps f-i until the correction for each reiteration approaches a predefined limit which serves to indicate that the reconstruction is within reasonable limits of error;
  k.) repeating steps c-j of the procedure for other detectors; and
  l.) plotting and displaying a bulk magnetization map.

126. The method according to claim 125, wherein the coefficient for each voxel determined mathematically is given by $$V[x, y, z] = C_o \sum_{n_3=0}^{+l_3/k} \sum_{n_2=-l_2/2k}^{+l_2/2k} \sum_{n_1=-l_1/2k}^{+l_1/2k} \frac{[2[z+n_3k_3]^2 - [y-n_2k_2]^2 - [x-n_1k_1]^2]}{[[x-n_1k_1]^2 + [y-n_2k_2]^2 + [z+n_3k_3]^2]^{5/2}}$$

where V[x,y,z] is the detector signal at Cartesian coordinate x, y, z, $C_p$ is a constant characteristic of each detector, $l_1$, $l_2$, and $_3$ are the total lengths of the detector array in the x, y, and z directions, $k_1$, $k_2$, and $k_3$ are the spacing of the elements of the detector array in the x, y, and z directions, and $n_1$, $n_2$, and $n_3$ are the integer indices of the elements of the detector array in the x, y, and z directions.

127. A method of providing a multidimensional image of inanimate and animate objects comprising the steps of:
  a.) recording secondary radiation signals corresponding to a transverse radio frequency magnetic field in response to a first radiation applied to a magnetized object over a sample volume comprising a plurality of voxels;
  b.) forming a matrix of signals at a plurality of spatial positions each corresponding to a detector element of a detector array;
  c.) transforming the matrix numeric values according to a Fourier transform to give an intensity and phase of each component wherein a nuclear magnetic resonance signal of each voxel at any given detector gives rise to a Fourier component with a unique phase angle relative to the Fourier component of any other voxel of the object at that detector;
  d.) determining a matrix of Fourier components that correspond to the nuclear magnetic resonance signal of a given voxel over the detectors;
  e.) multiplying each numeric value of the transform array by a value which is an inverse or reciprocal of the Fourier transform of a waveform corresponding to an operation performed in step b;
  f.) multiplying each numeric value of the discrete spectrum matrix by a value corresponding to an inverse Fourier transform of a function representative of the steps of exciting and detecting and providing a system corrected matrix;
  g.) inverse-transforming the system corrected matrix according to a multidimensional discrete inverse Fourier transform providing a voxel location;
  h.) correcting each element in the transformed matrix for any asymmetries in the dimensions of the sample volume;
  i.) repeating steps c-h for other matrices, each corresponding to a distinct voxel; and
  j.) superimposing the results from steps a-h, plotting and displaying the image.

128. The method according to claim 127, characterized in that at each sampled external spatial location, x, y, and z in Cartesian coordinates, the magnitude B' of the transverse radio frequency magnetic flux emitted by the corresponding z-axis aligned magnetic moment $m_1$ of each voxel is given by $$B' = m_z \frac{2z^2 - x^2 - y^2}{(x^2 + y^2 + z^2)^{5/2}}$$

where the magnetic moment corresponds to the voxel's bulk magnetization M.

129. The method according to claim 127, characterized in that the step of determining the matrix of Fourier components that correspond to the nuclear magnetic resonance signal of a given voxel over the detectors is achieved by using a first component having a phase angle and calculating the phase angle as a function of spatial position of a first detector relative to any other detector and identifying the component at each detector having the calculated phase angle.

130. The method according to claim 129, characterized in that each matrix of components associated by phase comprises an intensity variation over the sample volume of the radio frequency field of the bulk magnetization M of each voxel.

131. The method according to claim 127, characterized in that a system function as a function of the detector location relative to each voxel in Cartesian coordinates, x, y, z, is given by $$B' = m_z \frac{2z^2 - x^2 - y^2}{(x^2 + y^2 + z^2)^{5/2}}.$$

132. The method according to claim 127, further comprising the step of correcting a point spread of each reconstructed voxel by assigning a voxel above a certain threshold with the bulk magnetization M and other voxels are assigned a zero value.

133. The method according to claim 127, further comprising step e of correcting a finite size of each detector by multiplying each numeric value of the matrix formed in step d by the corresponding matrix element of the inverse of the Fourier transform of a waveform representative of a detector geometry.

134. The method according to claim 133, characterized in that each matrix element of an inverse of the Fourier transform of a waveform representative of the detector geometry is given by formula $$\frac{1}{\text{sinc}(k_x, k_y, k_z)}.$$

135. The method according to claim 127, characterized in that each volume element is reconstructed independently in parallel with all other volume elements such that a scan time is no greater than a nuclear free induction decay time.

136. The method according to claim 127, characterized in that the step f of multiplying each numeric value of the discrete spectrum matrix by a value corresponding to the reciprocal of the Fourier transform of a function representative of the steps of exciting and detecting and providing a system corrected matrix wherein the discrete values of the system function matrix are given by:

$$H[k_x, k_y, k_z] = \frac{4\pi[k_x^2 + k_y^2]}{k_x^2 + k_y^2 + k_z^2}.$$

137. The method according to claim 127, characterized in that the step h of correcting each element in the transformed matrix for any asymmetries in dimensions of the sample volume wherein the discrete values of are given by:

$$1 \bigg/ \sqrt{\frac{\pi}{2y_n^2}}.$$

138. The method according to claim 103, further comprising the steps of using the matrix inversion algorithm or the reiterative algorithm in combination with the Fourier Transform Algorithm.

139. The method according to claim 103, further comprising the steps of using the matrix inversion algorithm and the reiterative algorithm in combination with the Fourier Transform Algorithm.

140. The method according to claim 103, further comprising using the Fourier Transform Algorithm as input for the first reiteration of a reiterative algorithm.

141. The method according to claim 140, further comprising the steps of:
using the Fourier Transform Algorithm to calculate a series of first bulk magnetization images for each matrix of components associated by phase;
detecting at least one peaks or edge of each image by using a cut-off level for the bulk magnetization assigned to a voxel or the value of the derivative of the bulk magnetization as a function of voxel position, respectively;
setting the bulk magnetization of the voxel or voxels corresponding to the peak or edge equal to the peak bulk magnetization and assigning the remaining voxels a zero value;
calculating a signal at each detector using a system function;
comparing each calculated signal to the actual signal and determining a difference or error;
projecting the error over the voxels using the Fourier Transform Algorithm, Matrix Inversion Algorithm, or Reiterative Algorithm;
adding back projected errors to a preceding corrected series of bulk magnetization maps; and
performing the steps reiteratively until it stabilizes.

142. The method according to claim 96, characterized in that a $T_1$ image is produced by a applying at least one pulse sequence that inverts the magnetization and records the relaxation.

143. The method according to claim 142, further comprising producing a $T_1$ image by the steps of:
switching on radio frequency receivers to follow a decay following a nuclear excitation comprising a $H_1$ pulse;
examining $M_z(t)$, a time dependent bulk magnetization in the direction of a primary field $H_0$, at a time $t_0$ after an inverting pulse by applying another $H_1$ pulse equivalent to a rotation by 90° after waiting the time $t_0$ following the initial inversion, characterized in that the 90° pulse puts the z magnetization $M_z(t_0)$ into the transverse plane for observation, and changing the waiting time $t_0$ to allow for observation of $M_z(t)$ at different times during relaxation.

144. The method according to claim 96, characterized in that a $T_2$ image is produced by a applying at least one pulse sequence that flips a magnetization vector into a transverse plane and records a transverse relaxation by producing at least one spin-echo.

145. The method according to claim 144, further comprising producing a $T_1$ image by the steps of
flipping the magnetization initially aligned along the $z_R$-axis into the transverse plane by applying a $H_1$ pulse;
recovering the $T_2$ relaxation from a $T^*_2$ FID by applying a 180° $H_1$ pulse at time $t_0$ along the $y_R$-axis where the $T^*_2$ relaxation occurs in time $t_0$;
recording the $T_1$ relaxation after an additional time $t_0$, characterized in that the total time elapsed after the 90° $H_1$ pulse is $2t_0=t_E$ which is the spin-echo time and the dephasing due to the static inhomogeneity of $H_0$ is canceled out, whereby the relaxation is due to processes that create $T_2$ relaxation;
applying a plurality of 180° pulses to form a plurality of spin echoes; and
determining the $T_2$ relaxation from the envelop of the maximum amplitude of the spin echoes.

146. The method according to claim 145, further comprising a pulse sequence to give the data for a $T_2$ image known as the Carr-Purcell-Meiboom-Gill sequence comprises applying a 90° pulse along the $x_R$-axis followed by a series of 180° pulses along the $y_R$-axis at times $t_0+2nt_0$ where n is an integer including zero.

147. A method of providing a multidimensional nuclear magnetic resonance image of an animate or inanimate object comprising the steps of:
placing a volume of an object having nuclei in a static magnetic field $H_0$, the volume comprising a plurality of voxels, and then subjected them to an additional rotating radio frequency field $H_1$, which is synchronous with their precession, such that the bulk magnetization M of each voxel of the object precesses about $H_1$ and rotates away from the primary field $H_0$ by an angle $\phi_{H_1}$;
measuring of the intensity of the radio frequency signal over time and space following $T_1$ and/or $T_2$ encoding pulses wherein the magnitude of M is a maximum initially and decays with time by emission of the same multipolarity radiation that it absorbed and by transfer of energy to the surrounding lattice and the intensity of the radiation is a function of M and the coordinate position relative to the radio frequency emitting voxel;
Fourier transforming the signal as a function of time at a given detector position to give the components each having an amplitude and a unique phase;
determining each set of components of the nuclear magnetic resonance signal over the sample volume due to a given voxel from the phase data and the detector positions;
determining the location of each voxel through the spatial variations of the intensity of the transverse nuclear magnetic resonance field of the set of components associated by phase; and
superimposing the results of the determination of the location of M of each voxel and the plotting and displaying the resulting image.

148. The method according to claim 96, characterized in that the plurality of Fourier components each having the same frequency, an intensity and a phase angle each have a unique phase.

149. The method according to claim 148, characterized in that the unique phase of each component is provided by a combination of
the angle θ suspended between each spatial location at which the secondary field is detected and a radial vector from each voxel to each spatial location; and
the angle φ due to a separation distance r between each voxel and each spatial location given by a wavenumber of a detected field k times r.

150. The method according to claim 87, characterized in that the radio frequency field is sampled synchronously so that the phase at any given detector may be related to that at any other detector.

151. The method according to claim 87, characterized in that the radio frequency field is sampled at known times so that the phase at any given detector may be related to that at any other detector.

152. The method according to claim 96, characterized in that the processor which determines a plurality of Fourier components each having the same frequency, an intensity and a phase angle uses a first component having a phase angle and calculates the phase angle as a function of spatial position of the first spatial position relative to any other spatial location and identifies the component at each spatial location having the calculated phase angle.

153. The method according to claim 152, characterized in that the voxels that are on the same axis with a given detector or a plurality of detectors that align vertically with one or more voxels is determined.

154. The method according to claim 153, characterized in that the phase angle is a function of the distance r of the detector from the voxel.

155. The method according to claim 154, characterized in that the components may be identified by the presence of at least one component of a phase given by $\phi+k\Delta r$ where $\phi_1$ is the phase angle of the first component, $\Delta r$ is the distance of the second detector relative to the first of the detector, and k is the wavenumber of the nuclear magnetic resonance radiation emanating from the object wherein this detector(s) is defined as having a zero angle θ.

156. The method according to claim 155, characterized in that a phase angle $\phi_2$ of a second component at a second detector aligned on the detection axis corresponding to a first component at a first detector having a phase angle $\phi_1$ is given by $$\phi_2=\phi_1+k\Delta r$$

where $\Delta r$ is the distance of the second detector relative to the first of the detector and k is the wavenumber of the nuclear magnetic resonance radiation emanating from the object.

157. The method according to claim 156, characterized in that, from the components identified as coaxial with a detector, the phases of the components from the voxel are determined at the other detectors using the relative position of other detectors of the sample volume relative to the first detector and $\phi_1$ of the component at the first detector.

158. The method according to claim 157, characterized in that the phase φ due to a separation distance between a voxel and a detector of r is given by the wavenumber of the radio frequency field k times r, $$\phi=kr$$

where the wavenumber k is given by $$k = \frac{2\pi}{\lambda}$$

the phase angel φ is given by $$\phi = \frac{2\pi}{\lambda}\sqrt{(\Delta x)^2 + (\Delta y)^2 + (\Delta z)^2}$$

where $\Delta x$, $\Delta y$, and $\Delta z$ is the separation distance between a voxel and a detector in the x, y, and z directions, respectively, and in the case that a two dimensional slice is imaged in the transverse plane, the phase angel φ is given by $$\phi = kr = \frac{2\pi}{\lambda}\sqrt{(\Delta x)^2 + (\Delta y)^2}.$$

159. The method according to claim 158, characterized in that all voxels which have the same radial distance from a given detector will have the same phase φ.

160. The method according to claim 159, characterized in that at each case that two detectors have the same phase φ, since the radial distances r of two voxels to a given detector are equivalent, a unique angle θ suspended between the direction of the detector and the vector along r exists.

161. The method according to claim 160, characterized in that the radio frequency dipoles of all voxels are time synchronous.

162. The method according to claim 96, characterized in that the nuclear magnetic resonance pulsing and detection may be synchronized.

163. The method according to claim 96, characterized in that at least one standard dipole may be used as reference phase to set the phases of the radio frequency dipoles of the voxels.

164. The method according to claim 163, characterized in that all voxels that are not collinear with the axis of a detector posses an angle θ suspended between the direction of the detector and the radial vector from the dipole to the detector.

165. The method according to claim 164, characterized in that since the radio frequency dipoles are time synchronous, at each point in time, the angle corresponds to a phase angle θ of the radio frequency signal from each voxel at each detector.

166. The method according to claim 165, characterized in that in the case that a two dimensional slice is imaged in the transverse plane, the phase angle θ is given by $$\theta = \sin^{-1}\frac{\Delta x}{r} = \sin^{-1}\frac{\Delta x}{\sqrt{(\Delta x)^2 + (\Delta y)^2}} = \sin^{-1}\frac{k\Delta x}{\sqrt{(k\Delta x)^2 + (k\Delta y)^2}}.$$

167. The method according to claim 166, characterized in that the total unique phase angle $\phi_T$ of the radio frequency signal from each voxel at each detector is given as the sum of φ and θ given by $\phi_T = \phi + \theta$.

* * * * *